US 9,940,981 B2

(12) United States Patent
Tiwari

(10) Patent No.: US 9,940,981 B2
(45) Date of Patent: *Apr. 10, 2018

(54) DIVISION OPERATIONS IN MEMORY

(71) Applicant: Micron Technology, Inc., Boise, ID (US)

(72) Inventor: Sanjay Tiwari, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 15/688,348

(22) Filed: Aug. 28, 2017

(65) Prior Publication Data
US 2017/0358333 A1 Dec. 14, 2017

Related U.S. Application Data

(63) Continuation of application No. 14/836,673, filed on Aug. 26, 2015, now Pat. No. 9,747,961.

(Continued)

(51) Int. Cl.
*G11C 7/10* (2006.01)
*G06F 12/02* (2006.01)
(Continued)

(52) U.S. Cl.
CPC .............. *G11C 7/10* (2013.01); *G06F 9/3001* (2013.01); *G06F 12/02* (2013.01); *G06F 12/0207* (2013.01); *G11C 7/1006* (2013.01)

(58) Field of Classification Search
CPC ........... G11C 7/06; G11C 7/062; G11C 7/065; G11C 7/1006; G06F 13/4072;
(Continued)

(56) References Cited

U.S. PATENT DOCUMENTS 4,380,046 A  4/1983  Fung
4,435,792 A  3/1984  Bechtolsheim
(Continued)

FOREIGN PATENT DOCUMENTS

CN  102141905   8/2011
EP  0214718    3/1987
EP  2026209    2/2009
JP  H0831168   2/1996
(Continued)

OTHER PUBLICATIONS

Warren Jr., Henry S., "Hacker's Delight", Second Edition, Oct. 2013, pp. 181-184 and 194.
(Continued)

*Primary Examiner* — Hal Schnee
(74) *Attorney, Agent, or Firm* — Brooks, Cameron & Huebsch, PLLC

(57) ABSTRACT

Examples of the present disclosure provide apparatuses and methods related to performing division operations in memory. An example apparatus might include a first group of memory cells coupled to a first access line and configured to store a dividend element. An example apparatus might include a second group of memory cells coupled to a second access line and configured to store a divisor element. An example apparatus might also include a controller configured to cause the dividend element to be divided by the divisor element by controlling sensing circuitry to perform a number of operations without transferring data via an input/output (I/O) line.

20 Claims, 18 Drawing Sheets

Related U.S. Application Data

(60) Provisional application No. 62/045,175, filed on Sep. 3, 2014.

(51) Int. Cl.
*G06F 9/302* (2006.01)
*G06F 9/30* (2018.01)

(58) Field of Classification Search
CPC .... G06F 9/3001; G06F 9/30018; G06F 12/02; G06F 12/0207
See application file for complete search history.

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,430,687 A | 7/1995 | Hung et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,953,738 A | 9/1999 | Rao |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,173,305 B1 | 1/2001 | Poland |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,058,880 B1 | 6/2006 | Ding et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,532,529 B2 | 5/2009 | Dadashev et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |

(56) References Cited

U.S. PATENT DOCUMENTS

| | | |
|---|---|---|
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,683,183 B2 | 3/2014 | Sprangle |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,235,414 B2 | 1/2016 | Gopal et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0196030 A1 | 10/2003 | Elliott et al. |
| 2003/0222879 A1 | 12/2003 | Rong et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0142419 A1 | 6/2011 | Zou et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0117317 A1 | 5/2012 | Sheffler et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0247673 A1 | 9/2014 | Muralimanohar et al. |
| 2014/0250279 A1 | 9/2014 | Manning |
| 2014/0281371 A1 | 9/2014 | Thantry et al. |
| 2014/0344934 A1 | 11/2014 | Jorgensen |
| 2015/0089166 A1 | 3/2015 | Kogge |
| 2015/0134713 A1 | 5/2015 | Wheeler |
| 2015/0324290 A1 | 11/2015 | Leidel |
| 2015/0325272 A1 | 11/2015 | Murphy |

FOREIGN PATENT DOCUMENTS

| | | |
|---|---|---|
| JP | 2009259193 | 3/2015 |
| KR | 10-0211482 | 8/1998 |
| KR | 100821616 | 4/2008 |
| KR | 10-2010-0134235 | 12/2010 |
| KR | 10-2013-0049421 | 5/2013 |
| TW | 485601 | 5/2002 |
| TW | 200532708 | 10/2005 |
| TW | 201218070 | 5/2012 |
| TW | 201346724 | 11/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.

(56) References Cited

OTHER PUBLICATIONS

Stojmenovic, "Multiplicative Circulant Networks Topological Properties and Communication Algorithms", (25 pgs.), Discrete Applied Mathematics 77 (1997) 281-305.

"4.9.3 Minloc and Maxloc", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

Office Action for related Taiwan Patent Application No. 104129202, dated May 4, 2017, 12 pages.

Morad et al., "GP-SIMD Processing-in-Memory", ACM Transactions on Architecture and Code Optimization, vol. 11, No. 4, Article 53, Jan. 2015.

Efnusheva et al., "A Novel Memory-centric Architecture and Organization of Processors and Computers", Proceedings of the 3rd International Conference on Applied Innovations in IT (ICAIIT), Mar. 2015.

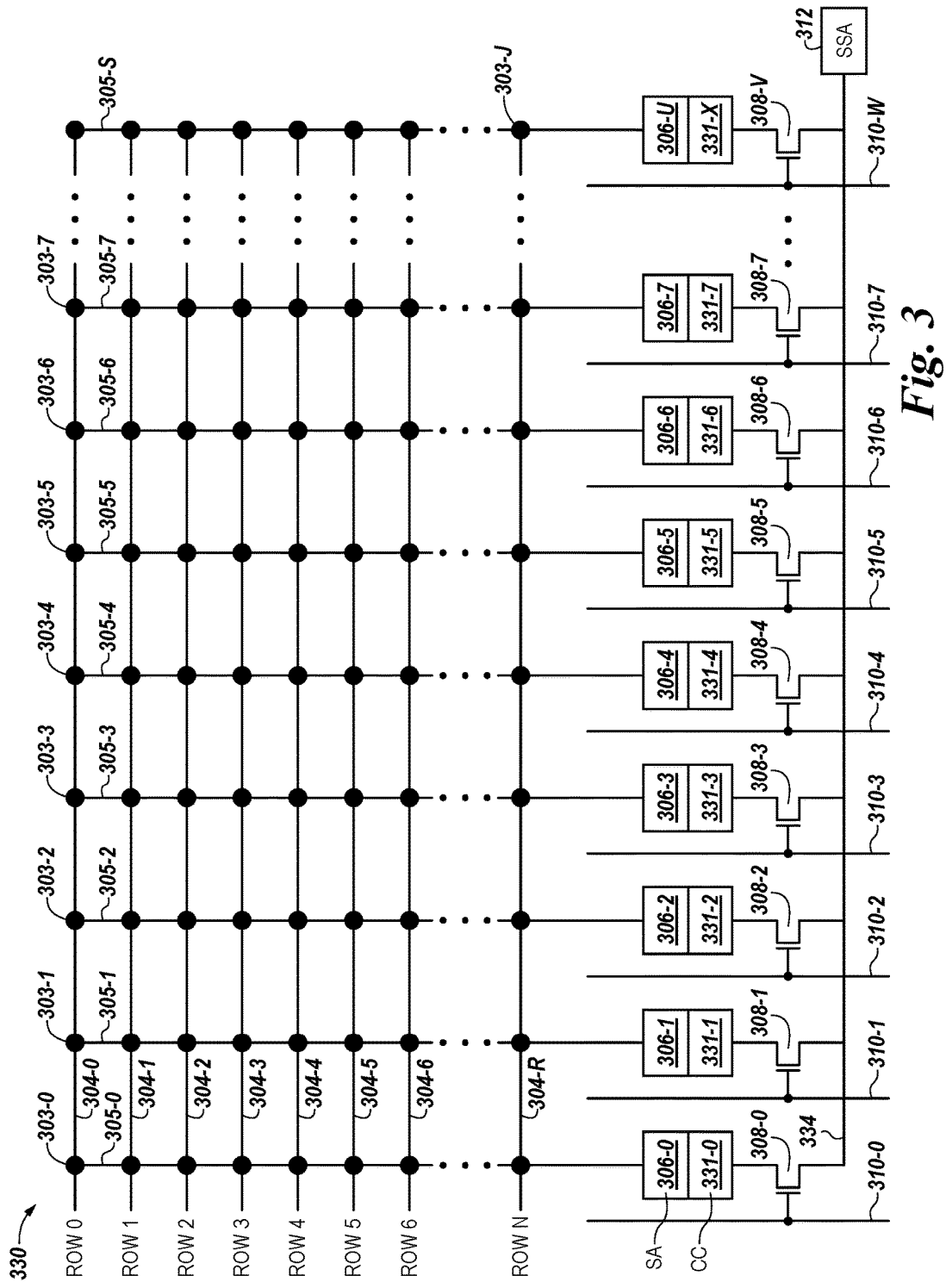

| # | 431 COMP_COMP | 476 DYNAMIC_MASK | 478 STATIC_MASK | TEMP STORAGE ROWS 470 | | 488 DIVIDEND | VECTOR ARGUMENTS 472 | | 494 REMAINDER |
| | | | | 480 CURRENT_DIVIDEND | 482 CURRENT_COMPARE | | 490 DIVISOR | 492 QUOTIENT | |
| --- | --- | --- | --- | --- | --- | --- | --- | --- | --- |
| 1 | | | | | | 0X774488CC | 0X33552233 | 0X00000000 | 0X00000000 |
| 2 | | 0X00000000 | 0X00000000 | | | 0X774488CC | 0X33552233 | 0X00000000 | 0X00000000 |
| 3 | | 0X00000000 | 0X80000000 | 0X00000000 | 0X00000000 | 0X774488CC | 0X33552233 | 0X00000000 | 0X00000000 |
| 4 | 0X80000000 | 0X00000000 | 0X88888888 | 0X00000000 | 0X00000000 | 0X774488CC | 0X33552233 | 0X00000000 | 0X00000000 |
| 5 | 0X88888888 | 0X88888888 | 0X88888888 | 0X00000000 | 0X00000000 | 0X774488CC | 0X33552233 | 0X00000000 | 0X00000000 |
| 6 | 0X88888888 | 0X88888888 | 0X88888888 | 0X00000000 | 0X00000000 | 0X774488CC | 0X33552233 | 0X00000000 | 0X00000000 |

| # | 431 COMP_COMP | 476 DYNAMIC_MASK | 478 STATIC_MASK | 480 CURRENT_DIVIDEND | 482 CURRENT_COMPARE | 488 DIVIDEND | 490 DIVISOR | 492 QUOTIENT | 494 REMAINDER |
|---|---|---|---|---|---|---|---|---|---|
| 7a | 0X88888888 | 0X88888888 | 0X88888888 | 0X00000000 | 0X00000000 | 0X774488CC | 0X33552233 | 0X00000000 | 0X00000000 |
| b | 0X88888888 | 0X88888888 | 0X88888888 | 0X88888888 | 0X00000000 | 0X774488CC | 0X33552233 | 0X00000000 | 0X00000000 |
| c | 0X88888888 | 0X88888888 | 0X88888888 | 0X88888888 | 0X00000000 | 0X774488CC | 0X33552233 | 0X00000000 | 0X00000000 |
| d | 0X00008888 | 0X88888888 | 0X88888888 | 0X88888888 | 0X00000000 | 0X774488CC | 0X33552233 | 0X00000000 | 0X00000000 |
| e | 0X00008888 | 0X88888888 | 0X88888888 | 0X00008888 | 0X00000000 | 0X774488CC | 0X33552233 | 0X00000000 | 0X00000000 |
| f | 0X00001111 | 0X88888888 | 0X88888888 | 0X00008888 | 0X00000000 | 0X774488CC | 0X33552233 | 0X00000000 | 0X00000000 |
| g | 0X00001111 | 0X88888888 | 0X88888888 | 0X00001111 | 0X00000000 | 0X774488CC | 0X33552233 | 0X00000000 | 0X00000000 |
| h | 0X00001111 | 0X88888888 | 0X88888888 | 0X00001111 | 0X00000000 | 0X774488CC | 0X33552233 | 0X00000000 | 0X00000000 |
| i | 0X00001111 | 0X88888888 | 0X88888888 | 0X00001111 | 0X00000000 | 0X774488CC | 0X33552233 | 0X00000000 | 0X00001111 |
| j | 0X00000000 | 0X88888888 | 0X88888888 | 0X00001111 | 0X00000000 | 0X774488CC | 0X33552233 | 0X00000000 | 0X00001111 |
| k | 0X00000000 | 0X88888888 | 0X88888888 | 0X00001111 | 0X00000000 | 0X774488CC | 0X33552233 | 0X00000000 | 0X00001111 |
| l | 0XFFFFFFFF | 0X88888888 | 0X88888888 | 0X00001111 | 0X00000000 | 0X774488CC | 0X33552233 | 0X00000000 | 0X00001111 |
| m | 0X00001111 | 0X88888888 | 0X88888888 | 0X00001111 | 0X00000000 | 0X774488CC | 0X33552233 | 0X00000000 | 0X00001111 |
| n | 0X00001111 | 0X88888888 | 0X88888888 | 0X00001111 | 0X00000000 | 0X774488CC | 0X33552233 | 0X00000000 | 0X00001111 |
| o | 0X00001111 | 0X88888888 | 0X88888888 | 0X00001111 | 0X00000000 | 0X774488CC | 0X33552233 | 0X00000000 | 0X00001111 |
| p | 0X00000000 | 0X88888888 | 0X88888888 | 0X00001111 | 0X00000000 | 0X774488CC | 0X33552233 | 0X00000000 | 0X00001111 |
| q | 0X00000000 | 0X88888888 | 0X88888888 | 0X00001111 | 0X00000000 | 0X774488CC | 0X33552233 | 0X00000000 | 0X00001111 |
| r | 0X00000000 | 0X88888888 | 0X88888888 | 0X00001111 | 0X00000000 | 0X774488CC | 0X33552233 | 0X00000000 | 0X00001111 |
| s | 0X00001111 | 0X88888888 | 0X88888888 | 0X00001111 | 0X00000000 | 0X774488CC | 0X33552233 | 0X00000000 | 0X00001111 |
| t | 0X00002222 | 0X88888888 | 0X88888888 | 0X00002222 | 0X00000000 | 0X774488CC | 0X33552233 | 0X00000000 | 0X00001111 |
| u | 0X00002222 | 0X88888888 | 0X88888888 | 0X00002222 | 0X00000000 | 0X774488CC | 0X33552233 | 0X00000000 | 0X00002222 |
| v | 0X88888888 | 0X88888888 | 0X88888888 | 0X00000000 | 0X00000000 | 0X774488CC | 0X33552233 | 0X00000000 | 0X00002222 |
| w | 0X88888888 | 0X88888888 | 0X88888888 | 0X00000000 | 0X00000000 | 0X774488CC | 0X33552233 | 0X00000000 | 0X00002222 |
| x | 0X88888888 | 0X88888888 | 0X88888888 | 0X00000000 | 0X00000000 | 0X774488CC | 0X33552233 | 0X00000000 | 0X00002222 |

*Fig. 4B*

| # | 431 COMP_COMP | TEMP STORAGE ROWS 470 | | | VECTOR ARGUMENTS 472 | | | |
|---|---|---|---|---|---|---|---|---|
| | | 476 DYNAMIC_MASK | 478 STATIC_MASK | 480 CURRENT_DIVIDEND | 482 CURRENT_COMPARE | 488 DIVIDEND | 490 DIVISOR | 492 QUOTIENT | 494 REMAINDER |
| 7a | 0X88888888 | 0X88888888 | 0X88888888 | 0X00000000 | 0X00000000 | 0X774488CC | 0X33552233 | 0X00000000 | 0X00002222 |
| b | 0X88888888 | 0X88888888 | 0X88888888 | 0X88888888 | 0X00000000 | 0X774488CC | 0X33552233 | 0X00000000 | 0X00002222 |
| c | 0XCCCCCCCC | 0X88888888 | 0X88888888 | 0XCCCCCCCC | 0X00000000 | 0X774488CC | 0X33552233 | 0X00000000 | 0X00002222 |
| d | 0X444488CC | 0X88888888 | 0X88888888 | 0XCCCCCCCC | 0X00000000 | 0X774488CC | 0X33552233 | 0X00000000 | 0X00002222 |
| e | 0X444488CC | 0X88888888 | 0X88888888 | 0X444488CC | 0X00000000 | 0X774488CC | 0X33552233 | 0X00000000 | 0X00002222 |
| f | 0X11112233 | 0X88888888 | 0X88888888 | 0X444488CC | 0X00000000 | 0X774488CC | 0X33552233 | 0X00000000 | 0X00002222 |
| g | 0X11112233 | 0X88888888 | 0X88888888 | 0X444488CC | 0X00000000 | 0X774488CC | 0X33552233 | 0X00000000 | 0X00002222 |
| h | 0X11112233 | 0X88888888 | 0X88888888 | 0X11112233 | 0X00000000 | 0X774488CC | 0X33552233 | 0X00000000 | 0X00002222 |
| i | 0X11112233 | 0X88888888 | 0X88888888 | 0X11112233 | 0X0000FFFF | 0X774488CC | 0X33552233 | 0X00000000 | 0X11112233 |
| j | 0X0000FFFF | 0X88888888 | 0X88888888 | 0X11112233 | 0X0000FFFF | 0X774488CC | 0X33552233 | 0X00000000 | 0X11112233 |
| k | 0X88884444 | 0X88884444 | 0X88888888 | 0X11112233 | 0X0000FFFF | 0X774488CC | 0X33552233 | 0X00000000 | 0X11112233 |
| l | 0XFFFF0000 | 0X88884444 | 0X88888888 | 0X11112233 | 0X0000FFFF | 0X774488CC | 0X33552233 | 0X00000000 | 0X11112233 |
| m | 0X11110000 | 0X88884444 | 0X88888888 | 0X11112233 | 0X0000FFFF | 0X774488CC | 0X33552233 | 0X00000000 | 0X11112233 |
| n | 0X11110000 | 0X88884444 | 0X88888888 | 0X11110000 | 0X0000FFFF | 0X774488CC | 0X33552233 | 0X00000000 | 0X11112233 |
| o | 0X11110000 | 0X88884444 | 0X88888888 | 0X11110000 | 0X0000FFFF | 0X774488CC | 0X33552233 | 0X00000000 | 0X11112233 |
| p | 0X00000000 | 0X88884444 | 0X88888888 | 0X11110000 | 0X0000FFFF | 0X774488CC | 0X33552233 | 0X00000000 | 0X11112233 |
| q | 0X00000000 | 0X88884444 | 0X88888888 | 0X11110000 | 0X0000FFFF | 0X774488CC | 0X33552233 | 0X00000000 | 0X11112233 |
| r | 0X00000000 | 0X88884444 | 0X88888888 | 0X11110000 | 0X0000FFFF | 0X774488CC | 0X33552233 | 0X00001111 | 0X11112233 |
| s | 0X11110000 | 0X88884444 | 0X88888888 | 0X11110000 | 0X0000FFFF | 0X774488CC | 0X33552233 | 0X00001111 | 0X11112233 |
| t | 0X22220000 | 0X88884444 | 0X88888888 | 0X11110000 | 0X0000FFFF | 0X774488CC | 0X33552233 | 0X00001111 | 0X11112233 |
| u | 0X22220000 | 0X88884444 | 0X88888888 | 0X22220000 | 0X0000FFFF | 0X774488CC | 0X33552233 | 0X00001111 | 0X22220000 |
| v | 0X88884444 | 0X88884444 | 0X88888888 | 0X22220000 | 0X0000FFFF | 0X774488CC | 0X33552233 | 0X00001111 | 0X22220000 |
| w | 0X88882222 | 0X88884444 | 0X88888888 | 0X00002222 | 0X0000FFFF | 0X774488CC | 0X33552233 | 0X00001111 | 0X22220000 |
| x | 0X88882222 | 0X88882222 | 0X88888888 | 0X00002222 | 0X0000FFFF | 0X774488CC | 0X33552233 | 0X00001111 | 0X22220000 |

Fig. 4C

| # | 431 COMP_COMP | 476 DYNAMIC_MASK | TEMP STORAGE ROWS 470 478 STATIC_MASK | 480 CURRENT_DIVIDEND | 482 CURRENT_COMPARE | 488 DIVIDEND | VECTOR ARGUMENTS 472 490 DIVISOR | 492 QUOTIENT | 494 REMAINDER |
|---|---|---|---|---|---|---|---|---|---|
| 7a | 0X88882222 | 0X88882222 | 0X88888888 | 0X00002222 | 0X0000FFFF | 0X774488CC | 0X33552233 | 0X00001111 | 0X22220000 |
| b | 0X88882222 | 0X88882222 | 0X88888888 | 0X88882222 | 0X0000FFFF | 0X774488CC | 0X33552233 | 0X00001111 | 0X22220000 |
| c | 0XEEEE3333 | 0X88882222 | 0X88888888 | 0XEEEE3333 | 0X0000FFFF | 0X774488CC | 0X33552233 | 0X00001111 | 0X22220000 |
| d | 0X66440000 | 0X88882222 | 0X88888888 | 0XEEEE3333 | 0X0000FFFF | 0X774488CC | 0X33552233 | 0X00001111 | 0X22220000 |
| e | 0X66440000 | 0X88882222 | 0X88888888 | 0X66440000 | 0X0000FFFF | 0X774488CC | 0X33552233 | 0X00001111 | 0X22220000 |
| f | 0X33220000 | 0X88882222 | 0X88888888 | 0X66440000 | 0X0000FFFF | 0X774488CC | 0X33552233 | 0X00001111 | 0X22220000 |
| g | 0X33220000 | 0X88882222 | 0X88888888 | 0X33220000 | 0X0000FFFF | 0X774488CC | 0X33552233 | 0X00001111 | 0X22220000 |
| h | 0X33220000 | 0X88882222 | 0X88888888 | 0X33220000 | 0X0000FFFF | 0X774488CC | 0X33552233 | 0X00001111 | 0X33220000 |
| i | 0X33220000 | 0X88882222 | 0X88888888 | 0X33220000 | 0000X FFFF | 0X774488CC | 0X33552233 | 0X00001111 | 0X33220000 |
| j | 0XFF000000 | 0X88882222 | 0X88888888 | 0X33220000 | 0XFF000000 | 0X774488CC | 0X33552233 | 0X00001111 | 0X33220000 |
| k | 0X22882222 | 0X22882222 | 0X88888888 | 0X33220000 | 0XFF000000 | 0X774488CC | 0X33552233 | 0X00001111 | 0X33220000 |
| l | 0X00FFFFFF | 0X22882222 | 0X88888888 | 0X33220000 | 0XFF000000 | 0X774488CC | 0X33552233 | 0X00001111 | 0X33220000 |
| m | 0X00220000 | 0X22882222 | 0X88888888 | 0X00220000 | 0XFF000000 | 0X774488CC | 0X33552233 | 0X00001111 | 0X33220000 |
| n | 0X00220000 | 0X22882222 | 0X88888888 | 0X00220000 | 0XFF000000 | 0X774488CC | 0X33552233 | 0X00001111 | 0X33220000 |
| o | 0X00FFFFFF | 0X22882222 | 0X88888888 | 0X00220000 | 0XFF000000 | 0X774488CC | 0X33552233 | 0X00001111 | 0X33220000 |
| p | 0X00001111 | 0X22882222 | 0X88888888 | 0X00220000 | 0XFF000000 | 0X774488CC | 0X33552233 | 0X00001111 | 0X33220000 |
| q | 0X00002222 | 0X22882222 | 0X88888888 | 0X00220000 | 0XFF000000 | 0X774488CC | 0X33552233 | 0X00002222 | 0X33220000 |
| r | 0X00002222 | 0X22882222 | 0X88888888 | 0X00220000 | 0XFF000000 | 0X774488CC | 0X33552233 | 0X11002222 | 0X33220000 |
| s | 0X00220000 | 0X22882222 | 0X88888888 | 0X00220000 | 0XFF000000 | 0X774488CC | 0X33552233 | 0X11002222 | 0X33220000 |
| t | 0X00440000 | 0X22882222 | 0X88888888 | 0X00220000 | 0XFF000000 | 0X774488CC | 0X33552233 | 0X11002222 | 0X33220000 |
| u | 0X00440000 | 0X22882222 | 0X88888888 | 0X00440000 | 0XFF000000 | 0X774488CC | 0X33552233 | 0X11002222 | 0X00440000 |
| v | 0X22882222 | 0X22882222 | 0X88888888 | 0X00440000 | 0XFF000000 | 0X774488CC | 0X33552233 | 0X11002222 | 0X00440000 |
| w | 0X11882222 | 0X22882222 | 0X88888888 | 0X11000000 | 0XFF000000 | 0X774488CC | 0X33552233 | 0X11002222 | 0X00440000 |
| x | 0X11882222 | 0X11882222 | 0X88888888 | 0X11000000 | 0XFF000000 | 0X774488CC | 0X33552233 | 0X11002222 | 0X00440000 |

*Fig. 4D*

| | | TEMP STORAGE ROWS 470 | | | | VECTOR ARGUMENTS 472 | | |
|---|---|---|---|---|---|---|---|---|
| 431 COMP_COMP | 476 DYNAMIC_MASK | 478 STATIC_MASK | 480 CURRENT_DIVIDEND | 482 CURRENT_COMPARE | 488 DIVIDEND | 490 DIVISOR | 492 QUOTIENT | 494 REMAINDER |
| # | | | | | | | | |
| 7a 0X11882222 | 0X11882222 | 0X88888888 | 0X11000000 | 0XFF000000 | 0X774488CC | 0X33552233 | 0X11002222 | 0X00440000 |
| b 0X11882222 | 0X11882222 | 0X88888888 | 0X11882222 | 0XFF000000 | 0X774488CC | 0X33552233 | 0X11002222 | 0X00440000 |
| c 0X11FF3333 | 0X11882222 | 0X88888888 | 0X11FF3333 | 0XFF000000 | 0X774488CC | 0X33552233 | 0X11002222 | 0X00440000 |
| d 0X11440000 | 0X11882222 | 0X88888888 | 0X11FF3333 | 0XFF000000 | 0X774488CC | 0X33552233 | 0X11002222 | 0X00440000 |
| e 0X11440000 | 0X11882222 | 0X88888888 | 0X11440000 | 0XFF000000 | 0X774488CC | 0X33552233 | 0X11002222 | 0X00440000 |
| f 0X11440000 | 0X11882222 | 0X88888888 | 0X11440000 | 0XFF000000 | 0X774488CC | 0X33552233 | 0X11002222 | 0X00440000 |
| g 0X11440000 | 0X11882222 | 0X88888888 | 0X11440000 | 0XFF000000 | 0X774488CC | 0X33552233 | 0X11002222 | 0X00440000 |
| h 0X11440000 | 0X11882222 | 0X88888888 | 0X11440000 | 0XFF000000 | 0X774488CC | 0X33552233 | 0X11002222 | 0X00440000 |
| i 0X11440000 | 0X11882222 | 0X88888888 | 0X11440000 | 0XFF000000 | 0X774488CC | 0X33552233 | 0X11002222 | 0X11440000 |
| j 0X00000000 | 0X11882222 | 0X88888888 | 0X11440000 | 0X00000000 | 0X774488CC | 0X33552233 | 0X11002222 | 0X11440000 |
| k 0X11882222 | 0X11882222 | 0X88888888 | 0X11440000 | 0X00000000 | 0X774488CC | 0X33552233 | 0X11002222 | 0X11440000 |
| l 0XFFFFFFFF | 0X11882222 | 0X88888888 | 0X11440000 | 0X00000000 | 0X774488CC | 0X33552233 | 0X11002222 | 0X11440000 |
| m 0XFFFFFFFF | 0X11882222 | 0X88888888 | 0X11440000 | 0X00000000 | 0X774488CC | 0X33552233 | 0X11002222 | 0X11440000 |
| n 0X11440000 | 0X11882222 | 0X88888888 | 0X11440000 | 0X00000000 | 0X774488CC | 0X33552233 | 0X11002222 | 0X11440000 |
| o 0X11440000 | 0X11882222 | 0X88888888 | 0X11440000 | 0X00000000 | 0X774488CC | 0X33552233 | 0X11002222 | 0X11440000 |
| p 0X11002222 | 0X11882222 | 0X88888888 | 0X11440000 | 0X00000000 | 0X774488CC | 0X33552233 | 0X11002222 | 0X11440000 |
| q 0X22004444 | 0X11882222 | 0X88888888 | 0X11440000 | 0X00000000 | 0X774488CC | 0X33552233 | 0X22004444 | 0X11440000 |
| r 0X22004444 | 0X11882222 | 0X88888888 | 0X11440000 | 0X00000000 | 0X774488CC | 0X33552233 | 0X22004444 | 0X11440000 |
| s 0X11440000 | 0X11882222 | 0X88888888 | 0X11440000 | 0X00000000 | 0X774488CC | 0X33552233 | 0X22004444 | 0X11440000 |
| t 0X22880000 | 0X11882222 | 0X88888888 | 0X22880000 | 0X00000000 | 0X774488CC | 0X33552233 | 0X22004444 | 0X11440000 |
| u 0X22880000 | 0X11882222 | 0X88888888 | 0X22880000 | 0X00000000 | 0X774488CC | 0X33552233 | 0X22004444 | 0X22880000 |
| v 0X11882222 | 0X11882222 | 0X88888888 | 0X22880000 | 0X00000000 | 0X774488CC | 0X33552233 | 0X22004444 | 0X22880000 |
| w 0X11882222 | 0X11882222 | 0X88888888 | 0X00000000 | 0X00000000 | 0X774488CC | 0X33552233 | 0X22004444 | 0X22880000 |
| x 0X11882222 | 0X11882222 | 0X88888888 | 0X00000000 | 0X00000000 | 0X774488CC | 0X33552233 | 0X22004444 | 0X22880000 |

*Fig. 4E*

| # 496 | 431 COMP_COMP | TEMP STORAGE ROWS 470 | | | | 488 DIVIDEND | VECTOR ARGUMENTS 472 | | |
|---|---|---|---|---|---|---|---|---|---|
| | | 476 DYNAMIC_MASK | 478 STATIC_MASK | 480 CURRENT_DIVIDEND | 482 CURRENT_COMPARE | | 490 DIVISOR | 492 QUOTIENT | 494 REMAINDER |
| 8 | 0X11440000 | 0X11882222 | 0X88888888 | 0X22880000 | 0X00000000 | 0X774488CC | 0X33552233 | 0X22004444 | 0X11440000 |

*Fig. 4F*

| 1244 | 1245 | 1256 | 1270 | 1271 |
|---|---|---|---|---|
| A | B | NOT OPEN | OPEN TRUE | OPEN INVERT |
| 0 | 0 | 0 | 0 | 1 |
| 0 | 1 | 0 | 1 | 0 |
| 1 | 0 | 1 | 0 | 1 |
| 1 | 1 | 1 | 1 | 0 |

1275 →

| | | FF | 0 | 0 | 0 | 0 | 0 | 0 | 1 | 1 | 1 | ← 1276 |
|---|---|---|---|---|---|---|---|---|---|---|---|---|
| | | FT | 0 | 0 | 0 | 1 | 1 | 1 | 0 | 0 | 0 | ← 1277 |
| | | TF | 0 | 0 | 1 | 0 | 0 | 1 | 0 | 0 | 1 | ← 1278 |
| | | TT | 0 | 1 | 0 | 0 | 1 | 0 | 0 | 1 | 0 | ← 1279 |
| A | B | A | A*B | A*$\bar{B}$ | A+B | B | AXB | A+$\bar{B}$ | $\overline{AXB}$ | $\bar{B}$ | ← 1247 |
| 0 | 0 | 0 | 0 | 0 | 0 | 0 | 0 | 1 | 1 | 1 | |
| 0 | 1 | 0 | 0 | 0 | 1 | 1 | 1 | 0 | 0 | 0 | |
| 1 | 0 | 1 | 0 | 1 | 1 | 0 | 1 | 1 | 0 | 1 | |
| 1 | 1 | 1 | 1 | 0 | 1 | 1 | 0 | 1 | 1 | 0 | |

DIVISION OPERATIONS IN MEMORY

PRIORITY INFORMATION

This application is a Continuation of U.S. application Ser. No. 14/836,673, filed Aug. 26, 2015, which claims the benefit of U.S. Provisional Application No. 62/045,175, filed Sep. 3, 2014, the contents of which are incorporated herein by reference.

TECHNICAL FIELD

The present disclosure relates generally to semiconductor memory apparatuses and methods, and more particularly, to apparatuses and methods related to performing division operations in a memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry (FUC)) such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the operations and/or data may also be sequenced and/or buffered.

In many instances, the processing resources (e.g., processor and/or associated FUC) may be external to the memory array, and data can be accessed (e.g., via a bus between the processing resources and the memory array) to execute instructions. Data can be moved from the memory array to registers external to the memory array via a bus.

BRIEF DESCRIPTION OF THE DRAWINGS

FIG. 3 illustrates a schematic diagram of a portion of a memory array in accordance with a number of embodiments of the present disclosure.

FIG. 4A illustrates a table showing the states of memory cells of an array at a particular phase associated with performing a division operation in accordance with a number of embodiments of the present disclosure.

FIG. 4B illustrates a table showing the states of memory cells of an array at a particular phase associated with performing a division operation in accordance with a number of embodiments of the present disclosure.

FIG. 4C illustrates a table showing the states of memory cells of an array at a particular phase associated with performing a division operation in accordance with a number of embodiments of the present disclosure.

FIG. 4D illustrates a table showing the states of memory cells of an array at a particular phase associated with performing a division operation in accordance with a number of embodiments of the present disclosure.

FIG. 4E illustrates a table showing the states of memory cells of an array at a particular phase associated with performing a division operation in accordance with a number of embodiments of the present disclosure.

FIG. 4F illustrates a table showing the states of memory cells of an array at a particular phase associated with performing a division operation in accordance with a number of embodiments of the present disclosure.

FIG. 12 is a logic table illustrating selectable logic operation results implemented by a sensing circuitry in accordance with a number of embodiments of the present disclosure.

DETAILED DESCRIPTION

Figure 1:
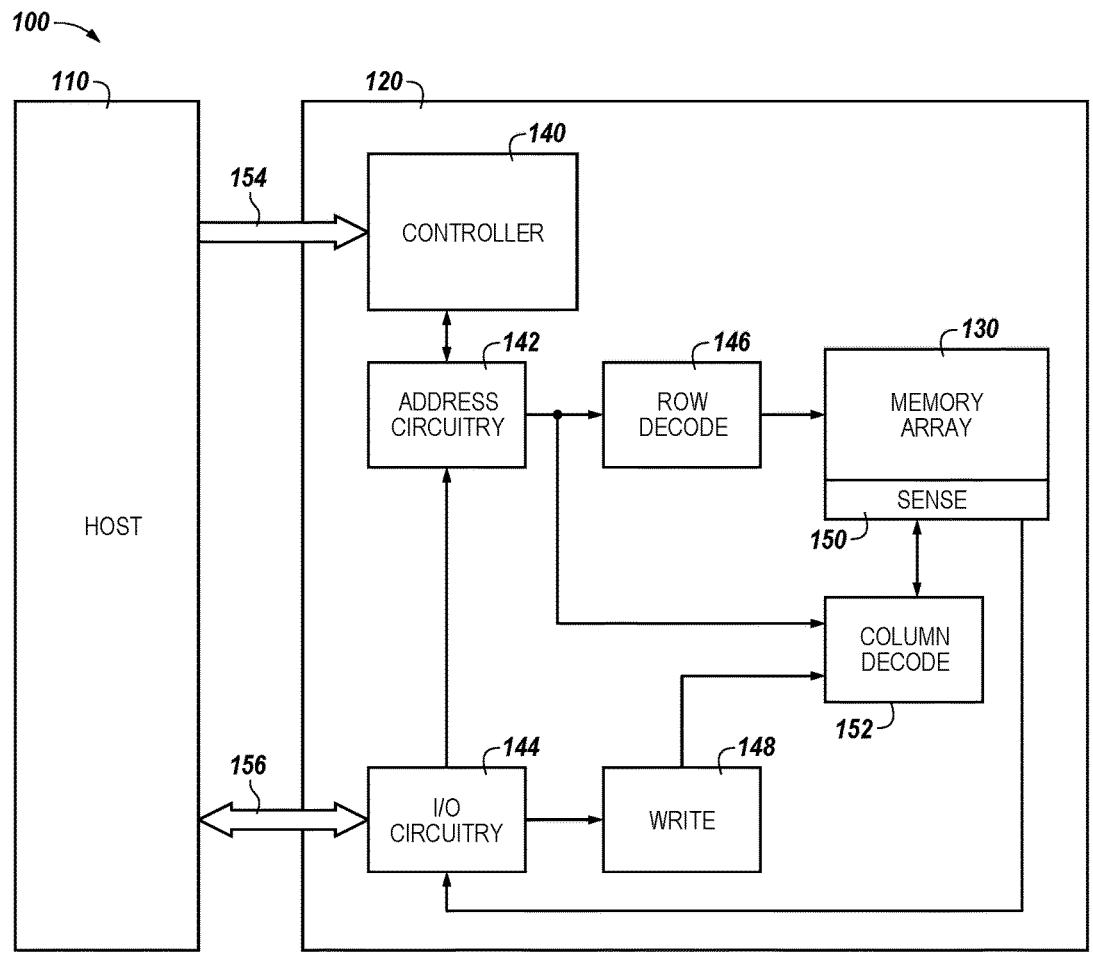
FIG. 1 is a block diagram of an apparatus in the form of a computing system including a memory device in accordance with a number of embodiments of the present disclosure.

The present disclosure includes apparatuses and methods related to performing division operations in a memory. A division operation can be performed on a plurality of dividend elements and a plurality of divisor elements. The plurality of dividend elements and the plurality of divisor elements can be stored in a plurality of groups memory cells coupled to different access lines. For example, a first group of memory cells coupled to a first access line can be configured to store the plurality of dividend elements. A second group of memory cells coupled to a second access line can be configured to store the plurality of divisor elements. The division operation can include a controller configured to divide the dividend element by the divisor element by controlling sensing circuitry to perform a number of operations without transferring data via an input/output (I/O) line.

Dividing the dividend elements by the divisor elements includes performing a division operation on element pairs (e.g., data in the form of bit-vectors stored in an array). Performing the division operation on element pairs can include performing the division operation on a first dividend element from the plurality of dividend elements and a first divisor element from a plurality of divisor elements from a first element pair, on a second dividend element from the plurality of dividend elements and a second divisor element from the plurality of divisor elements from the second element pair, etc. Performing the division operation on a plurality of element pairs may be described as performing a first division operation on a first element pair, a second division operation on a second element pair, etc.

The division operation can be performed on element pairs in parallel. For example, the division operation can be performed on elements from the first element pair and elements from the second element pair in parallel.

As used herein, the plurality of dividend elements and the plurality of divisor elements can be numerical values that are divided. That is, a dividend element can be divided by a divisor element. A division operation can be used to determine a quotient element (e.g., quotient value) and a remainder element (e.g., remainder value). As used herein, the quotient element is defined as the number of times the divisor element divides into the dividend element. That is, the quotient element can be the integer part of the result of the division operation. The remainder element is defined as the remaining portion of the dividend element after the divisor element divides the dividend element. That is, the remainder element can be the non-integer part of the result of the division operation. However, the remainder element can be expressed as an integer value.

In a number of examples, an element can represent an object and/or other construct, which may be represented by a bit-vector. As an example, a division operation can be performed to divide objects by dividing the bit-vectors that represent the respective objects.

A number of embodiments of the present disclosure can provide a reduction of the number of operations (e.g., computations, functions, etc.) and/or time involved in performing a number of division operations (e.g., division functions) relative to previous approaches. For instance, the number of computations and/or the time can be reduced due to an ability to perform various division operations in parallel (e.g., simultaneously). Performing a number of division operations as described herein can also reduce power consumption as compared to previous approaches. In accordance with a number of embodiments, a division operation can be performed on elements without transferring data out of the memory array and/or sensing circuitry via a bus (e.g., data bus, address bus, control bus, etc.). A division operation can involve performing a number of logical operations in parallel. For example, a division operation can include performing a plurality of AND operations in parallel, a plurality of OR operations in parallel, a plurality of SHIFT operations in parallel, a plurality of INVERT operations in parallel, etc. However, embodiments are not limited to these examples.

In various previous approaches, a dividend element and a divisor element associated with a division operation may be transferred from the array and sensing circuitry to a number of registers via a bus comprising input/output (I/O) lines. The number of registers can be used by a processing resource such as a processor, microprocessor, and/or compute engine, which may comprise ALU circuitry and/or other functional unit circuitry configured to perform the appropriate logical operations. However, often only a single division operation can be performed by the ALU circuitry, and transferring data to/from memory from/to registers via a bus can involve significant power consumption and time requirements. Even if the processing resource is located on a same chip as the memory array, significant power can be consumed in moving data out of the array to the compute circuitry (e.g., ALU), which can involve performing a sense line address access (e.g., firing of a column decode signal) in order to transfer data from sense lines onto I/O lines, moving the data to the array periphery, and providing the data to a register in association with performing a division operation, for instance.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "M," "N," "J," "R," "S," "U," "V," "X," "Y," and "W," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 130 may reference element "30" in FIG. 1, and a similar element may be referenced as 230 in FIG. 2A. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled to memory device 120, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as digit lines or data lines). Although a single array 130 is shown in FIG. 1, embodiments are not so limited. For instance, memory device 160 may include a number of arrays 130 (e.g., a number of banks of DRAM cells). An example DRAM array is described in association with FIG. 2A.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can be a state machine, a sequencer, or some other type of controller.

An example of the sensing circuitry 150 is described further below in association with FIG. 2A. For instance, in a number of embodiments, the sensing circuitry 150 can comprise a number of sense amplifiers and a number of compute components, which may comprise an accumulator and can be used to perform logical operations (e.g., on data associated with complementary sense lines). In a number of embodiments, the sensing circuitry (e.g., 150) can be used to perform division operations using data stored in array 130 as inputs and store the results of the division operations back to the array 130 without transferring via a sense line address access (e.g., without firing a column decode signal). As such, a division operation can be performed using sensing circuitry 150 rather than and/or in addition to being performed by processing resources external to the sensing circuitry 150 (e.g., by a processor associated with host 110 and/or other processing circuitry, such as ALU circuitry, located on device 120 (e.g., on controller 140 or elsewhere)).

In various previous approaches, data associated with a division operation, for instance, would be read from memory via sensing circuitry and provided to an external ALU. The external ALU circuitry would perform the division operations using the elements (which may be referred to as operands or inputs) and the result could be transferred back to the array via the local I/O lines. In contrast, in a number of embodiments of the present disclosure, sensing circuitry (e.g., 150) is configured to perform a division operation on data stored in memory cells in memory array 130 and store the result back to the array 130 without enabling a local I/O line coupled to the sensing circuitry.

As such, in a number of embodiments, registers and/or an ALU external to array 130 and sensing circuitry 150 may not be needed to perform the division operation as the sensing circuitry 150 can perform the appropriate computations involved in performing the division operation using the address space of memory array 130. Additionally, the division operation can be performed without the use of an external processing resource.

Figure 2A:
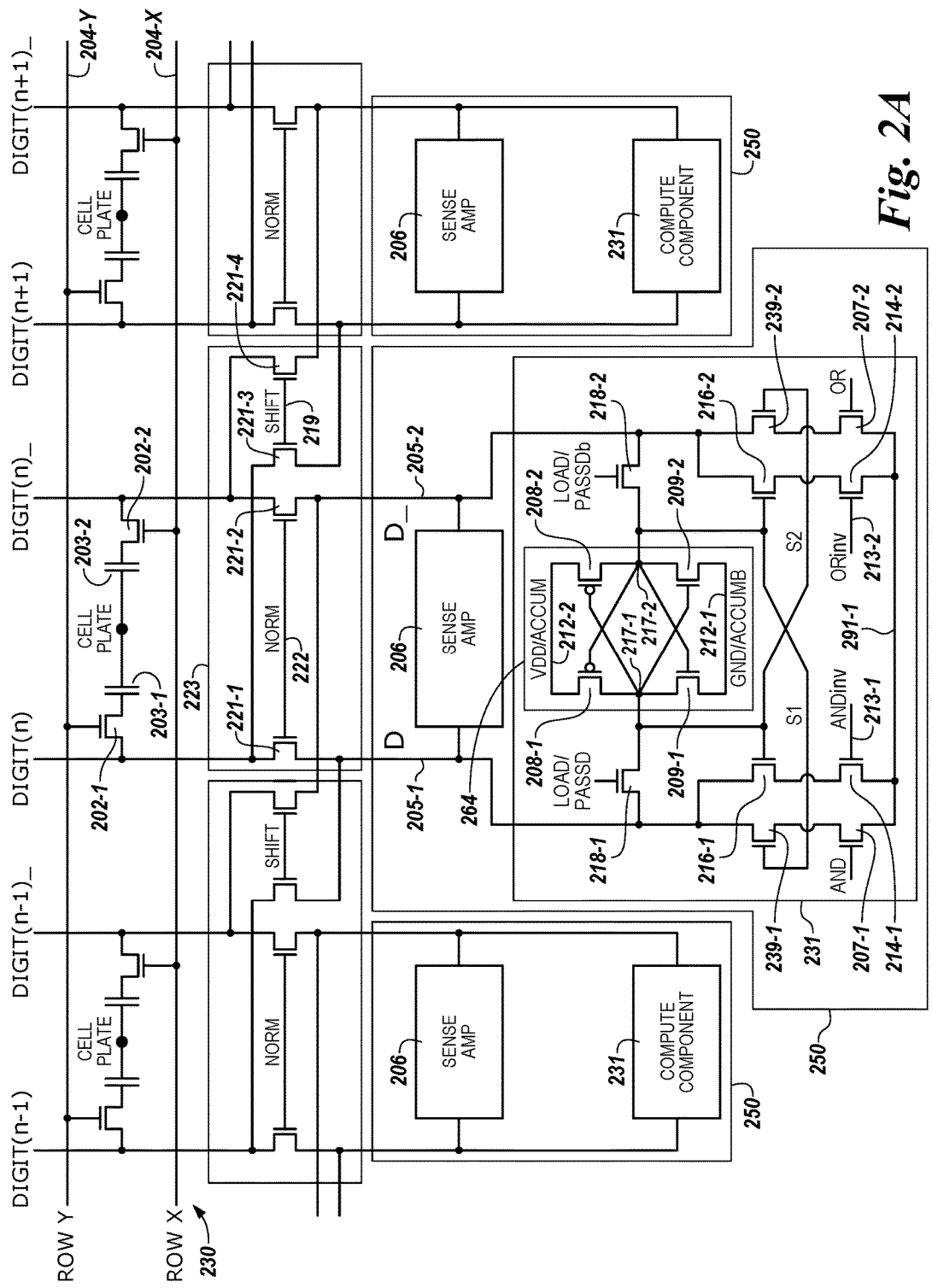
FIG. 2A illustrates a schematic diagram of a portion of a memory array in accordance with a number of embodiments of the present disclosure.

FIG. 2A illustrates a schematic diagram of a portion of a memory array 230 including sensing circuitry 250 in accordance with a number of embodiments of the present disclosure. In FIG. 2A, a memory cell comprises a storage element (e.g., capacitor) and an access device (e.g., transistor). For instance, a first memory cell comprises transistor 202-1 and capacitor 203-1, and a second memory cell comprises transistor 202-2 and capacitor 203-2. In this example, the memory array 230 is a DRAM array of 1T1C (one transistor one capacitor) memory cells; however, embodiments are not so limited. In a number of embodiments, the memory cells may be destructive read memory cells (e.g., reading the data stored in the cell destroys the data such that the data originally stored in the cell is refreshed after being read). The cells of the memory array 230 are arranged in rows coupled by word lines 204-X (Row X), 204-Y (Row Y), etc., and columns coupled by pairs of complementary data lines (e.g., DIGIT(n−1)/DIGIT(n−1)_, DIGIT(n)/DIGIT(n)_, DIGIT(n+1)/DIGIT(n+1)_). The individual data lines corresponding to each pair of complementary data lines can also be referred to as data lines 205-1 (D) and 205-2 (D_), respectively. Although only three pair of complementary data lines are shown in FIG. 2A, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-1 can be coupled to data line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to data line 205-2 (D_), a second source/drain region of transistor 202-2 can be coupled to capacitor 203-2, and a gate of a transistor 202-2 can be coupled to word line 204-X. The cell plate, as shown in FIG. 2A, can be coupled to each of capacitors 203-1 and 203-2. The cell plate can be a common node to which a reference voltage (e.g., ground) can be applied in various memory array configurations.

The memory array 230 is coupled to sensing circuitry 250 in accordance with a number of embodiments of the present disclosure. In this example, the sensing circuitry 250 comprises a sense amplifier 206 and a compute component 231 corresponding to respective columns of memory cells (e.g., coupled to respective pairs of complementary data lines). The sense amplifier 206 can comprise a cross coupled latch, which can be referred to herein as a primary latch. The sense amplifier 206 can be configured, for example, as described with respect to FIG. 2B.

In the example illustrated in FIG. 2A, the circuitry corresponding to compute component 231 comprises a static latch 264 and an additional ten transistors that implement, among other things, a dynamic latch. The dynamic latch and/or static latch of the compute component 231 can be collectively referred to herein as a secondary latch, which can serve as an accumulator. As such, the compute component 231 can operate as and/or be referred to herein as an accumulator. The compute component 231 can be coupled to each of the data lines 205-1 (D) and 205-2 (D_) as shown in FIG. 2A. However, embodiments are not limited to this example. The transistors of compute component 231 can all be n-channel transistors (e.g., NMOS transistors); however, embodiments are not so limited.

In this example, data line 205-1 can be coupled to a first source/drain region of transistors 216-1 and 239-1, as well as to a first source/drain region of load/pass transistor 218-1. Data line 205-2 can be coupled to a first source/drain region of transistors 216-2 and 239-2, as well as to a first source/drain region of load/pass transistor 218-2.

The gates of load/pass transistor 218-1 and 218-2 can be commonly coupled to a LOAD control signal, or respectively coupled to a PASSD/PASSDB control signal, as discussed further below. A second source/drain region of load/pass transistor 218-1 can be directly coupled to the gates of transistors 216-1 and 239-2. A second source/drain region of load/pass transistor 218-2 can be directly coupled to the gates of transistors 216-2 and 239-1.

A second source/drain region of transistor 216-1 can be directly coupled to a first source/drain region of pull-down transistor 214-1. A second source/drain region of transistor 239-1 can be directly coupled to a first source/drain region of pull-down transistor 207-1. A second source/drain region of transistor 216-2 can be directly coupled to a first source/drain region of pull-down transistor 214-2. A second source/drain region of transistor 239-2 can be directly coupled to a first source/drain region of pull-down transistor 207-2. A second source/drain region of each of pull-down transistors 207-1, 207-2, 214-1, and 214-2 can be commonly coupled together to a reference voltage line 291-1 (e.g., ground (GND)). A gate of pull-down transistor 207-1 can be coupled to an AND control signal line, a gate of pull-down transistor 214-1 can be coupled to an ANDinv control signal line 213-1, a gate of pull-down transistor 214-2 can be coupled to an ORinv control signal line 213-2, and a gate of pull-down transistor 207-2 can be coupled to an OR control signal line.

The gate of transistor 239-1 can be referred to as node S1, and the gate of transistor 239-2 can be referred to as node S2. The circuit shown in FIG. 2A stores accumulator data dynamically on nodes S1 and S2. Activating the LOAD control signal causes load/pass transistors 218-1 and 218-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 2A is not contingent on the LOAD control signal being elevated to a voltage greater than $V_{DD}$.

The configuration of compute component 231 shown in FIG. 2A has the benefit of balancing the sense amplifier for functionality when the pull-down transistors 207-1, 207-2, 214-1, and 214-2 are conducting before the sense amplifier 206 is fired (e.g., during pre-seeding of the sense amplifier 206). As used herein, firing the sense amplifier 206 refers to enabling the sense amplifier 206 to set the primary latch and subsequently disabling the sense amplifier 206 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 216-1 (having a gate coupled to S2 of the dynamic latch) in series with transistor 214-1 (having a gate coupled to an ANDinv control signal line 213-1) can be operated to pull-down data line 205-1 (D), and transistor 216-2 (having a gate coupled to S1 of the dynamic latch) in series with transistor 214-2 (having a gate coupled to an ANDinv control signal line 213-2) can be operated to pull-down data line 205-2 (D_).

The latch 264 can be controllably enabled by coupling to an active negative control signal line 212-1 (ACCUMB) and an active positive control signal line 212-2 (ACCUM) rather than be configured to be continuously enabled by coupling to ground and $V_{DD}$. In various embodiments, load/pass transistors 208-1 and 208-2 can each having a gate coupled to one of a LOAD control signal or a PASSD/PASSDB control signal.

According to some embodiments, the gate of load/pass transistor 218-1 can be coupled to a PASSD control signal, and the gate of load/pass transistor 218-2 can be coupled to a PASSDb control signal. In the configuration in which the gates of transistors 218-1 and 218-2 are respectively coupled to one of the PASSD and PASSDb control signals, transistors 218-1 and 218-2 can be pass transistors. Pass transistors can be operated differently (e.g., at different times and/or under different voltage/current conditions) than load transistors. As such, the configuration of pass transistors can be different than the configuration of load transistors.

For instance, load transistors can be constructed to handle loading associated with coupling data lines to the local dynamic nodes S1 and S2, and pass transistors can be constructed to handle heavier loading associated with coupling data lines to an adjacent accumulator (e.g., through the shift circuitry 223, as shown in FIG. 2A). According to some embodiments, load/pass transistors 218-1 and 218-2 can be configured to accommodate the heavier loading corresponding to a pass transistor but be coupled and operated as a load transistor. Load/pass transistors 218-1 and 218-2 configured as pass transistors can also be utilized as load transistors. However, load/pass transistors 218-1 and 218-2 configured as load transistors may not be capable of being utilized as pass transistors.

In a number of embodiments, the compute component 231, including the latch 264, can comprise a number of transistors formed on pitch with the transistors of the corresponding memory cells of an array (e.g., array 230 shown in FIG. 2A) to which they are coupled, which may conform to a particular feature size (e.g., 4 F$^2$, 6 F$^2$, etc.). According to various embodiments, latch 264 includes four transistors 208-1, 208-2, 209-1, and 209-2 coupled to a pair of complementary data lines 205-1 and 205-2 through load/pass transistors 218-1 and 218-2. However, embodiments are not limited to this configuration. The latch 264 can be a cross coupled latch (e.g., gates of a pair of transistors, such as n-channel transistors (e.g., NMOS transistors) 209-1 and 209-2 are cross coupled with the gates of another pair of transistors, such as p-channel transistors (e.g., PMOS transistors) 208-1 and 208-2). As described further herein, the cross coupled latch 264 can be referred to as a static latch.

The voltages or currents on the respective data lines 205-1 and 205-2 can be provided to the respective latch inputs 217-1 and 217-2 of the cross coupled latch 264 (e.g., the input of the secondary latch). In this example, the latch input 217-1 is coupled to a first source/drain region of transistors 208-1 and 209-1 as well as to the gates of transistors 208-2 and 209-2. Similarly, the latch input 217-2 can be coupled to a first source/drain region of transistors 208-2 and 209-2 as well as to the gates of transistors 208-1 and 209-1.

Figure 2B:
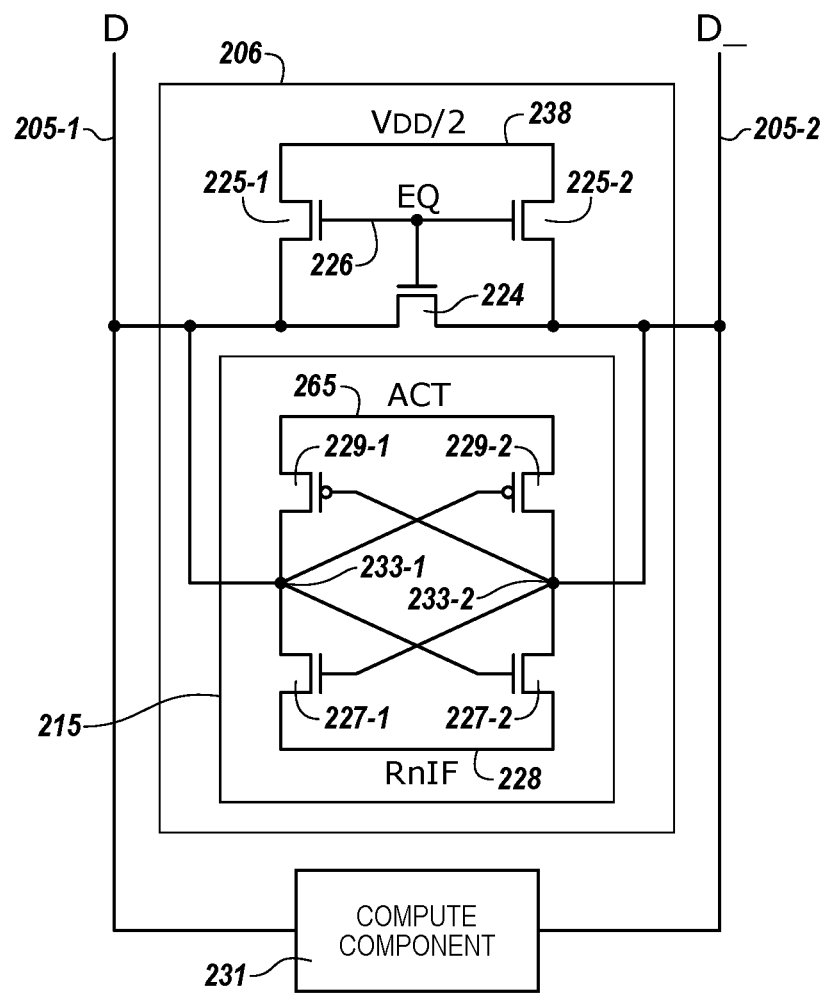
FIG. 2B illustrates a schematic diagram of a portion of a memory array in accordance with a number of embodiments of the present disclosure.

In this example, a second source/drain region of transistor 209-1 and 209-2 is commonly coupled to a negative control signal line 212-1 (e.g., ground (GND) or ACCUMB control signal similar to control signal RnIF shown in FIG. 2B with respect to the primary latch). A second source/drain region of transistors 208-1 and 208-2 is commonly coupled to a positive control signal line 212-2 (e.g., V$_{DD}$ or ACCUM control signal similar to control signal ACT shown in FIG. 2B with respect to the primary latch). The positive control signal 212-2 can provide a supply voltage (e.g., V$_{DD}$) and the negative control signal 212-1 can be a reference voltage (e.g., ground) to enable the cross coupled latch 264. According to some embodiments, the second source/drain region of transistors 208-1 and 208-2 are commonly coupled directly to the supply voltage (e.g., V$_{DD}$), and the second source/drain region of transistor 209-1 and 209-2 are commonly coupled directly to the reference voltage (e.g., ground) so as to continuously enable latch 264.

The enabled cross coupled latch 264 operates to amplify a differential voltage between latch input 217-1 (e.g., first common node) and latch input 217-2 (e.g., second common node) such that latch input 217-1 is driven to either the activated positive control signal voltage (e.g., V$_{DD}$) or the activated negative control signal voltage (e.g., ground), and latch input 217-2 is driven to the complementary (e.g., other) of the activated positive control signal voltage (e.g., V$_{DD}$) or the activated negative control signal voltage (e.g., ground).

FIG. 2B illustrates a schematic diagram of a portion of a memory array in accordance with a number of embodiments of the present disclosure. According to various embodiments, sense amplifier 206 can comprise a cross coupled latch. However, embodiments of the sense amplifier 206 are not limited to a cross coupled latch. As an example, the sense amplifier 206 can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 206) can comprise a number of transistors formed on pitch with the transistors of the corresponding compute component 231 and/or the memory cells of an array (e.g., 230 shown in FIG. 2A) to which they are coupled, which may conform to a particular feature size (e.g., 4 F$^2$, 6 F$^2$, etc.). The sense amplifier 206 comprises a latch 215 including four transistors coupled to a pair of complementary data lines 205-1 and 205-2. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). As described further herein, the latch 215 comprising transistors 227-1, 227-2, 229-1, and 229-2 can be referred to as a primary latch. However, embodiments are not limited to this example.

The voltages and/or currents on the respective data lines D and D_ can be provided to the respective latch inputs 233-1 and 233-2 of the cross coupled latch 215 (e.g., the input of the secondary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 233 (e.g., accumulator) can be coupled to latch inputs 233-1 and 233-2 of the cross coupled latch 215 as shown; however, embodiments are not limited to the example shown in FIG. 2B.

In this example, a second source/drain region of transistor 227-1 and 227-2 is commonly coupled to an active negative control signal 228 (RnIF). A second source/drain region of transistors 229-1 and 229-2 is commonly coupled to an active positive control signal 265 (ACT). The ACT signal 265 can be a supply voltage (e.g., V$_{DD}$) and the RnIF signal can be a reference voltage (e.g., ground). Activating signals 228 and 265 enables the cross coupled latch 215.

The enabled cross coupled latch 215 operates to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of V$_{DD}$ and ground), and latch input 233-2 is driven to the other of the ACT signal voltage and the RnIF signal voltage.

The sense amplifier 206 can also include circuitry configured to equilibrate the data lines 205-1 and 205-2 (e.g., in association with preparing the sense amplifier for a sensing operation). In this example, the equilibration circuitry comprises a transistor 224 having a first source/drain region coupled to a first source/drain region of transistor 225-1 and data line 205-1. A second source/drain region of transistor 224 can be coupled to a first source/drain region of transistor 225-2 and data line 205-2. A gate of transistor 224 can be coupled to gates of transistors 225-1 and 225-2.

The second source drain regions of transistors 225-1 and 225-2 are coupled to an equilibration voltage 238 (e.g., V$_{DD}$/2), which can be equal to V$_{DD}$/2, where V$_{DD}$ is a supply voltage associated with the array. The gates of transistors 224, 225-1, and 225-2 can be coupled to control signal 225 (EQ). As such, activating EQ enables the transistors 224, 225-1, and 225-2, which effectively shorts data line 205-1 to data line 205-2 such that the data lines 205-1 and 205-2 are equilibrated to equilibration voltage V$_{DD}$/2. According to various embodiments of the present disclosure, a number of logical operations can be performed using the sense amplifier, and storing the result in the compute component (e.g., accumulator).

As shown in FIG. 2A, the sense amplifier 206 and the compute component 231 can be coupled to the array 230 via shift circuitry 223. In this example, the shift circuitry 223 comprises a pair of isolation devices (e.g., isolation transistors 221-1 and 221-2) coupled to data lines 205-1 and 205-2, respectively). The isolation transistors 221-1 and 221-2 are coupled to a control signal 222 (NORM) that, when activated, enables (e.g., turns on) the isolation transistors 221-1 and 221-2 to couple the corresponding sense amplifier 206 and compute component 231 to a corresponding column of memory cells (e.g., to a corresponding pair of complementary data lines 205-1 and 205-2). According to various embodiments, conduction of isolation transistors 221-1 and 221-2 can be referred to as a "normal" configuration of the shift circuitry 223.

In the example illustrated in FIG. 2A, the shift circuitry 223 includes another (e.g., a second) pair of isolation devices (e.g., isolation transistors 221-3 and 221-4) coupled to a complementary control signal 219 (SHIFT), which can be activated, for example, when NORM is deactivated. The isolation transistors 221-3 and 221-4 can be operated (e.g., via control signal 219) such that a particular sense amplifier 206 and compute component 231 are coupled to a different pair of complementary data lines (e.g., a pair of complementary data lines different than the pair of complementary data lines to which isolation transistors 221-1 and 221-2 couple the particular sense amplifier 206 and compute component 231), or can couple a particular sense amplifier 206 and compute component 231 to another memory array (and isolate the particular sense amplifier 206 and compute component 231 from a first memory array). According to various embodiments, the shift circuitry 223 can be arranged as a portion of (e.g., within) the sense amplifier 206, for instance.

Although the shift circuitry 223 shown in FIG. 2A includes isolation transistors 221-1 and 221-2 used to couple particular sensing circuitry 250 (e.g., a particular sense amplifier 206 and corresponding compute component 231) to a particular pair of complementary data lines 205-1 and 205-2 (e.g., DIGIT(n) and DIGIT(n)_) and isolation transistors 221-3 and 221-4 are arranged to couple the particular sensing circuitry 250 to an adjacent pair of complementary data lines in one particular direction (e.g., adjacent data lines DIGIT(n+1) and DIGIT(n+1)_ shown to the right in FIG. 2A), embodiments of the present disclosure are not so limited. For instance, shift circuitry can include isolation transistors 221-1 and 221-2 used to couple particular sensing circuitry to a particular pair of complementary data lines (e.g., DIGIT(n) and DIGIT(n)_ and isolation transistors 221-3 and 221-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 2A).

Embodiments of the present disclosure are not limited to the configuration of shift circuitry 223 shown in FIG. 2A. In a number of embodiments, shift circuitry 223 such as that shown in FIG. 2A can be operated (e.g., in conjunction with sense amplifiers 206 and compute components 231) in association with performing various operations (e.g., logical and/or arithmetic operations) without transferring data out of the sensing circuitry 250 via an I/O line (e.g., I/O line 334 shown in FIG. 3), for instance. Although shift circuitry 223 is shown to be separate from sensing circuitry 250 (e.g., sensing circuitry 150 in FIG. 1), shift circuitry 223 can be considered to be part of sensing circuitry 250 (e.g., sensing circuitry 150 in FIG. 1).

Although not shown in FIG. 2A, each column of memory cells can be coupled to a column decode line (e.g., decode lines 310-0 to 310-W shown in FIG. 3) that can be activated to transfer, via local I/O line (e.g., I/O line 334 shown in FIG. 3), a data value from a corresponding sense amplifier 206 and/or compute component 231 to a control component external to the array such as an external processing resource (e.g., host processor and/or other functional unit circuitry). The column decode line can be coupled to a column decoder (e.g., column decoder 152 shown in FIG. 1). However, as described herein, in a number of embodiments, data need not be transferred via such I/O lines to perform logical operations in accordance with embodiments of the present disclosure. In a number of embodiments, shift circuitry 223 can be operated in conjunction with sense amplifiers 206 and compute components 231 to perform various operations (e.g., logical operations in association with performing subtraction, addition, multiplication, division, etc.) without transferring data to a control component external to the array, for instance.

The sensing circuitry 250 can be operated in several modes to perform logical operations, including a second mode in which a result of the logical operation is initially stored in the sense amplifier 206, and a first mode in which a result of the logical operation is initially stored in the compute component 231. Operation of the sensing circuitry 250 in the second mode is described below with respect to FIGS. 5 and 6, and operation of the sensing circuitry 250 in the second mode is described below with respect to FIGS. 7-10. Additionally, with respect to the first operating mode, sensing circuitry 250 can be operated in both pre-sensing (e.g., sense amps fired before logical operation control signal active) and post-sensing (e.g., sense amps fired after logical operation control signal active) modes with a result of a logical operation being initially stored in the sense amplifier 206.

As described further below, the sense amplifier 206 can, in conjunction with the compute component 231, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations using less power than various previous approaches. Additionally, since a number of embodiments eliminate the need to transfer data across I/O lines (e.g., between memory and discrete processor) in order to perform various operations (e.g., compute functions, a number of embodiments can enable an increased parallel processing capability as compared to previous approaches.

FIG. 3 illustrates a schematic diagram of a portion of a memory array 330 in accordance with a number of embodiments of the present disclosure. The array 330 includes memory cells 303-0, 303-1, 303-3, 303-4, 303-5, 303-6, 303-7, 303-8, . . . , 303-J (e.g., referred to generally as memory cells 303), coupled to rows of access lines 304-0, 304-1, 304-2, 304-3, 304-4, 304-5, 304-6, . . . , 304-R and columns of sense lines 305-0, 305-1, 305-2, 305-3, 305-4, 305-5, 305-6, 305-7, . . . , 305-S, which may be referred to generally as access lines 304 and sense lines 305. Memory array 330 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines (e.g., complementary sense lines 205-1 and 205-2 in FIG. 2A).

Each column of memory cells can be coupled to sensing circuitry (e.g., sensing circuitry 150 shown in FIG. 1 and sensing circuitry 250 shown in FIG. 2A). In this example, the sensing circuitry comprises a number of sense amplifiers 306-0, 306-1, 306-2, 306-3, 306-4, 306-5, 306-6, 306-7, . . . , 306-U (e.g., referred to generally as sense amplifiers 306) coupled to the respective sense lines 305-0, 305-1, 305-2, 305-3, 305-4, 305-5, 305-6, 305-7, . . . , 305-S. The sense amplifiers 306 are coupled to input/output (I/O) line 334 (e.g., a local I/O line) via access devices (e.g., transistors) 308-0, 308-2, 308-3, 308-4, 308-5, 308-6, 308-7, . . . , 308-V. In this example, the sensing circuitry also comprises a number of compute components 331-0, 331-2, 331-3, 331-4, 331-5, 331-6, 331-7, . . . , 331-X (e.g., referred to generally as compute components 331) coupled to the respective sense lines. Column decode lines 310-0 to 310-W are coupled to the gates of transistors 308-0 to 308-V, respectively, and can be selectively activated to transfer data sensed by respective sense amplifiers 306-0 to 306-U and/or stored in respective compute components 331-0 to 331-X to a secondary sense amplifier 312 and/or to processing resources external to array 330 (e.g., via I/O line 334). In a number of embodiments, the compute components 331 can be formed on pitch with the memory cells of their corresponding columns and/or with the corresponding sense amplifiers 306.

The sensing circuitry (e.g., compute components 331 and sense amplifiers 306) is configured to perform a division operation in accordance with a number of embodiments described herein. The example given in FIGS. 4A to 4F demonstrates how a division operation can be performed using data stored in array 330 as the inputs. The example involves using the elements (e.g., operands comprising bits corresponding to logic "1" or logic "0") stored in the memory cells coupled to access lines 304-0 to 304-R and commonly coupled to sense lines 305-0 to 305-S as the respective inputs to the division operation. The result of the division operation can be stored in array 330 and/or can be transferred external to the array 330 (e.g., to functional unit circuitry of a host).

FIG. 4A illustrates a table showing the states of memory cells of an array at a number of particular phases associated with performing a division operation in accordance with a number of embodiments of the present disclosure. Column 496 of the table provides reference numbers (e.g., 1-8) for the rows of the table, and the reference numbers shown in the table correspond to the respective reference numbers of the pseudocode described below. The bit-vector values for each of the bit-vectors 476 (Dynamic_Mask), 478 (Static_Mask), 480 (Current_Dividend), 482 (Current_Compare), 488 (Dividend), 490 (Divisor), 492 (Quotient), and 494 (Remainder) are stored in the array at various division operation phases corresponding to reference numbers 1-8.

The bit-vectors 476, 478, 480, 482 can be stored in respective groups of memory cells coupled to particular access lines, which may be referred to as temporary storage rows 470 (e.g., rows that store data that may be updated during various phases of a division operation). The bit-vectors 488, 490, 492, and 494 can be referred to as vector arguments 472. FIG. 4A also indicate the bit-vector values for a bit-vector 431 (Comp_Comp) stored in compute components (e.g., 331 shown in FIG. 3) of the array.

In FIG. 4A the values of the bit-vectors corresponding to the temporary storage rows 470 and/or the vector arguments 472 are shown in hexadecimal format although the corresponding bit-vectors operated on during the division operation can be stored as binary bit patterns in the array. For example, a Dividend bit-vector 488 (e.g., [0111, 0111, 0100, 0100, 1000, 1000, 1100, 1100] can be represented as [7, 7, 4, 4, 8, 8, c, c] in hexadecimal format. The values shown in FIGS. 4A to 4F are shown in hexadecimal format for ease of reference.

In the examples used herein, bit-vector values may include commas and/or spaces for ease of reference. For instance, a bit-vector represented in hexadecimal notation as [7, 7, 4, 4, 8, 8, c, c] can correspond to eight 4-bit wide vector elements, with the eight elements separated by a respective comma and space. However, the same bit-vector can be represented as [7 7 4 4 8 8 c c] (e.g., without commas) and/or as [774488cc] (e.g., without commas and without spaces).

In FIGS. 4A to 4F changes to the bit-vectors corresponding to Comp_Comp 431, the bit-vectors corresponding to the temporary storage rows 470 (e.g., Dynamic_Mask 476, Static_Mask 478, Current_Dividend 480, and Current_Compare 482), and the bit-vectors corresponding to vector arguments 472 (e.g., Dividend 488, Divisor 490, Quotient 492, and Remainder 494) are indicated in bold font. For example, at reference 1, Dividend 488, Divisor 490, Quotient 492, and Remainder 494 are shown in bold font indicating values of the respective bit-vectors have changed during an operation phase to which the reference number corresponds.

In the example shown in FIGS. 4A to 4F, each of Dividend 488 (e.g., a bit-vector [774488cc]) and Divisor 490 (e.g., a bit-vector [33552233]) comprise eight elements and are associated with eight separate division operations. Each of the eight separate division operations can be performed in parallel. Performing a number of division operations in parallel includes performing the number of division operation in single instruction multiple data (SIMD) fashion. As used herein, SIMD is defined as performing a same operation on multiple elements simultaneously.

For example, a first division operation can include dividing a first element (e.g., 7) of Dividend 488 by a first element (e.g., 3) of Divisor 490. That is, a first division operation can be performed on a first element pair that includes the first dividend element from Dividend 488 and the first divisor element from Divisor 490. A second division operation can be performed on a second element pair that includes the second dividend element (e.g., 7) from Dividend 488 and the second divisor element (e.g., 3) from Divisor 490. A third division operation can be performed on a third element pair that includes the third dividend element (e.g., 4) from Dividend 488 and the third divisor element (e.g., 5) from Divisor 490. A fourth division operation can be performed on a fourth element pair that includes the fourth dividend element (e.g., 4) from Dividend 488 and the fourth divisor element (e.g., 5) from Divisor 490. A fifth division operation can be performed on a fifth element pair that includes the fifth dividend element (e.g., 8) from Dividend 488 and the fifth divisor element (e.g., 2) from Divisor 490. A sixth division operation can be performed on a sixth element pair that includes the sixth dividend element (e.g., 8) from Dividend 488 and the sixth divisor element (e.g., 2) from Divisor 490. A seventh division operation can be performed on a seventh element pair that includes the seventh dividend element (e.g., c) from Dividend 488 and the seventh divisor element (e.g., 3) from Divisor 490. An eighth division operation can be performed on an eighth element pair that includes the eighth dividend element (e.g., c) from Dividend 488 and the eighth divisor element (e.g., 3) from Divisor 490.

A first group of memory cells that store Dividend 488 can be cells coupled to a particular access line (e.g., 304-0 in FIG. 3) and to a number of sense lines (e.g., 305-0 to 305-31 in FIG. 3). The second group of memory cells that store Divisor 490 can be cells coupled to a different particular access line (e.g., 304-1 in FIG. 3) and to a number of sense lines (e.g., 305-0 to 305-31 in FIG. 3).

The eight elements of Dividend 488 can be stored in the first group of memory cells. For example, a first element (e.g., 7) of Dividend 488 can be stored in memory cells that are coupled to access line 304-0 and sense lines 305-0 to 305-3 in FIG. 3, a second element (e.g., 7) of Dividend 488 can be stored in memory cells that are coupled to access line 304-0 and sense lines 305-4 to 305-7 in FIG. 3, a third element (e.g., 4) of Dividend 488 can be stored in memory cells that are coupled to access line 304-0 and sense lines 305-8 to 305-11 in FIG. 3, a fourth element (e.g., 4) of Dividend 488 can be stored in memory cells that are coupled to access line 304-0 and sense lines 305-12 to 305-15 in FIG. 3, a fifth element (e.g., 8) of Dividend 488 can be stored in memory cells that are coupled to access line 304-0 and sense lines 305-16 to 305-19 in FIG. 3, a sixth element (e.g., 8) of Dividend 488 can be stored in memory cells that are coupled to access line 304-0 and sense lines 305-20 to 305-23 in FIG. 3, a seventh element (e.g., c) of Dividend 488 can be stored in memory cells that are coupled to access line 304-0 and sense lines 305-24 to 305-27 in FIG. 3, an eight element (e.g., c) of Dividend 488 can be stored in memory cells that are coupled to access line 304-0 and sense lines 305-28 to 305-31 in FIG. 3.

The eight elements of Divisor 490 can be stored in the second group of memory cells. For example, a first element (e.g., 3) of Divisor 490 can be stored in memory cells that are coupled to access line 304-1 and sense lines 305-0 to 305-3 in FIG. 3, a second element (e.g., 3) of Divisor 490 can be stored in memory cells that are coupled to access line 304-1 and sense lines 305-4 to 305-7 in FIG. 3, a third element (e.g., 5) of Divisor 490 can be stored in memory cells that are coupled to access line 304-1 and sense lines 305-8 to 305-11 in FIG. 3, a fourth element (e.g., 5) of Divisor 490 can be stored in memory cells that are coupled to access line 304-1 and sense lines 305-12 to 305-15 in FIG. 3, a fifth element (e.g., 2) of Divisor 490 can be stored in memory cells that are coupled to access line 304-1 and sense lines 305-16 to 305-19 in FIG. 3, a sixth element (e.g., 2) of Divisor 490 can be stored in memory cells that are coupled to access line 304-1 and sense lines 305-20 to 305-23 in FIG. 3, a seventh element (e.g., 3) of Divisor 490 can be stored in memory cells that are coupled to access line 304-1 and sense lines 305-24 to 305-27 in FIG. 3, an eight element (e.g., 3) of Divisor 490 can be stored in memory cells that are coupled to access line 304-1 and sense lines 305-28 to 305-31 in FIG. 3.

Dynamic_Mask 476, Static_Mask 478, Current_Dividend 480, and Current_Compare 483 include bit-vectors that are stored in a plurality of groups of memory cells. For instance, Dynamic_Mask 476, Static_Mask 478, Current_Dividend 480, and Current_Compare 483 can be stored in memory cells that are coupled to respective access lines 304-2 to 304-5 and to sense lines 305-0 to 305-31.

In this example, the first element in Dividend 488 has a decimal value of 7, which can be represented by binary bit-vector [0111]. The particular bits of the bit-vector can be stored in the cells coupled to access line 304-0 and to the corresponding respective sense lines 305-0 to 305-3 (e.g., the most significant bit (MSB) of the bit-vector can be stored in the ROW 0 cell coupled to sense line 305-0, the next least significant bit (LSB) can be stored in the ROW 0 cell coupled to sense line 305-1, . . . , and the LSB can be stored in the ROW 0 cell coupled to sense line 305-3) in FIG. 3. Similarly, the first element in Divisor 490 has a decimal value of 3, which can be represented by binary bit-vector [0011], and the particular bits of the bit-vector can be stored in the cells coupled to access line 304-1 and to the corresponding respective sense lines 305-0 to 305-3. As such, the respective bits of the 4-bit wide bit-vectors representing the first element in Dividend 488 and the first element in Divisor 490 can be stored in cells coupled to respective same sense lines. That is, in this example, the MSBs of the bit-vectors are stored in cells coupled to sense line 305-0, the next least significant bits of the bit-vectors are stored in cells coupled to sense line, 305-1, etc.

In a number of examples, the MSB of the bit-vectors can be stored in the ROW 0 cell coupled to sense line 305-3, the next LSB can be stored in the ROW 0 cell coupled to sense line 305-2, . . . , and the LSB can be stored in the ROW 0 cell coupled to sense line 305-0. That is, the MSBs of the bit-vectors are stored in cells coupled to sense line 305-3, the next least significant bits of the bit-vectors are stored in cells coupled to sense line, 305-2, etc.

However, embodiments are not limited to this example. For instance, elements to be divided in accordance with embodiments described herein can be represented by bit-vectors having a width other than 4-bits. For instance, a 64-bit wide dividend bit-vector could represent four elements each represented by a 16-bit wide bit-vector and could be stored in cells coupled to access line 304-0 (and to sense lines 305-0 to 305-63), and a 64-bit wide divisor bit-vector could represent four elements each represented by a 16-bit wide bit vector and could be stored in cells coupled to access line 304-1 (and to sense lines 305-0 to 305-63). The four elements represented by the 64-bit wide dividend bit-vector can be divided by the respective four elements represented by the 64-bit wide divisor bit-vector in accordance with embodiments described herein.

In a number of embodiments, the result of a division operation can be stored in a third group of memory cells, which can be cells coupled to a number of particular access lines (e.g., 304-0 to 304-R in FIG. 3). The third group of memory cells can be used to store a quotient bit-vector and/or a remainder bit-vector that indicates the result of the division operation. The third group of memory cells can, for example, be cells coupled to an access line 304-6 and/or access line 304-7 and/or cells coupled to at least one of access line 304-0 and access line 304-1. That is, the third group of memory cells can be a same group of memory cells as the first group of memory cells (e.g., the group of memory cells storing the dividend bit-vector) and/or the second group of memory cells (e.g., the group of memory cells storing the divisor bit-vector). For instance, in the 4-bit wide bit-vector example above, the third group of memory cells can be cells coupled to access line 304-0 and to sense lines 305-0 to 305-31 and/or cells coupled to access line 304-1 and to sense lines 305-0 to 305-31.

As an example, the first quotient element in Quotient 492 can be stored in the cells coupled to access line 304-6 and to sense lines 305-0 to 305-3 as shown in FIG. 3. The first remainder element in Remainder 494 can be stored in the cells coupled to access line 304-7 and to the sense lines 305-0 to 305-3, for instance. In a number of examples, the first quotient element and/or the first remainder element can be stored in cells coupled to an access line to which cells storing the first dividend element from Dividend 488 and/or first divisor element from divisor 490 are coupled. For instance, if a dividend element is stored in a first group of cells coupled to access line 304-0 and a divisor element is stored in a second group of cells coupled to access line 304-1, a third group of cells storing the quotient element and/or the remainder element may comprise cells coupled to access lines 304-0 and 304-1 in FIG. 3, respectively.

The third group of memory cells can also comprise a first number of memory cells coupled to a particular access line and a second number of memory cells coupled to a different particular access line. The first and second numbers of memory cells can store two different bit-vectors that together indicate the results of the division operation. For example, a quotient bit-vector can be stored in the first number of memory cells and a remainder bit-vector can be stored in the second number of memory cells.

As described further below, dividing the first element (e.g., 7) of Dividend 488 by the first element (e.g., 3) of Divisor 490, results in the first element in Quotient 492 having a value equal to 2 and the first element in Remainder 494 having a value equal to 1 (e.g., 7 divided by 3 equals 2 with a remainder of 1).

In a number of examples, performing a division operation on a dividend element and a divisor element can include performing a number of AND operations, OR operations, SHIFT operations, and INVERT operations without transferring data via an input/output (I/O) line. The number of AND operations, OR operations, INVERT operations, and SHIFT operations can be performed using sensing circuitry on pitch with memory cells corresponding to respective columns of complementary sense lines. In a number of examples, the number of AND operations, OR operations, SHIFT operations, and INVERT operations can be performed to divide a number of dividend elements by a number of divisor elements in parallel. Performing operations (e.g., AND, OR, INVERT, SHIFT) in association with performing a number of division operations in memory is described further below in association with FIGS. 5-10.

The below pseudocode represents instructions executable to perform a number of division operations in a memory in accordance with a number of embodiments of the present disclosure. The example pseudocode is referenced using reference numbers 1-8, which correspond to the respective reference numbers 1-8 shown in column 496 of the table shown in FIGS. 4A to 4F. For example, reference number one (1) corresponds to "Load Dividend, Divisor" in the pseudocode, and reference number two (2) corresponds to "Find out element count in sub array for the vector width" in the pseudocode.

1. Load Dividend, Divisor.
2. Find out element count in sub array for the vector width.
3. Obtain all Temp Rows.
4. Find MSB and store in Comp_Comp, Static_Mask.
5. Find MSB by shifting right with fixed vector for each vector width in Comp_Comp, Static_Mask.
6. Store in Dynamic_Mask.
7. For given Vector Fixed width:
   a. Load Dynamic_Mask in Comp_Comp.
   b. Store in Current_Dividend.
   c. Loop for current position in element.
      i. Shift Right.
      ii. Perform OR with Static_Mask.
      iii. Store in Current_Dividend.
      d. Perform AND operation with Dividend.
      e. Store Comp_Comp in Current_Dividend.
      f. Shift Right from current position to the beginning of Vector.
      g. Perform OR with Remainder.
      h. Store in Current_Dividend
      i. Store in Remainder
      j. Horizontal compare Current_Dividend with Divisor get greater than mask in Current_Compare.
      k. Shift right Dynamic_Mask by applying Current_Compare.
      l. Load inverse of Current_Compare into Comp_Comp.
      m. Perform AND operation with Remainder.
      n. Store in Row_Current_Dividend.
      o. Using Current_Compare mask get difference from remainder and Divisor into Current_Dividend.
      p. Load Quotient in Comp_Comp.
      q. Shift left, store in Quotient.
      r. Using Current_Compare mask add to Quotient a true bit at the end of each fixed Vector.
      s. Load Current_Dividend in Comp_Comp.
      t. Shift Left
      u. Store Comp_Comp in Current_Dividend and Remainder.
      v. Load Dynamic_Mask in Comp_Comp.
      w. Shift Comp_Comp right applying mask in Current_Compare.
      x. Store Comp_Comp in Dynamic_Mask.
8. Right Shift Remainder.

For purposes of discussion, the above pseudocode will be divided into a setup phase, a division phase, and a shift phase. The pseudocode referenced by reference numbers 1-6 and FIG. 4A can correspond to the setup phase. FIG. 4A illustrates the values of a number of bit-vectors associated with performing a division operation after the setup phase. The pseudocode referenced by reference numbers 7a-7x and FIGS. 4B to 4E can correspond to the division phase. FIGS. 4B to 4E illustrate the values of a number of bit-vectors associated with performing a division operation after the division phase. The pseudocode referenced by reference number 8 and FIG. 4F can correspond to the shift phase. FIG. 4F illustrates the values of a number of bit-vectors associated with performing a division operation after the shift phase.

In a number of examples, the results of the division operation can be stored in an array (e.g., array 330 in FIG. 3) without transferring data via an I/O line (e.g., I/O line 334). In a number of examples, the results of the division operation can be transferred to a location other than array 330 in FIG. 3.

The pseudocode corresponding to reference number 1 (e.g., Load Dividend, Divisor) is associated with storing Dividend 488 and Divisor 490 into the array 330 in FIG. 3. As described above, Dividend 488 and Divisor 490 can each include a number of elements. At reference number 1, the bit-vector [774488cc] is stored in a group of memory cells that store Dividend 488, the bit-vector [33552233] is stored in a group of memory cells that store Divisor 490, the bit-vector [00000000] is stored in a group of memory cells that store Quotient 492 and is stored in a group of memory cells that store Remainder 494.

As used herein, Dynamic_Mask 476 can be used to coordinate performing logical operations associated with a division operation. The Static_Mask 478 can be used to define boundaries of elements in Dividend 488 and Divisor 490 (e.g., bit positions at which the respective elements begin and/or end). Static_Mask 478 can also be used to set Dynamic_Mask 476. An example of setting the Dynamic_Mask 476 using the Static_Mask 478 is given in the operations performed in association with reference number 6. The Current_Dividend 480 can be used to represent the sum of the remainder and the dividend. The Current_Compare 482 can be used to store a mask that is the result of a comparison operation.

The groups of memory cells corresponding to temporary storage rows 470 (e.g., the rows storing bit-vectors 476, 478, 480, and 482) may be oriented within memory 330 in a manner that facilitates performance of the division operation on the element pairs. For example, a plurality of groups of memory cells each storing the bit-vectors corresponding to respective temporary storage rows can be coupled to sense lines 305-0 to 305-31 in FIG. 3. Each group in the plurality of groups of memory cells can be coupled to a different access line (e.g., different access lines than those having cells coupled thereto that are used to store the bit-vectors 488 and 490).

The pseudocode referenced at reference number 2 (e.g., Find out element count in sub array for the vector width) is associated with determining the quantity of elements in each of Dividend 488 and/or Divisor 490. The quantity of elements can be determined based on an element width, for instance. In a number of examples, the element width can be a known and/or given quantity that may be provided by host and/or user (e.g., the element width can be a predetermined quantity). For instance, in this example in which the bit vectors 488 and 490 have a width of 32 bits, the element count can be determined based on the know element width of 4 bits. As such, the element count is 8 (e.g., 32 bits divided by 4 bits/element equals 8 elements). Therefore, in this example, Dividend 488 and Divisor 490 each comprise 8 elements. Similarly, if the element count is a known quantity (e.g., 8), then the element width can be determined based on the width of bit-vectors 488 and 490 (e.g., 32 bits divided by 8 elements equals 4 bits per element). The element count and element width can be used, for example, in performing iterations of operations (e.g., "for" loops) in association with performing division operations as described below.

The pseudocode reference at reference numbers 4 to 5 can be performed to create a bit-vector that identifies the most significant bit (MSB) in each of the elements in Dividend 488 and/or Divisor 490. Although each of the elements have a same element width in this example, embodiments are not so limited.

The pseudocode referenced at reference number 4 (e.g., Find MSB and store in Comp_Comp, Static_Mask) is associated with determining the MSB in Dividend 488 and/or Divisor 490 and storing a bit-vector indicating the MSB in particular groups of memory cells. The bit pattern indicating the most significant bit can be stored (e.g., as a bit-vector) in a group of memory cells used to store Static_Mask 476. The bit pattern indicating the MSB can also be stored (e.g., as a latched bit-vector) in sensing circuitry (e.g., compute components 331 and/or sense amplifiers 306 in FIG. 3). As an example, a bit pattern comprising a "1" in a MSB position and all "0s" in the remaining bit positions can be used to indicate the MSB of Dividend 488 and/or Divisor 490. For instance, in this example, Dividend 488 and Divisor 490 are 32-bit wide bit-vectors and can be stored in memory cells coupled to sense lines 305-0 to 305-31, such that the 32-bit wide binary bit-vector [1000 0000 0000 0000 0000 0000 0000 0000] (e.g., hexadecimal bit-vector [80000000]) can be used as the bit-vector indicating the MSB in Dividend 488 and Divisor 490. As such, as shown in FIG. 4A (e.g., at reference 4), the bit-vector indicating the MSB (e.g., a bit-vector [1000 0000 0000 0000 0000 0000 0000 0000]) is stored in the group of memory cells storing bit-vector 478 and is stored in the compute components storing bit-vector 431 (e.g., bit-vectors 431 and 478 have a hexadecimal value [80000000]).

The pseudocode referenced at reference number 5 (e.g., Find MSB by shifting right with fixed vector for each vector width in Comp_Comp) is associated with determining a bit-vector that can indicate a MSB corresponding to each of a number of elements represented by Dividend 488 and/or Divisor 490. The bit-vector used to indicate the MSBs corresponding to the number of elements can be determined by performing a number of logical operations (e.g., a number of iterations of SHIFT operations and OR operations) on the bit-vector stored in the compute components (e.g., 331-0 to 331-31 in FIG. 3). The SHIFT and OR iterations can result in a binary bit-vector [1000, 1000, 1000, 1000, 1000, 1000, 1000, 1000] (e.g., the hexadecimal bit-vector [88888888]) that comprises a "1" at the bit positions corresponding to the MSBs for each of the eight elements represented by Dividend 488 and/or Divisor 490. The SHIFT operations can be right SHIFT operations; however, embodiments are not limited to this example. The SHIFT operations can be performed on Comp_Comp 431. The OR operations can be performed on Static_Mask 478 and Comp_Comp 431. The results of the SHIFT operations and the OR operations can be stored in a group of memory cells that store Static_Mask 478 and the compute components (e.g., 331-0 to 331-31 in FIG. 3) that store Comp_Comp 431. As such, as shown in FIG. 4A (e.g., at reference 5), the bit-vector indicating the MSBs corresponding to the respective elements (e.g., a bit-vector [88888888]) is stored in the group of memory cells storing bit-vector 478 and is stored in the compute components storing bit-vector 431.

The pseudocode referenced at reference number 6 (e.g., Store in Dynamic_Mask) is associated with storing the bit-vector identifying the MSB corresponding to each of a number of elements represented by Dividend 488 and/or Divisor 490 in memory cells that store Dynamic_Mask 476. As such, as shown in FIG. 4A (e.g., at reference 6), the hexadecimal bit-vector [88888888] is stored in a group of memory cells that store Dynamic_Mask 476.

FIG. 4B illustrates a table showing the states of memory cells of an array at a number of particular phases associated with performing a division operation in accordance with a number of embodiments of the present disclosure. FIG. 4B includes column 496 which comprises reference numbers corresponding to the reference numbers of the pseudocode shown above. As such, FIG. 4B indicates the values of the bit-vectors stored in the cells corresponding to bit-vectors Dynamic_Mask 476, Static_Mask 478, Current_Dividend 480, Current_Compare 482, Dividend 488, Divisor 490, Quotient 492, and Remainder 494 during various phases associated with performing a division operation. The table shown in FIG. 4B also shows the value of the bit-vector Comp_Comp 431 during the various phases associated with performing the division operation.

The pseudocode referenced at reference number 7 (e.g., reference number 7a to 7x and shown as "For given Vector Fixed width"), corresponds to performing a number of iterations of operations. A number of iterations of operations can be defined via a loop structure. As used herein, a "loop" is defined as a control flow statement that allows a number of operations to be performed in a number of iterations based on a boolean condition. A loop can expressed via a FOR loop, a WHILE loop, and/or a DO loop, among other possible loop structures. Each iteration of the loop that is associated with reference number 7 can include performing a number of operations. The number of operations can include performing SHIFT operations, OR operations, and/or AND operations, among other operations.

The example described in association with FIGS. 4A to 4F includes performing a FOR loop that includes performing a number of iterations of a number of operations. In this example, the number of iterations is equal to the element width (e.g., 4). Therefore, in this example, the FOR loop includes performing the number of operations four times. A particular iteration of the FOR loop can be annotated by "E". E can be initialized to zero and can be incremented by 1 at the beginning of each iteration of the FOR loop while E is less than the element width (e.g., 4). As such, a different element width can result in performing the number of operations more or fewer times than those described in this example.

FIG. 4B illustrates the values of a number of bit-vectors (e.g., bit-vectors 431, 476, 478, 480, 482, 488, 490, 492, and 494) associated with performing the number of operations associated with a first iteration of the FOR loop. As such, FIG. 4B is described with respect to a first iteration (e.g., E=0) corresponding to reference numbers 7a to 7x. FIG. 4C illustrates the values of the number of bit-vectors associated with performing the number of operations associated with a second iteration of the FOR loop. As such, FIG. 4C is described with respect to a second iteration (e.g., E=1) corresponding to reference numbers 7a to 7x. FIG. 4D illustrates the values of the number of bit-vectors associated with performing the number of operations associated with a third iteration of the FOR loop. As such, FIG. 4D is described with respect to a third iteration (e.g., E=2) corresponding to reference numbers 7a to 7x. FIG. 4E illustrates the values of the number of bit-vectors associated with performing the number of operations associated with a fourth iteration of the FOR loop. As such, FIG. 4E is described with respect to a fourth iteration (e.g., E=3) corresponding to reference numbers 7a to 7x.

The pseudocode referenced at reference number 7a (e.g., Load Dynamic_Mask in Comp_Comp) is associated with storing the Dynamic_Mask 476 (e.g., a bit-vector [88888888]) in the compute components that store Comp_Comp 431. That is, a read operation can be performed to copy the value of the bit-vector stored in the cells storing bit-vector 476 to the compute components (e.g., 331-0 to 331-31 shown in FIG. 3) storing bit-vector 431. The pseudocode referenced at reference number 7b (e.g., Store in Current_Dividend) is associated with storing Comp_Comp 431 in the memory cells that store Current_Dividend 480. That is, the bit-vector stored in the compute components storing bit-vector 431 is copied to the memory cells storing bit-vector 480. As such, as shown in row 7a of FIG. 4B, bit-vector 431 stores [88888888], and as shown in row 7b of FIG. 4B, bit-vector 480 also stores [88888888].

The pseudocode referenced at reference number 7c (e.g., reference number 7ci to 7ciii and shown as "Loop for current position in element") is associated with performing a loop comprising performing a number of iterations of operations. The number of iterations (e.g., the number of times the operations corresponding to reference numbers 7ci to 7ciii are performed) can be based on a current iteration of the FOR loop described above (e.g., described in association with reference number 7). For instance, in a first iteration (e.g., for E=0 and associated with FIG. 4B) of the FOR loop described above, the operations corresponding to reference numbers 7ci to 7ciii are performed zero times, in a second iteration (e.g., for E=1 and associated with FIG. 4C) of the FOR loop described above, the operations corresponding to reference numbers 7ci to 7ciii are performed once, in a third iteration (e.g., for E=2 and associated with FIG. 4D) of the FOR loop described above, the operations corresponding to reference numbers 7ci to 7ciii are performed twice, and in a fourth iteration (e.g., for E=3 and associated with FIG. 4E) of the FOR loop described above, the operations corresponding to reference numbers 7ci to 7ciii are performed three times.

The pseudocode referenced at reference number 7ci (e.g., Shift Right) is associated with performing a right SHIFT operation. The right SHIFT operation can be performed on Current_Dividend 480. For example, Current_Dividend 480 can be stored (e.g., read into) in the sensing circuitry (e.g., in the compute components used to store Comp_Comp 431) and the bits of the bit-vector corresponding thereto can each be shifted to the right by one bit position. Therefore, the SHIFT operation can be performed on Comp_Comp 431 (e.g., on the bit-vector currently stored in the compute components storing Comp_Comp 431) such that the result of the SHIFT operation can be stored in the sensing circuitry. An INVERT operation can then be performed on Comp_Comp 431, and the result of the INVERT operation can be stored in the sensing circuitry (e.g., as the current value of Comp_Comp 431 and/or in the sense amps corresponding to the compute components storing Comp_Comp 431). In the example described in association with FIGS. 4A-4F, the results of various operations (e.g., AND, OR, SHIFT, INVERT) that are stored in the sensing circuitry are initially stored in the compute components corresponding to Comp_Comp 431; however, as described further below, the results can be stored initially in sense amplifiers corresponding to the compute components, for instance.

The pseudocode referenced at reference number 7cii (e.g., Perform OR with Static_Mask) is associated with performing an OR operation on Comp_Comp 431 and Static_Mask 478. The result of the OR operation can be stored in the sensing circuitry (e.g., as the current value of Comp_Comp 431). An INVERT operation can be performed on Comp_Comp 431. That is, the values of the bits stored in the respective compute components storing Comp_Comp 431 can be inverted. An OR operation can be performed on Comp_Comp 431 and Current_Dividend 480, and the result of the OR operation can be stored in the sensing circuitry and/or the memory cells that store the Current_Dividend 480. The pseudocode referenced at reference number 7ciii (e.g., Store in Current Dividend) is associated with storing the result of the OR operation (e.g., the OR performed on Comp_Comp 431 and Current_Dividend 480) in the memory cells that store the Current_Dividend 480 (e.g., copying the value of Comp_Comp 431 to Current_Dividend 480).

Since FIG. 4B corresponds to the first iteration (e.g., E=0) of the FOR loop associated with reference number 7, the operations corresponding to reference numbers 7ci to 7ciii are performed zero times. As such, as shown in row 7c of FIG. 4B, the bit-vector Current_Dividend 480 is unchanged as compared to its value shown in row 7b. That is, Current_Dividend 480 remains [88888888].

The pseudocode referenced at reference number 7d (e.g., Perform AND operation with Dividend) is associated with performing an AND operation on Comp_Comp 431 and Dividend 488, and the result can be stored in (e.g., can remain in) the compute components corresponding to Comp_Comp 431. In this example, Comp_Comp 431 is a hexadecimal bit-vector [88888888] which is binary bit-vector [1000 1000 1000 1000 1000 1000 1000 1000] and Dividend 488 is a hexadecimal bit-vector [774488cc] which is binary bit-vector [0111 0111 0100 0100 1000 1000 1100 1100]. The result of the AND operation is a hexadecimal bit-vector [00008888] which is binary bit-vector [0000 0000 0000 0000 1000 1000 1000 1000].

As described further below, performing a logical operation (e.g., AND, OR, etc.) on a first and second bit-vector can include performing the logical operation on respective corresponding bit pairs. For example, performing an AND operation can include "ANDing" the MSBs of the respective bit-vectors with the result being the MSB of the resultant bit-vector, "ANDing" the next MSBs of the respective bit-vectors with the result being the next MSB of the resultant bit-vector, . . . , and "ANDing" the LSBs of the respective bit-vectors with the result being the LSB of the resultant bit-vector. As shown in row 7d of FIG. 4B, the result of the AND operation (e.g., [00008888] is stored in Comp_Comp 431.

The pseudocode referenced at reference number 7e (e.g., Store Comp_Comp in Current_Dividend) is associated with storing the result of the AND operation in the memory cells that store Current_Dividend 488. That is, the value of Comp_Comp 431 (e.g., a bit-vector [00008888]) can be stored in (e.g., copied to) the memory cells that store the Current_Dividend 488. As described further below, the bit-vector stored in the compute components corresponding to Comp_Comp 431 can be copied to a group of memory cells coupled to a selected row and to sense lines coupled to the corresponding compute components, for instance, by enabling (e.g., activating) the selected row such that the values stored in the compute components are copied (e.g., transferred) to the respective corresponding memory cells of the group coupled to the selected row.

The pseudocode referenced at reference number 7f (e.g., Shift Right from current position to the beginning of Vector) is associated with performing a right SHIFT operation on Comp_Comp 431. The right SHIFT operation can shift the bits in Comp_Comp 431 a number of positions to the right (e.g., from a MSB to a LSB). The number of positions shifted can be equal to the element width minus E minus 1 (e.g., element width–E–1). In this example in which the element width is four and E is zero (e.g., for the first iteration of the FOR loop associated with reference number 7 and described in association with FIG. 4B), the number of positions that the bits are shifted is three (e.g., 4–0–1=3). Shifting each of the bits in bit-vector 431 (e.g., [00008888]) to the right by three bit positions results in bit-vector [00001111]. As such, row 7f of FIG. 4B illustrates Comp_Comp 431 as [00001111].

The pseudocode referenced at reference number 7g (e.g., Perform OR with Remainder) is associated with performing an OR operation on Comp_Comp 431 and Remainder 494 and storing the result in (e.g., the value remains in) Comp_Comp 431. Since Comp_Comp 431 is [00001111] and Remainder 494 is [00000000], row 7g of the table shown in FIG. 4B illustrates bit-vector 431 being [00001111] (e.g., the result of "ORing" [00000000] and [00001111]).

The pseudocode referenced at reference numbers 7h and 7i (e.g., Store in Current_Dividend and Store in Remainder) is associated with storing Comp_Comp 431 in the memory cells that store Current_Dividend 480 and the memory cells that store Remainder 494. That is, the value of Comp_Comp 431 can be copied to memory cells that store Current_Dividend 480 and to Remainder 494. As such, since the value of Comp_Comp 431 is [00001111], row 7h of FIG. 4B illustrates Current_Dividend 480 being [00001111] and row 7i of FIG. 4B illustrates Remainder 494 being [00001111].

The pseudocode referenced at reference number 7j (e.g., Horizontal compare Current_Dividend with Divisor get greater than mask in Current_Compare) is associated with performing a COMPARE operation. The COMPARE operation can include determining whether the elements of Current_Divident 480 are greater than or equal to the corresponding elements of Divisor 490. The result of the compare operation can be stored in the memory cells used to store Current_Compare 482 and can identify those elements in Curren_Dividend 480 that are greater than or equal to the corresponding elements of Divisor 490 and/or those elements of Current_Dividend 480 that are less than the corresponding elements of Divisor 490. As an example, a hexadecimal bit vector [0] (e.g., binary [0000]) can indicate that a particular element of Current Dividend 480 is less than the corresponding element of Divisor 490, and a hexadecimal bit-vector [F] (e.g., binary [1111]) can indicate that a particular element of Current_Dividend 480 is greater than or equal to Divisor 490. As shown in row 7j of FIG. 4B, Current_Dividend 480 is [00001111] and Divisor 490 is [33552233]. Therefore, since each of the elements of Divisor 490 is greater than the corresponding element of Current_Dividend 480 (e.g., 3>0, 3>0, 5>0, 5>0, 2>1, 2>1, 3>1, and 3>1), the resultant bit-vector of the COMPARE operation is [00000000]. As such, row 7j of FIG. 4B indicates that Current_Compare 482 is [00000000]. In a number of examples, the COMPARE operation can include performing a number of operations. The number of operations that are associated with performing the COMPARE operation can be performed using the sensing circuitry (e.g., sense amplifiers 306 and/or the compute components 331 in FIG. 3). The number of operations that are associated with the COMPARE operation can be performed in parallel and without transferring data via an input/output (I/O) line. The number of operations can include a number of AND operations, OR operations, SHIFT operations, and INVERT operations.

The pseudocode referenced at reference number 7k (e.g., Shift right Dynamic_Mask by applying Current_Compare) is associated with performing a right SHIFT operation if E is greater than zero (e.g., E>0). As such, since E=0 in association with FIG. 4B, right SHIFT operation is not performed and Comp_Comp 431 remains [00000000] (e.g., as shown in row 7k of FIG. 4B).

As described below in association with FIGS. 4C to 4E, the number of times the right SHIFT operation is performed is based on E (e.g., if E=1, the right SHIFT is performed once, if E=2, the right SHIFT is performed twice, etc). The right SHIFT operation includes storing the Dynamic_Mask 476 in the compute components corresponding to Comp_Comp 431, and performing a right SHIFT operation on particular elements of Comp_Comp 431 as identified by Current_Compare 482, which is used as a mask. That is, as described further below, Current_Compare 482 can indicate which of the elements of Comp_Comp 431 are to be shifted.

The pseudocode referenced at reference number 7l (e.g., Load inverse of Current_Compare into Comp_Comp) is associated with storing Current_Compare 482 in the compute components corresponding to Comp_Comp 431 and performing an INVERT operation on Comp_Comp 431 such that Comp_Comp 431 stores the inverse of Current_Compare 482 after the INVERT operation. As such, since Current_Compare 482 has a value of [00000000], row 7l of FIG. 4B illustrates Comp_Comp 431 as [FFFFFFFF] (e.g., the inverse of [00000000]).

The pseudocode referenced at reference number 7m (e.g., Perform AND operation with Remainder) is associated with performing an AND operation. The AND operation can be performed on Comp_Comp 431 and Remainder 494, and the result can be stored in Comp_Comp 431. As shown in row 7m of FIG. 4B, Comp_Comp 431 is [00001111], which is the result of ANDing [FFFFFFFF](e.g., the value of Comp_Comp 431 prior to the AND) and [00001111] (e.g., the value of Remainder 494 prior to the AND).

The pseudocode referenced at reference number 7n (e.g., Store in Row_Current_Dividend) is associated with storing the result of the AND operation associated with reference number 7m in the memory cells that store Current_Dividend 480. As such, row 7n in FIG. 4B illustrates Current_Dividend 480 as [00001111]. The pseudocode referenced at reference number 7o (e.g., Using Current_Compare 482 mask get difference from Remainder and Divisor into Current_Dividend) is associated with performing a SUBTRACTION operation and storing the result as Current_Dividend 480. A SUBTRACTION operation can include subtracting selected elements in Divisor 490 from corresponding elements in Remainder 494. The elements from Divisor 490 that are subtracted from corresponding elements in Remainder 494 can be selected based on Current_Compare 482. That is, Current_Compare 482 can be used as a mask to determine which of the elements are to be subtracted. As such, Current_Compare 482 can identify those elements in Divisor 490 that are to be subtracted from the corresponding elements of Remainder 494. As an example, a hexadecimal bit vector [0] (e.g., binary [0000]) can indicate that a particular element of Divisor 490 is not to be subtracted from the corresponding element of Remainder 494, and a hexadecimal bit-vector [F] (e.g., binary [1111]) can indicate that a particular element of Divisor 490 is to be subtracted from the corresponding element of Remainder 494. As shown in row 7o of FIG. 4B, Current_Compare 482 is a bit-vector [00000000], which indicates that zero (e.g., none) of the eight elements of Divisor 490 (e.g., [33552233]) are to be subtracted from the corresponding eight elements of Remainder 494 (e.g., [00001111]). As such, row 7o also indicates the value of Current_Dividend is [00001111], which is the same as the value of Remainder 494 (e.g., since the result of the SUBTRACTION operation is stored in Current_Dividend 480 and the result of the SUBTRACTION operation leaves Remainder 494 unchanged). However, if the Current_Compare 482 were a bit-vector [0000000F], then the SUBTRACTION operation would subtract the eighth element in Divisor 490 from the eighth element in Remainder 494.

In a number of examples, the SUBTRACTION operation can include performing a number of operations. The number of operations that are associated with performing the SUBTRACTION operation can be performed using the sensing circuitry (e.g., a sense amplifiers 306 and/or the compute components 331 in FIG. 3). The number of operations that are associated with the SUBTRACTION operation can be performed without transferring data via an input/output (I/O) line. The number of operations can include a number of AND operations, OR operations, SHIFT operations, and INVERT operations. The number of operations that are associated with the SUBTRACTION operation can include performing a number of SUBTRACTION operations in parallel. Examples of performing the SUBTRACTION operation are given below in association with FIGS. 4C to 4F.

The pseudocode referenced at reference number 7p (e.g., Load Quotient in Comp_Comp) is associated with storing Quotient 492 in the sensing circuitry. As such, the value of Quotient 492 (e.g., [00000000]) is copied to Comp_Comp 431 (e.g., as shown in row 7p of FIG. 4B). The pseudocode referenced at reference number 7q (e.g., Shift left, store in Quotient) is associated with performing a left SHIFT operation on Comp_Comp 431. The result of the left SHIFT operation can be stored in the memory cells that store Quotient 492. In this example, shifting Comp_Comp 431 (e.g., [00000000]) left results in bit-vector [00000000]

The pseudocode referenced at reference number 7r (e.g., Using Current_Compare mask add to Quotient a true bit at the end of each fixed Vector) is associated with performing an ADDITION operation. The ADDITION operation can increment a number of selected elements from Quotient 492. The number of elements from Quotient 492 can be selected based on Current_Compare 482 (e.g., Current_Compare 482 can be used as a mask that identifies which elements are to be incremented). In the first iteration (e.g., E=0) of the loop associated with reference number 7, Current_Compare 482 is [00000000] (e.g., as shown in row 7r of FIG. 4B). As such, the mask provided by Current_Compare 482 indicates that no elements from Quotient 492 are selected. Therefore, Quotient 492 is unchanged in this example (e.g., row 7r illustrates Quotient 492 as [00000000]). As an example, Current_Compare 482 being [ff000000] could indicate that a first element and a second element from Quotient 492 are selected, which would result in the first element and the second element of Quotient 492 being incremented by one.

In a number of examples, the ADDITION operation can include performing a number of operations. The number of operations that are associated with performing the ADDITION operation can be performed using the sensing circuitry (e.g., a sense amplifiers 306 and/or the compute components 331 in FIG. 3). The number of operations that are associated with the ADDITION operation can be performed without transferring data via an input/output (I/O) line. The number of operations can include a number of AND operations, OR operations, SHIFT operations, and INVERT operations. The number of operations that are associated with the ADDITION operation can include performing a number of ADDITION operations in parallel. Further examples of implementing the ADDITION operation are given below in association with FIGS. 4C to 4F.

The pseudocode referenced at reference number 7s (e.g., Load Current_Dividend in Comp_Comp) is associated with storing Current_Dividend 480 in the sensing circuitry (e.g., in the compute components corresponding to Comp_Comp 431 and/or in sense amplifiers corresponding thereto). As such, row 7s of FIG. 4B illustrates the value of Current_Dividend 480 (e.g., [00001111]) being stored in Comp_Comp 431. The pseudocode referenced at reference number 7t (e.g., Shift Left) is associated with performing a left SHIFT operation on Comp_Comp 431. In this example, the value of Comp_Comp 431 is [00001111] prior to the left SHIFT. As such, row 7t of FIG. 4B illustrates the value of Comp_Comp as [00002222] after the left SHIFT. The pseudocode referenced at reference number 7u (e.g., Store Comp_Comp in Current_Dividend and Remainder) is associated with storing the result of the left SHIFT operation in the memory cells that store Current_Dividend 480, the memory cells that store Remainder 494, and in the sensing circuitry. In this example, Comp_Comp is [00002222] after the left SHIFT, and this value is copied to Current_Dividend 480 and Remainder 494 (e.g., as shown in row 7u of FIG. 4B).

The pseudocode referenced at reference number 7v (e.g., Load Dynamic_Mask in Comp_Comp) is associated with storing Dynamic_Mask 476 in the sensing circuitry. For instance, the value of Dynamic_Mask 476 can be copied to Comp_Comp 431. As such, row 7v of FIG. 4B illustrates the value of Dynamic_Mask 476 (e.g., [88888888] being stored in Comp_Comp 431.

The pseudocode referenced at reference number 7w (e.g., Shift Comp_Comp right applying mask in Current_Compare) is associated with performing a right SHIFT operation on Comp_Comp 431, storing the result of the right SHIFT operation in Comp_Comp 431, performing an AND operation on Comp_Comp 431 and Current_Compare 482, storing the result of the AND operation in Comp_Comp 431 and in the memory cells that store Current_Dividend 480. In the operations performed in reference number 7w, Current_Compare 431 is used as a mask to identify the elements that will be right shifted. Current_Compare 482 is then stored in (e.g., copied to) Comp_Comp 431, an INVERT operation is performed on Comp_Comp 431 (e.g., such that Comp_Comp 431 stores the inverted value of Current_Compare 482), an AND operation is performed on the result of the INVERT operation and Dynamic_Mask 476 (e.g., Comp_Comp 431 is ANDed with Dynamic_Mask 476), an OR operation is performed on the result of the AND operation and Current_Dividend 480 (e.g., Comp_Comp 431 is ORed with Current_Dividend 480), and the result of the OR operation is stored in Comp_Comp 431.

For example, the right SHIFT operation is performed on Comp_Comp 431 (e.g., a bit-vector [88888888]), the result [44444444] is stored in Comp_Comp 431. The AND operation is performed on [44444444] (e.g., Comp_Comp 431 and [00000000] (e.g., Current_Compare 482) and the result [00000000] is stored in the sensing circuitry and the memory cells that store Current_Dividend 480. In this example, the Current_Compare 482 is [00000000] and as such no elements are right shifted. A bit-vector [00000000] is stored in the sensing circuitry, an INVERT operation is performed on [00000000] (e.g., Comp_Comp 431), an AND operation is performed on the result [ffffffff] of the INVERT operation and on [88888888] (e.g., Dynamic_Mask 476). An OR operation is performed on [88888888] (e.g., the result of the AND operation) and [00000000] (e.g., Current_Dividend 480) and the result [88888888] is stored in the sensing circuitry.

The pseudocode referenced at reference number 7x (e.g., Store Comp_Comp in Dynamic_Mask) is associated with storing the result of the OR operation in the memory cells that store Dynamic_Mask 476. That is, Comp_Comp 431 is stored in the memory cells that store Dynamic_Mask 476. Therefore, as shown in row 7x of FIG. 4B, Dynamic_Mask 476 is [88888888].

FIG. 4C illustrates a table showing the values of the number of bit-vectors (e.g., 431, 476, 478, 480, 482, 488, 490, 492, and 494) associated with performing a number of operations associated with a second iteration of the FOR loop associated with reference number 7. As such, FIG. 4C is described with respect to a second iteration (e.g., E=1) corresponding to reference numbers 7a-7x.

Row 7a of FIG. 4C illustrates the result of storing the Dynamic_Mask 476 (e.g., a bit-vector [88888888]) in the compute components (e.g., compute components 331 in FIG. 3) corresponding to Comp_Comp 431. As such, Comp_Comp is [88888888] in row 7a. Row 7b of FIG. 4C illustrates the value of Current_Dividend 480 (e.g., [88888888]) after the value of Comp_Comp 431 is copied thereto.

Reference number 7c is associated with performing a loop based on E being equal to 1. The pseudocode referenced at reference number 7c can include storing the bit-vector [CCCCCCCC] in the memory cells that store Current_Dividend 480.

Row 7d of FIG. 4C illustrates the result of performing an AND operation on Comp_Comp 431 (e.g., a bit-vector [CCCCCCCC]) and Dividend 488 (e.g., a bit-vector [774488CC]). As such, Comp_Comp 431 is [444488CC] in row 7d. Row 7e of FIG. 4C illustrates storing the result (e.g., a bit-vector [444488CC]) of the AND operation in the memory cells that store Current_Dividend 488.

Row 7f of FIG. 4C illustrates the result of performing a right SHIFT operation on Comp_Comp 431 (e.g., a bit-vector [444488cc]). As such, Comp_Comp is [11112233] in row 7f.

Row 7g of FIG. 4C illustrates the result of performing an OR operation on Comp_Comp 431 (e.g., a bit-vector [11112233]) and Remainder 494 (e.g., a bit-vector [00002222]). As such, Comp_Comp is [11112233] in row 7g. Rows 7h to 7i of FIG. 4C illustrate storing Comp_Comp 431 (e.g., a bit-vector [11112233]) in the memory cells that store Current_Dividend 480 and the memory cells that store Remainder 494.

Row 7j of FIG. 4C illustrates the result of performing a COMPARE operation on Current_Dividend 480 (e.g., a bit-vector [11112233]) and Divisor 490 (e.g., a bit-vector [33552233]). As such, Current_Compare 482 is [0000FFFF] in row 7j.

Row 7k of FIG. 4C illustrates the result of performing a right SHIFT operation based on E being greater than zero during a second iteration of the loop structure associated with reference number 7. That is, Dynamic_Mask 476 (e.g., a bit-vector [88888888]) is stored in the sensing circuitry, a right SHIFT operation is performed on Comp_Comp 431 (e.g., a bit-vector [88888888]) based on Current_Compare 482, and Comp_Comp 431 is stored in the memory cells that store Dynamic_Mask 476. Performing a right SHIFT operation on Comp_Comp 431 (e.g., a bit-vector [88888888]) based on Current_Compare 482 includes using Current_Compare 482 (e.g., a bit-vector [0000FFFF]) as a mask to identify elements from Comp_Comp 431. In this example, the mask provided by Current_Compare 482 indicates (e.g., via hexadecimal [F]) that the fifth, sixth, seventh, and eighth elements in Comp_Comp 431 are to be shifted Right. Since the number of times the right SHIFT operation is performed is based on E, in this case, the right SHIFT is performed once (e.g., E=1). As such, the identified elements of Comp_Comp 431 are shifted right one bit position, and the result (e.g., a bit-vector [88884444]) is stored in memory cells that store Dynamic_Mask 476 (e.g., as shown in row 7k of FIG. 4C.

Row 7l of FIG. 4C illustrates the result of storing Current_Compare 482 (e.g., a bit-vector [0000FFFF]) in the sensing circuitry and performing an INVERT operation on Comp_Comp 431 (e.g., a bit-vector [0000FFFF]). As such, Comp_Comp 431 is [FFFF0000] in row 7l.

Row 7m of FIG. 4C illustrates the result of performing an AND operation on Comp_Comp 431 (e.g., a bit-vector [FFFF0000]) and Remainder 494 (e.g., a bit-vector [11112233]). As such, Comp_Comp 431 is [11110000] in row 7m.

Row 7n of FIG. 4C illustrates the result of storing the result (e.g., a bit-vector [11110000]) of the AND operation associated with reference number 7m in the memory cells that store Current_Dividend 480. As such, Current_Dividend 480 is [11110000] in row 7n.

Row 7o of FIG. 4C illustrates the result of performing a SUBTRACTION operation. In the example given in FIG. 4C, Current_Compare 482 is a bit-vector [0000FFFF] which indicates that the fifth, sixth, seventh, and eighth elements (e.g., a bit-vector [2233]) from Divisor 490 are subtracted from the associated elements (e.g., a bit-vector [2233]) in Remainder 494. The result (e.g., a bit-vector [11110000]) of the SUBTRACTION operation is stored in the memory cells that store Current_Dividend 480. As such, Current_Dividend 480 is [11110000] in row 7o.

Row 7p of FIG. 4C illustrates the result of storing Quotient 492 (e.g., a bit-vector [00000000]) in the sensing circuitry. As such, Comp_Comp 431 is [00000000] in row 7p.

Row 7q of FIG. 4C illustrates the result of performing a left SHIFT operation on Comp_Comp 431 (e.g., a bit-vector [00000000]). As such, Quotient 492 is [00000000] in row 7q.

Row 7r of FIG. 4C illustrates the result of performing an ADDITION operation. The ADDITION operation increments a number of elements from Quotient 492. The number of elements from Quotient 492 can be selected based on Current_Compare 482. Current_Compare 482 is equal to a bit-vector [0000FFFF] in the second iteration of a loop structure associated with reference number 7. The fifth, sixth, seventh, and eighth elements from Quotient 492 are selected based on Current_Compare 482. The ADDITION operation increments the fifth, sixth, seventh, and eighth, elements from Quotient 492 by one. As such, Quotient 492 is [00001111] in row 7r.

Row 7s of FIG. 4C illustrates the result of storing Current_Dividend 480 (e.g., a bit-vector [11110000]) in the sensing circuitry. As such, Comp_Comp 431 is [11110000] in row 7s.

Row 7t of FIG. 4C illustrates the result of performing a left SHIFT operation on Comp_Comp 431 (e.g., a bit-vector [11110000]). As such, Comp_Comp 431 is [22220000] in row 7t.

Row 7u of FIG. 4C illustrates the result of storing the result (e.g., a bit-vector [22220000]) of the left SHIFT operation in the memory cells that store Current_Dividend 480, the memory cells that store Remainder 494, and the sensing circuitry. As such, Current_Dividend 480, Remainder 494, and Comp_Comp 431 are [22220000] in row 7u.

Row 7v of FIG. 4C illustrates the result of storing Dynamic_Mask 476 (e.g., a bit-vector [88884444]) in the sensing circuitry. As such, Comp_Comp 431 is [88884444] in row 7v.

Row 7w of FIG. 4C illustrates the result of performing a right SHIFT operation on Comp_Comp 431 (e.g., a bit-vector [88884444]). The result (e.g., a bit-vector [44442222]) of the right SHIFT operation is stored in Comp_Comp 431. An AND operation is performed on Comp_Comp 431 (e.g., a bit-vector [44442222]) and Current_Compare 482 (e.g., a bit-vector [0000ffff]). The result (e.g., a bit-vector [00002222]) of the AND operation is stored in the sensing circuitry and the memory cells that store Current_Dividend 480. Current_Compare 482 (e.g., a bit-vector [0000ffff]) is stored in the sensing circuitry. An INVERT operation is performed on Comp_Comp 431 (e.g., a bit-vector [0000ffff]). An AND operation is performed on the result (e.g., a bit-vector [ffff0000]) of the INVERT operation and Dynamic_Mask 476 (e.g., a bit-vector [88884444]). An OR operation is performed on the result (e.g., a bit-vector [88880000]) of the AND operation and Current_Dividend 480 (e.g., a bit-vector [00002222]). The result (e.g., a bit-vector [88882222]) of the OR operation is stored in the sensing circuitry. As such, Comp_Comp 431 is [88882222] in row 7w.

Row 7x of FIG. 4C illustrates the result of storing the result of the OR operation in the memory cells that store Dynamic_Mask 476. As such, Dynamic_Mask 476 is [88882222] in row 7x.

FIG. 4D illustrates a table showing the values of the number of bit-vectors (e.g., 431, 476, 478, 480, 482, 488, 490, 492, and 494) associated with performing a number of operations associated with a second iteration of the FOR loop associated with reference number 7. As such, FIG. 4D is described with respect to a second iteration (e.g., E=2) corresponding to reference numbers 7a-7x.

Row 7a of FIG. 4D illustrates the result of storing Dynamic_Mask 476 (e.g., a bit-vector [88882222]) in the compute components 331 in FIG. 3. As such, Comp_Comp 431 is [88882222] in row 7a.

Row 7b of FIG. 4D illustrates the result of storing Comp_Comp 431 in the memory cells that store Current_Dividend 480. As such, Current_Dividend 480 is [88882222] in row 7b.

Row 7c of FIG. 4D illustrates the result of performing a loop that performs E iterations. That is, the loop associated with reference number 7c will perform two iterations of the loop based on E being equal to 2. Each iteration of the loop reference in reference number 7c performs a number of operations. The pseudocode referenced at reference number 7c can include storing the bit-vector [EEEE3333] in the memory cells that store Current_Dividend 480. As such, Current_Dividend 480 is [EEEE3333] in row 7c.

Row 7d of FIG. 4D illustrates the result of performing an AND operation on Comp_Comp 431 (e.g., a bit-vector [eeee3333]) and Dividend 488 (e.g., a bit-vector [774488cc]). As such, Comp_Comp 431 is [66440000] in row 7d.

Row 7e of FIG. 4D illustrates the result of storing Comp_Comp 431 (e.g., a bit-vector [66440000]) in the memory cells that store the Current_Dividend 488. As such, Current_Dividend 488 is [66440000] in row 7e.

Row 7f of FIG. 4D illustrates the result of performing a right SHIFT operation on Comp_Comp 431 (e.g., a bit-vector [66440000]). The right SHIFT operation can shift the bits in Comp_Comp 431 a number of positions. The number of positions can be equal to the element width minus E minus 1 (e.g., element width–E–1). For example, the number of positions can be equal to one during a third iteration of the loop structure associated with reference number 7. The result (e.g., a bit-vector [33220000]) of the right SHIFT operation is stored in the sensing circuitry. As such, Comp_Comp 431 is [33220000] in row 7f.

Row 7g of FIG. 4D illustrates the result of performing an OR operation on Comp_Comp 431 (e.g., a bit-vector [33220000]) and Remainder 494 (e.g., a bit-vector [22220000]). As such, Comp_Comp 431 is [33220000] in row 7g.

Rows 7h to 7i of FIG. 4D illustrate the result of storing Comp_Comp 431 (e.g., a bit-vector [33220000]) in the memory cells that store Current_Dividend 480 and the memory cells that store Remainder 494. As such, Remainder 494 is [33220000] in row 7g.

Row 7j of FIG. 4D illustrates the result of performing a COMPARE operation. The COMPARE operation compares Current_Dividend 480 (e.g., a bit-vector [33220000]) with Divisor 490 (e.g., a bit-vector [33552233]). As such, Current_Compare 482 is [FF000000] in row 7j.

Row 7k of FIG. 4B illustrates the result of performing a right SHIFT operation based on E being greater than zero during a third iteration of the loop structure associated with reference number 7. That is, Dynamic_Mask 476 (e.g., a bit-vector [88882222]) is stored in the sensing circuitry, a right SHIFT operation is performed on Comp_Comp 431 (e.g., a bit-vector [88882222]) based on Current_Compare 482, and Comp_Comp 431 is stored in the memory cells that store Dynamic_Mask 476. Performing a right SHIFT operation on Comp_Comp 431 (e.g., a bit-vector [88882222]) based on Current_Compare 482 includes using Current_Compare 482 (e.g., a bit-vector [ff000000]) as a mask to identify elements from Comp_Comp 431. Current_Compare 482 can be used to identify the first element and the second element in Comp_Comp 431. The right SHIFT operation can be performed on the identified elements from Comp_Comp 431. The right SHIFT operation can be performed on identified elements a number of times. The iterations of the right SHIFT operation can be based on E. That is, a right SHIFT operation can be performed on the identified elements due to E being equal to two. As such, Dynamic_Mask 4769 is [22882222] in row 7k.

Row 7l of FIG. 4D illustrates the result of storing Current_Compare 482 (e.g., a bit-vector [FF000000]) in the sensing circuitry and performing an INVERT operation on Comp_Comp 431 (e.g., a bit-vector [FF000000]). As such, Comp_Comp 431 is [00FFFFFF] in row 7l.

Row 7m of FIG. 4D illustrates the result of performing an AND operation. The AND operation can be performed on Comp_Comp 431 (e.g., a bit-vector [00FFFFFF]) and Remainder 494 (e.g., a bit-vector [33220000]). As such, Comp_Comp 431 is [00220000] in row 7m.

Row 7n of FIG. 4D illustrates the result of storing the result (e.g., a bit-vector [00220000]) of the AND operation in the memory cells that store Current_Dividend 480. As such, Current_Dividend 480 is [00220000] in row 7n.

Row 7o of FIG. 4D illustrates the result of performing a SUBTRACTION operation. Current_Compare 482 is a bit-vector [ff000000] which indicates that the first and second elements (e.g., a bit-vector [33]) from Divisor 490 are subtracted from the associated elements (e.g., a bit-vector [33]) in Remainder 494. As such, Current_Dividend 480 is [00220000] in row 7o.

Row 7p of FIG. 4D illustrates the result of storing Quotient 492 (e.g., a bit-vector [00001111]) in the sensing circuitry. As such, Comp_Comp 431 is [00001111] in row 7p.

Row 7q of FIG. 4D illustrates the result of performing a left SHIFT operation on Comp_Comp 431 (e.g., a bit-vector [00001111]). As such, Quotient 492 is [00002222] in row 7q.

Row 7r of FIG. 4D illustrates the result of performing an ADDITION operation. The ADDITION operation can increment a number of elements from Quotient 492. The number of elements from Quotient 492 can be selected based on Current_Compare 482. In the third iteration of a loop structure associated with reference number 7 Current_Compare 482 is equal to a bit-vector [FF000000]. The first and second elements from Quotient 492 are selected based on Current_Compare 482. The ADDITION operation increments the first and second elements from Quotient 492 by one. As such, Quotient 492 is [11002222] in row 7r.

Row 7s of FIG. 4D illustrates the result of storing Current_Dividend 480 (e.g., a bit-vector [00220000]) in sensing circuitry. As such, Comp_Comp 431 is [00220000] in row 7s.

Row 7t of FIG. 4D illustrates the result of performing a left SHIFT operation on Comp_Comp 431 (e.g., a bit-vector [00220000]). As such, Comp_Comp 431 is [00440000] in row 7t. Row 7u of FIG. 4D illustrates the result of storing the result (e.g., a bit-vector [00440000]) of the left SHIFT operation in the memory cells that store Current_Dividend 480, the memory cells that store Remainder 494, and the sensing circuitry. As such, Comp_Comp 431, Current_Dividend 480, and Remainder 494 are [00440000] in row 7u.

Row 7v of FIG. 4D illustrates the result of storing Dynamic_Mask 476 (e.g., a bit-vector [22882222]) in the sensing circuitry. As such, Comp_Comp 431 is [22882222] in row 7v.

Row 7w of FIG. 4D illustrates the result of performing a right SHIFT operation on Comp_Comp 431 (e.g., a bit-vector [22884444]). The result (e.g., a bit-vector [11441111]) of the right SHIFT operation is stored in Comp_Comp 431. An AND operation is performed on Comp_Comp 431 (e.g., a bit-vector [11441111]) and Current_Compare 482 (e.g., a bit-vector [ff000000]). The result (e.g., a bit-vector [11000000]) of the AND operation is stored in the sensing circuitry and the memory cells that store Current_Dividend 480. Current_Compare 482 (e.g., a bit-vector [ff000000]) is stored in the sensing circuitry. An INVERT operation is performed on Comp_Comp 431 (e.g., a bit-vector [00ffffff]). An AND operation is performed on the result (e.g., a bit-vector [00ffffff]) of the INVERT operation and Dynamic_Mask 476 (e.g., a bit-vector [22882222]). An OR operation is performed on the result (e.g., a bit-vector [00882222]) of the AND operation and Current_Dividend 480 (e.g., a bit-vector [11000000]). The result (e.g., a bit-vector [11882222]) of the OR operation is stored in the sensing circuitry. As such, Comp_Comp 431 is [11882222] in row 7w.

Row 7x of FIG. 4D illustrates the result of storing the result of the OR operation in the memory cells that store Dynamic_Mask 476. As such, Dynamic_Mask 476 is [11882222] in row 7x.

FIG. 4E illustrates a table showing the values of the number of bit-vectors (e.g., 431, 476, 478, 480, 482, 488, 490, 492, and 494) associated with performing a number of operations associated with a third iteration of the FOR loop associated with reference number 7. As such, FIG. 4E is described with respect to a second iteration (e.g., E=3) corresponding to reference numbers 7a-7x.

Row 7a of FIG. 4E illustrates the result of storing the Dynamic_Mask 476 (e.g., a bit-vector [11882222]) in the compute component 331 in FIG. 3. As such, Dynamic_Mask 476 is [11882222] in row 7a.

Row 7b of FIG. 4E illustrates the result of storing Comp_Comp 431 in the memory cells that store Current_Dividend 480. As such, Current_Dividend 480 is [11882222] in row 7b.

Row 7c of FIG. 4E illustrates the result of performing a loop that performs E iterations. That is, the loop associated with reference number 7c will perform three iterations of the loop based on E being equal to 3. Each iteration of the loop reference in reference number 7c performs a number of operations. The pseudocode referenced at reference number 7c can include storing the bit-vector [11FF3333] in the memory cells that store Current_Dividend 480. As such, Current_Dividend 480 is [11FF3333] in row 7c.

Row 7d of FIG. 4E illustrates the result of performing an AND operation on Comp_Comp 431 (e.g., a bit-vector [11FF3333]) and Dividend 488 (e.g., a bit-vector [774488cc]). As such, Comp_Comp 431 is [11440000] in row 7d. Row 7e of FIG. 4E illustrates the result of storing the result of the AND operation in the memory cells that store Current_Dividend 488. As such, Current_Dividend 488 is [11440000] in row 7e.

Row 7f of FIG. 4E illustrates the result of performing a right SHIFT operation on Comp_Comp 431 (e.g., a bit-vector [11440000]). The right SHIFT operation can shift the bits in Comp_Comp 431 a number of positions. The number of positions can be equal to the element width minus E minus 1 (e.g., element width−E−1). The number of positions can be equal to zero during the fourth iteration of the loop structure associated with reference number 7. The result (e.g., a bit-vector [11440000]) of the right SHIFT operation is stored in the sensing circuitry. As such, Comp_Comp 431 is [11440000] in row 7f.

Row 7g of FIG. 4E illustrates the result of performing an OR operation on Comp_Comp 431 (e.g., a bit-vector [11440000]) and Remainder 494 (e.g., a bit-vector [00440000]). As such, Comp_Comp 431 is [11440000] in row 7g.

Rows 7h to 7i of FIG. 4E illustrate the result of storing Comp_Comp 431 (e.g., a bit-vector [11440000]) in the memory cells that store Current_Dividend 480 and the memory cells that store Remainder 494. As such, Current_Dividend 480 and Remainder 494 are [11440000] in rows 7h to 7i.

Row 7j of FIG. 4E illustrates the result of performing a COMPARE operation. The COMPARE operation compares Current_Dividend 480 (e.g., a bit-vector [11440000]) with Divisor 490 (e.g., a bit-vector [33552233]). The results (e.g., a bit-vector [00000000]) of the COMPARE operation can be stored in the memory cells that store Current_Compare 482. As such, Current_Compare 482 is [00000000] in row 7j.

Row 7k of FIG. 4E illustrates the result of performing a right SHIFT operation based on E being greater than zero during a fourth iteration of the loop structure associated with reference number 7. That is, Dynamic_Mask 476 (e.g., a bit-vector [11882222]) is stored in the sensing circuitry, a right SHIFT operation is performed on Comp_Comp 431 (e.g., a bit-vector [11882222]) based on Current_Compare 482, and Comp_Comp 431 is stored in the memory cells that store Dynamic_Mask 476. Performing a right SHIFT operation on Comp_Comp 431 (e.g., a bit-vector [11882222]) based on Current_Compare 482 includes using Current_Compare 482 (e.g., a bit-vector [00000000]) as a mask to identify elements from Comp_Comp 431. No elements are identified due to Current_Compare 482 having a value equal to a bit-vector [00000000]. The result (e.g., a bit-vector [11882222]) of the iterations of the right SHIFT operation can be stored in memory cells that store Dynamic_Mask 476. As such, Dynamic_Mask 476 is [11882222] in row 7k.

Row 7l of FIG. 4E illustrates the result of storing Current_Compare 482 (e.g., a bit-vector [00000000]) in the sensing circuitry and performing an INVERT operation on Comp_Comp 431 (e.g., a bit-vector [00000000]). As such, Comp_Comp 431 is [FFFFFFFF] in row 7l.

Row 7m of FIG. 4E illustrates the result of performing an AND operation. The AND operation is performed on Comp_Comp 431 (e.g., a bit-vector [FFFFFFFF]) and Remainder 494 (e.g., a bit-vector [11440000]). As such, Comp_Comp 431 is [11440000] in row 7m. Row 7n of FIG. 4E illustrates the result of storing the result (e.g., a bit-vector [11440000]) of the AND operation in the memory cells that store Current_Dividend 480. As such, Current_Dividend 480 is [11440000] in row 7n.

Row 7o of FIG. 4E illustrates the result of performing a SUBTRACTION operation. Current_Compare 482 is a bit-vector [00000000] which indicates that no elements are subtracted from Remainder 494. As such, Current_Dividend 480 is [11440000] in row 7o.

Row 7p of FIG. 4E illustrates the result of storing Quotient 492 (e.g., a bit-vector [11002222]) in the sensing circuitry. As such, Comp_Comp 431 is [11002222] in row 7p.

Row 7q of FIG. 4E illustrates the result of performing a left SHIFT operation on Comp_Comp 431 (e.g., a bit-vector [11002222]). As such, Quotient 492 is [22004444] in row 7q.

Row 7r of FIG. 4E illustrates the result of performing an ADDITION operation. The ADDITION operation can increment a number of elements from Quotient 492. The number of elements from Quotient 492 can be selected based on Current_Compare 482. Current_Compare 482 is equal to a bit-vector [00000000] in the fourth iteration of a loop structure associated with reference number 7. No elements are selected based on Current_Compare 482. As such, Quotient 492 is [22004444] in row 7r.

Row 7s of FIG. 4E illustrates the result of storing Current_Dividend 480 (e.g., a bit-vector [11440000]) in sensing circuitry. As such, Comp_Comp 431 is [11440000] in row 7s.

Row 7t of FIG. 4E illustrates the result of performing a left SHIFT operation on Comp_Comp 431 (e.g., a bit-vector [11440000]). As such, Comp_Comp 431 is [22880000] in row 7t.

Row 7u of FIG. 4E illustrates the result of storing the result (e.g., a bit-vector [22880000]) of the left SHIFT operation in the memory cells that store Current_Dividend 480, the memory cells that store Remainder 494, and the sensing circuitry. As such, Current_Dividend 480, Remainder 494, and Comp_Comp is [22880000] in row 7u.

Row 7v of FIG. 4E illustrates the result of storing Dynamic_Mask 476 (e.g., a bit-vector [11882222]) in the sensing circuitry. As such, Comp_Comp 431 is [11882222] in row 7v.

Row 7w of FIG. 4E illustrates the result of performing a right SHIFT operation on Comp_Comp 431 (e.g., a bit-vector [11884444]). The result (e.g., a bit-vector [00442222]) of the right SHIFT operation is stored in Comp_Comp 431. An AND operation is performed on Comp_Comp 431 (e.g., a bit-vector [00442222]) and Current_Compare 482 (e.g., a bit-vector [00000000]). The result (e.g., a bit-vector [00000000]) of the AND operation is stored in the sensing circuitry and the memory cells that store Current_Dividend 480. Current_Compare 482 (e.g., a bit-vector [00000000]) is stored in the sensing circuitry. An INVERT operation is performed on Comp_Comp 431 (e.g., a bit-vector [FFFFFFFF]). An AND operation is performed on the result (e.g., a bit-vector [FFFFFFFF]) of the INVERT operation and Dynamic_Mask 476 (e.g., a bit-vector [11882222]). An OR operation is performed on the result (e.g., a bit-vector [11882222]) of the AND operation and Current_Dividend 480 (e.g., a bit-vector [00000000]). As such, Comp_Comp 431 is [11882222] in row 7w.

Row 7x of FIG. 4E illustrates the result of storing the result of the OR operation in the memory cells that store Dynamic_Mask 476. As such, Dynamic_Mask 476 is [11882222] in row 7x.

FIG. 4F illustrates a table showing the values of the number of bit-vectors (e.g., 431, 476, 478, 480, 482, 488, 490, 492, and 494) associated with performing a number of operations associated with reference number 8. Row 8 of FIG. 4F illustrates the result of performing a right SHIFT operation on Remainder 494 (e.g., a bit-vector [22880000]). As such, Remainder 494 is [11440000] in row 8.

Quotient 492 (e.g. a bit-vector [22004444]) and reminder 494 (e.g., a bit-vector [11440000]) are a result of a division operation that divides Dividend 488 (e.g., a bit-vector [774488cc]) by Divisor 490 (e.g., a bit-vector [33552233]). For example, the first element (e.g., a bit-vector [77]) from Dividend 488 (e.g., a bit-vector [774488cc]) divided by a first element (e.g., a bit-vector [33]) from Divisor 490 (e.g., a bit-vector [33552233]) is equal to a first element (e.g., a bit-vector [22]) from Quotient 492 (e.g., a bit-vector [22004444]) Remainder a first element (e.g., a bit-vector [11]) from Remainder 494 (e.g., a bit-vector [11440000]). Embodiments however, are not limited to the order of the sequence of instructions in the pseudocode in this example.

The functionality of the sensing circuitry 250 of FIG. 2A is described below and summarized in Table 1 below with respect to performing logical operations and initially storing a result in the sense amplifier 206. Initially storing the result of a particular logical operation in the primary latch of sense amplifier 206 can provide improved versatility as compared to previous approaches in which the result may initially reside in a secondary latch (e.g., accumulator) of a compute component 231, and then be subsequently transferred to the sense amplifier 206, for instance.

TABLE 1

| Operation | Accumulator | Sense Amp |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 206 (e.g., without having to perform an additional operation to move the result from the compute component 231 (e.g., accumulator) to the sense amplifier 206) is advantageous because, for instance, the result can be written to a row (of the array of memory cells) or back into the accumulator without performing a precharge cycle (e.g., on the complementary data lines 205-1 (D) and/or 205-2 (D_)).

Figure 5:
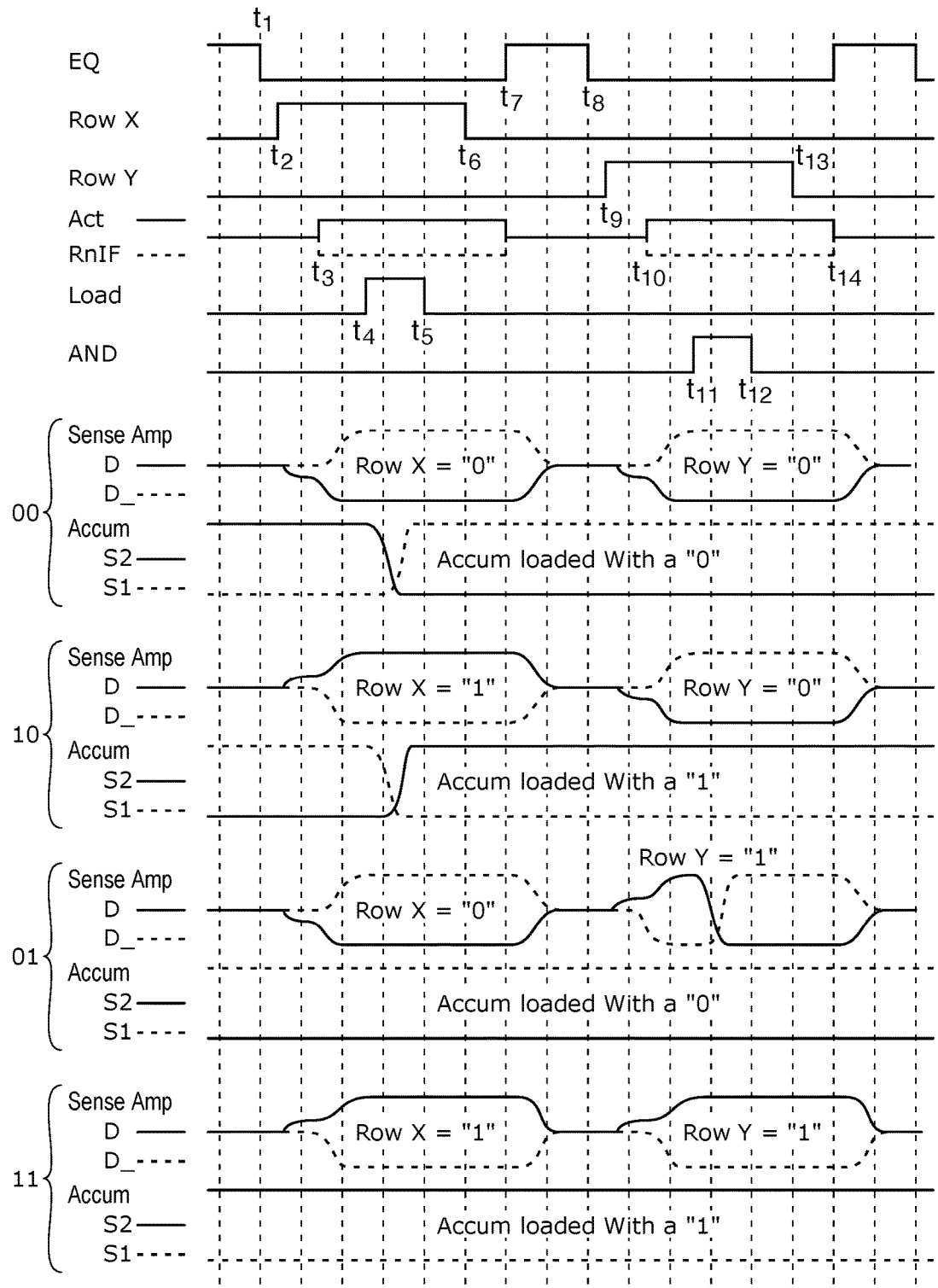
FIG. 5 illustrates a timing diagram associated with performing a number of logical operations using sensing circuitry in accordance with a number of embodiments of the present disclosure.

FIG. 5 illustrates a timing diagram associated with performing a number of logical operations using sensing circuitry in accordance with a number of embodiments of the present disclosure. FIG. 5 illustrates a timing diagram associated with initiating an AND logical operation on a first operand and a second operand. In this example, the first operand is stored in a memory cell coupled to a first access line (e.g., ROW X) and the second operand is stored in a memory cell coupled to a second access line (e.g., ROW Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 5 illustrates a number of control signals associated with operating sensing circuitry (e.g., 250) to perform the AND logical operation. "EQ" corresponds to an equilibrate signal applied to the sense amp 206, "ROW X" corresponds to an activation signal applied to access line 204-X, "ROW Y" corresponds to an activation signal applied to access line 204-Y, "Act" and "RnIF" correspond to a respective active positive and negative control signal applied to the sense amp 206, "LOAD" corresponds to a load control signal (e.g., LOAD/PASSD and LOAD/PASSDb shown in FIG. 2A), and "AND" corresponds to the AND control signal shown in FIG. 2A. FIG. 5 also illustrates the waveform diagrams showing the signals (e.g., voltage signals) on the digit lines D and D_ corresponding to sense amp 206 and on the nodes S1 and S2 corresponding to the compute component 231 (e.g., Accum) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 2A.

An example of pseudo code associated with loading (e.g., copying) a first data value stored in a cell coupled to row 204-X into the accumulator can be summarized as follows:
Copy Row X into the Accumulator:
 Deactivate EQ;
 Open Row X;
 Fire Sense Amps (after which Row X data resides in the sense amps)
 Activate LOAD (sense amplifier data (Row X) is transferred to nodes S1 and S2 of the Accumulator and resides there dynamically)
 Deactivate LOAD;
 Close Row X;
 Precharge;

In the pseudo code above, "Deactivate EQ" indicates that an equilibration signal (EQ signal shown in FIG. 5) corresponding to the sense amplifier 206 is disabled at $t_1$ as shown in FIG. 5 (e.g., such that the complementary data lines (e.g., 205-1 (D) and 205-2 (D_) are no longer shorted to $V_{DD}/2$). After equilibration is disabled, a selected row (e.g., ROW X) is enabled (e.g., selected, opened such as by activating a signal to select a particular row) as indicated by "Open Row X" in the pseudo code and shown at $t_2$ for signal Row X in FIG. 5. When the voltage signal applied to ROW X reaches the threshold voltage (Vt) of the access transistor (e.g., 202-2) corresponding to the selected cell, the access transistor turns on and couples the data line (e.g., 205-2 (D_)) to the selected cell (e.g., to capacitor 203-2) which creates a differential voltage signal between the data lines.

After Row X is enabled (e.g., activated), in the pseudo code above, "Fire Sense Amps" indicates that the sense amplifier 206 is enabled to set the primary latch and subsequently disabled. For example, as shown at $t_3$ in FIG. 5, the ACT positive control signal (e.g., 265 shown in FIG. 2B) goes high and the RnIF negative control signal (e.g., 228 shown in FIG. 2B) goes low, which amplifies the differential signal between 205-1 (D) and D_ 205-2, resulting in a voltage (e.g., $V_{DD}$) corresponding to a logic 1 or a voltage (e.g., GND) corresponding to a logic 0 being on data line 205-1 (D) (and the voltage corresponding to the other logic state being on complementary data line 205-2 (D_)). The sensed data value is stored in the primary latch of sense amplifier 206. The primary energy consumption occurs in charging the data lines (e.g., 205-1 (D) or 205-2 (D_)) from the equilibration voltage $V_{DD}/2$ to the rail voltage $V_{DD}$.

The four sets of possible sense amplifier and accumulator signals illustrated in FIG. 5 (e.g., one for each combination of Row X and Row Y data values) shows the behavior of signals on data lines D and D_. The Row X data value is stored in the primary latch of the sense amp. It should be noted that FIG. 2A shows that the memory cell including storage element 203-2 and access transistor 202-2, corresponding to Row X, is coupled to the complementary data line D_, while the memory cell including storage element 203-1 and access transistor 202-1, corresponding to Row Y, is coupled to data line D. However, as can be seen in FIG. 2A, the charge stored in the memory cell comprising access transistor 202-2 (corresponding to Row X) corresponding to a "0" data value causes the voltage on data line D_ (to which access transistor 202-2 is coupled) to go high and the charge stored in the memory cell comprising access transistor 202-2 corresponding to a "1" data value causes the voltage on data line D_ to go low, which is opposite correspondence between data states and charge stored in the memory cell comprising access transistor 202-1, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 5, causing load/pass transistors 218-1 and 218-2 to conduct. In this manner, activating the LOAD control signal enables the secondary latch in the accumulator of the compute component 231. The sensed data value stored in the sense amplifier 206 is transferred (e.g., copied) to the secondary latch. As shown for each of the four sets of possible sense amplifier and accumulator signals illustrated in FIG. 5, the behavior at inputs of the secondary latch of the accumulator indicates the secondary latch is loaded with the Row X data value. As shown in FIG. 5, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 205-1 (D) and 205-2 (D_), in the pseudo code above, "Deactivate LOAD" indicates that the LOAD control signal goes back low as shown at $t_5$ in FIG. 5 to cause the load/pass transistors 218-1 and 218-2 to stop conducting and thereby isolate the dynamic latch from the complementary data lines. However, the data value remains dynamically stored in secondary latch of the accumulator.

After storing the data value on the secondary latch, the selected row (e.g., ROW X) is disabled (e.g., deselected, closed such as by deactivating a select signal for a particular row) as indicated by "Close Row X" and indicated at $t_6$ in FIG. 5, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 5 by the EQ signal going high at $t_7$. As shown in each of the four sets of possible sense amplifier and accumulator signals illustrated in FIG. 5 at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 206 and the secondary latch of the compute component 231) and the second data value (stored in a memory cell 202-1 coupled to Row Y 204-Y) includes performing particular steps which depend on the whether an AND or an OR is to be performed. Examples of pseudo code associated with "ANDing" and "ORing" the data value residing in the accumulator (e.g., the first data value stored in the memory cell 202-2 coupled to Row X 204-X) and the second data value (e.g., the data value stored in the memory cell 202-1 coupled to Row Y 204-Y) are summarized below. Example pseudo code associated with "ANDing" the data values can include:

Deactivate EQ;
Open Row Y;
Fire Sense Amps (after which Row Y data resides in the sense amps);
Close Row Y;
 The result of the logic operation, in the next operation, will be placed on the sense amp, which will overwrite any row that is active;
 Even when Row Y is closed, the sense amplifier still contains the Row Y data value;
Activate AND;
 This results in the sense amplifier being written to the value of the function (e.g., Row X AND Row Y);
 If the accumulator contains a "0" (i.e., a voltage corresponding to a "0" on node S2 and a voltage corresponding to a "1" on node S1), the sense amplifier data is written to a "0";
 If the accumulator contains a "1" (i.e., a voltage corresponding to a "1" on node S2 and a voltage corresponding to a "0" on node S1), the sense amplifier data remains unchanged (Row Y data);
 This operation leaves the data in the accumulator unchanged;
Deactivate AND;
Precharge;

In the pseudo code above, "Deactivate EQ" indicates that an equilibration signal corresponding to the sense amplifier 206 is disabled (e.g., such that the complementary data lines 205-1 (D) and 205-2 (D_) are no longer shorted to $V_{DD}/2$), which is illustrated in FIG. 5 at $t_8$. After equilibration is disabled, a selected row (e.g., ROW Y) is enabled as indicated in the pseudo code above by "Open Row Y" and shown in FIG. 5 at $t_9$. When the voltage signal applied to ROW Y reaches the threshold voltage (Vt) of the access transistor (e.g., 202-1) corresponding to the selected cell, the access transistor turns on and couples the data line (e.g., D_ 205-1) to the selected cell (e.g., to capacitor 203-1) which creates a differential voltage signal between the data lines.

After Row Y is enabled, in the pseudo code above, "Fire Sense Amps" indicates that the sense amplifier 206 is enabled to amplify the differential signal between 205-1 (D) and 205-2 (D_), resulting in a voltage (e.g., $V_{DD}$) corresponding to a logic 1 or a voltage (e.g., GND) corresponding to a logic 0 being on data line 205-1 (D) (and the voltage corresponding to the other logic state being on complementary data line 205-2 (D_)). As shown at $t_{10}$ in FIG. 5, the ACT positive control signal (e.g., 265 shown in FIG. 2B) goes high and the RnIF negative control signal (e.g., 228 shown in FIG. 2B) goes low to fire the sense amps. The sensed data value from memory cell 202-1 is stored in the primary latch of sense amplifier 206, as previously described. The secondary latch still corresponds to the data value from memory cell 202-2 since the dynamic latch is unchanged.

After the second data value sensed from the memory cell 202-1 coupled to Row Y is stored in the primary latch of sense amplifier 206, in the pseudo code above, "Close Row Y" indicates that the selected row (e.g., ROW Y) can be disabled if it is not desired to store the result of the AND logical operation back in the memory cell corresponding to Row Y. However, FIG. 5 shows that Row Y is left enabled such that the result of the logical operation can be stored back in the memory cell corresponding to Row Y. Isolating the memory cell corresponding to Row Y can be accomplished by the access transistor turning off to decouple the selected cell 202-1 from the data line 205-1 (D). After the selected Row Y is configured (e.g., to isolate the memory cell or not isolate the memory cell), "Activate AND" in the pseudo code above indicates that the AND control signal goes high as shown in FIG. 5 at $t_{11}$, causing pull down transistor 207-1 to conduct. In this manner, activating the AND control signal causes the value of the function (e.g., Row X AND Row Y) to be written to the sense amp.

With the first data value (e.g., Row X) stored in the dynamic latch of the accumulator 231 and the second data value (e.g., Row Y) stored in the sense amplifier 206, if the dynamic latch of the compute component 231 contains a "0" (i.e., a voltage corresponding to a "0" on node S2 and a voltage corresponding to a "1" on node S1), the sense amplifier data is written to a "0" (regardless of the data value previously stored in the sense amp) since the voltage corresponding to a "1" on node S1 causes transistor 209-1 to conduct thereby coupling the sense amplifier 206 to ground through transistor 209-1, pull down transistor 207-1 and data line 205-1 (D). When either data value of an AND operation is "0," the result is a "0." Here, when the second data value (in the dynamic latch) is a "0," the result of the AND operation is a "0" regardless of the state of the first data value, and so the configuration of the sensing circuitry causes the "0" result to be written and initially stored in the sense amplifier 206. This operation leaves the data value in the accumulator unchanged (e.g., from Row X).

If the secondary latch of the accumulator contains a "1" (e.g., from Row X), then the result of the AND operation depends on the data value stored in the sense amplifier 206 (e.g., from Row Y). The result of the AND operation should be a "1" if the data value stored in the sense amplifier 206 (e.g., from Row Y) is also a "1," but the result of the AND operation should be a "0" if the data value stored in the sense amplifier 206 (e.g., from Row Y) is also a "0." The sensing circuitry 250 is configured such that if the dynamic latch of the accumulator contains a "1" (i.e., a voltage corresponding to a "1" on node S2 and a voltage corresponding to a "0" on node S1), transistor 209-1 does not conduct, the sense amplifier is not coupled to ground (as described above), and the data value previously stored in the sense amplifier 206 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 206, "Deactivate AND" in the pseudo code above indicates that the AND control signal goes low as shown at $t_{12}$ in FIG. 5, causing pull down transistor 207-1 to stop conducting to isolate the sense amplifier 206 (and data line 205-1 (D)) from ground. If not previously done, Row Y can be closed (as shown at $t_{13}$ in FIG. 5) and the sense amplifier can be disabled (as shown at $t_{14}$ in FIG. 5 by the ACT positive control signal going low and the RnIF negative control signal goes high). With the data lines isolated, "Precharge" in the pseudo code above can cause a precharge of the data lines by an equilibrate operation, as described previously (e.g., commencing at $t_{14}$ shown in FIG. 5).

FIG. 5 shows, in the alternative, the behavior of voltage signals on the data lines (e.g., 205-1 (D) and 205-2 (D_) shown in FIG. 2A) coupled to the sense amplifier (e.g., 206 shown in FIG. 2A) and the behavior of voltage signals on nodes S1 and S2 of the secondary latch of the compute component (e.g., 231 shown in FIG. 2A) for an AND logical operation involving each of the possible combination of operands (e.g., Row X/Row Y data values 00, 10, 01, and 11).

Although the timing diagrams illustrated in FIG. 5 and the pseudo code described above indicate initiating the AND logical operation after starting to load the second operand (e.g., Row Y data value) into the sense amplifier, the circuit shown in FIG. 2A can be successfully operated by initiating the AND logical operation before starting to load the second operand (e.g., Row Y data value) into the sense amplifier.

Figure 6:
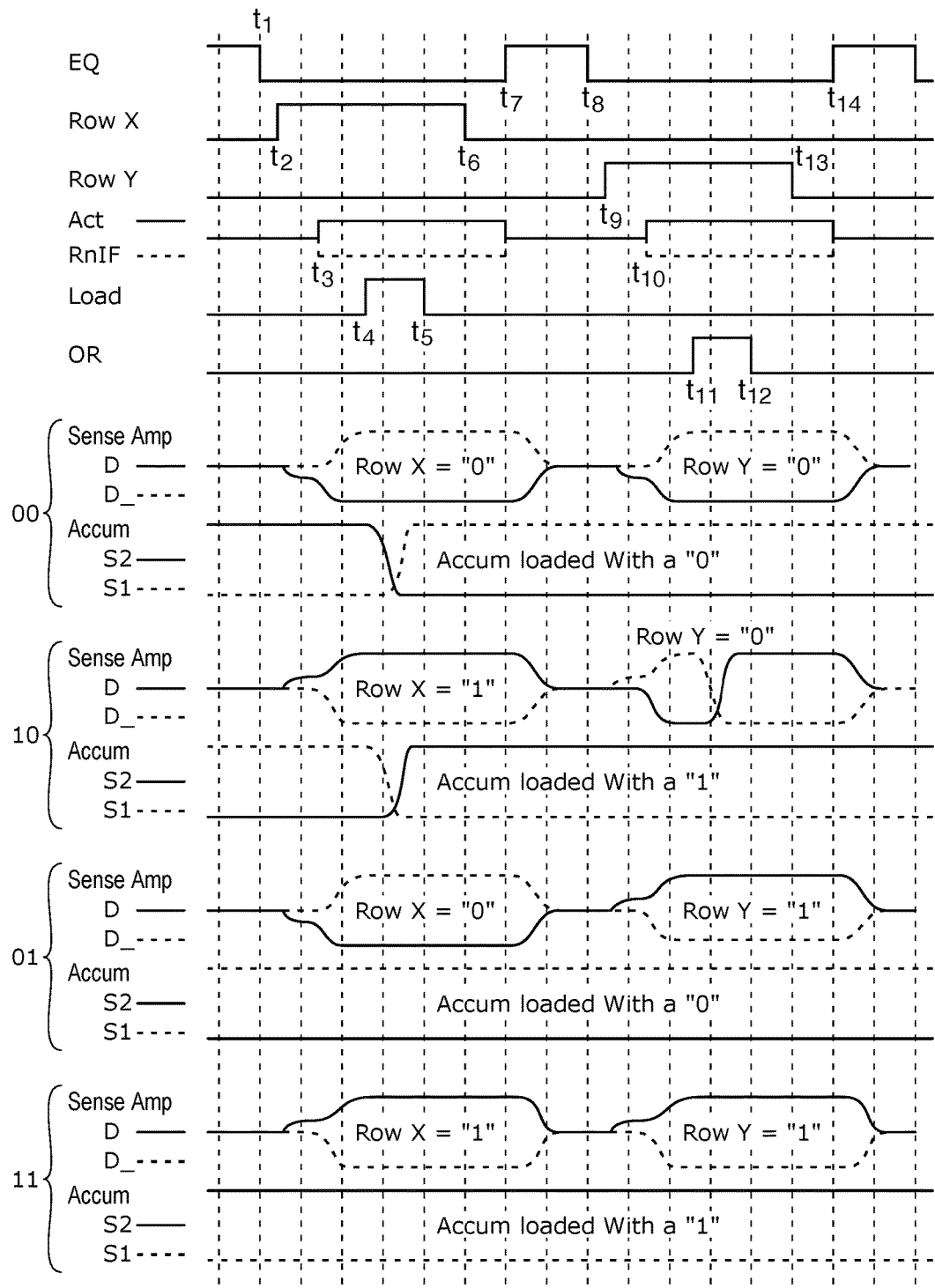
FIG. 6 illustrates a timing diagram associated with performing a number of logical operations using sensing circuitry in accordance with a number of embodiments of the present disclosure.

FIG. 6 illustrates a timing diagram associated with performing a number of logical operations using sensing circuitry in accordance with a number of embodiments of the present disclosure. FIG. 6 illustrates a timing diagram associated with initiating an OR logical operation after starting to load the second operand (e.g., Row Y data value) into the sense amplifier. FIG. 6 illustrates the sense amplifier and accumulator signals for various combinations of first and second operand data values. The particular timing diagram signals are discussed below with respect to the pseudo code associated with an AND logical operation of the circuit shown in FIG. 2A.

A subsequent operation phase can alternately be associated with performing the OR operation on the first data value (now stored in the sense amplifier 206 and the secondary latch of the compute component 231) and the second data value (stored in a memory cell 202-1 coupled to Row Y 204-Y). The operations to load the Row X data into the sense amplifier and accumulator that were previously described with respect to times $t_1$-$t_7$ shown in FIG. 5 are not repeated with respect to FIG. 6. Example pseudo code associated with "ORing" the data values can include:

Deactivate EQ;
Open Row Y;
Fire Sense Amps (after which Row Y data resides in the sense amps);
Close Row Y;
When Row Y is closed, the sense amplifier still contains the Row Y data value;
Activate OR;
This results in the sense amplifier being written to the value of the function (e.g., Row X OR Row Y), which may overwrite the data value from Row Y previously stored in the sense amplifier as follows:
If the accumulator contains a "0" (i.e., a voltage corresponding to a "0" on node S2 and a voltage corresponding to a "1" on node S1), the sense amplifier data remains unchanged (Row Y data);
If the accumulator contains a "1" (i.e., a voltage corresponding to a "1" on node S2 and a voltage corresponding to a "0" on node S1), the sense amplifier data is written to a "1";
This operation leaves the data in the accumulator unchanged;
Deactivate OR;
Precharge;

The "Deactivate EQ" (shown at $t_8$ in FIG. 6), "Open Row Y" (shown at $t_9$ in FIG. 6), "Fire Sense Amps" (shown at $t_{10}$ in FIG. 6), and "Close Row Y" (shown at $t_{13}$ in FIG. 6, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 6, which causes pull down transistor 207-2 to conduct. In this manner, activating the OR control signal causes the value of the function (e.g., Row X OR Row Y) to be written to the sense amp.

With the first data value (e.g., Row X) stored in the secondary latch of the compute component 231 and the second data value (e.g., Row Y) stored in the sense amplifier 206, if the dynamic latch of the accumulator contains a "0" (i.e., a voltage corresponding to a "0" on node S2 and a voltage corresponding to a "1" on node S1), then the result of the OR operation depends on the data value stored in the sense amplifier 206 (e.g., from Row Y). The result of the OR operation should be a "1" if the data value stored in the sense amplifier 206 (e.g., from Row Y) is a "1," but the result of the OR operation should be a "0" if the data value stored in the sense amplifier 206 (e.g., from Row Y) is also a "0." The sensing circuitry 250 is configured such that if the dynamic latch of the accumulator contains a "0," with the voltage corresponding to a "0" on node S2, transistor 209-2 is off and does not conduct (and pull down transistor 207-1 is also off since the AND control signal is not asserted) so the sense amplifier 206 is not coupled to ground (either side), and the data value previously stored in the sense amplifier 206 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 209-2 does conduct (as does pull down transistor 207-2 since the OR control signal is asserted), and the sense amplifier 206 input coupled to data line 205-2 (D_) is coupled to ground since the voltage corresponding to a "1" on node S2 causes transistor 209-2 to conduct along with pull down transistor 207-2 (which also conducts since the OR control signal is asserted). In this manner, a "1" is initially stored in the sense amplifier 206 as a result of the OR operation when the secondary latch of the accumulator contains a "1" regardless of the data value previously stored in the sense amp. This operation leaves the data in the accumulator unchanged. FIG. 6 shows, in the alternative, the behavior of voltage signals on the data lines (e.g., 205-1 (D) and 205-2 (D_) shown in FIG. 2A) coupled to the sense amplifier (e.g., 206 shown in FIG. 2A) and the behavior of voltage signals on nodes S1 and S2 of the secondary latch of the compute component 231 for an OR logical operation involving each of the possible combination of operands (e.g., Row X/Row Y data values 00, 10, 01, and 11).

After the result of the OR operation is initially stored in the sense amplifier 206, "Deactivate OR" in the pseudo code above indicates that the OR control signal goes low as shown at $t_{12}$ in FIG. 6, causing pull down transistor 207-2 to stop conducting to isolate the sense amplifier 206 (and data line D 205-2) from ground. If not previously done, Row Y can be closed (as shown at $t_{13}$ in FIG. 6) and the sense amplifier can be disabled (as shown at $t_{14}$ in FIG. 6 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 6.

The sensing circuitry 250 illustrated in FIG. 2A can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ORinv control signal causes transistor 214-1 to conduct and activating the ANDinv control signal causes transistor 214-2 to conduct. In each case, asserting the appropriate inverted control signal can flip the sense amplifier and cause the result initially stored in the sense amplifier 206 to be that of the AND operation using inverted Row X and true Row Y data values or that of the OR operation using the inverted Row X and true Row Y data values. A true or complement version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 2A can perform a NOT (e.g., invert) operation by putting the non-inverted data value into the dynamic latch of the accumulator and using that data to invert the data value in the sense amplifier 206. As previously mentioned, activating the ORinv control signal causes transistor 214-1 to conduct and activating the ANDinv control signal causes transistor 214-2 to conduct. The ORinv and/or ANDinv control signals are used in implementing the NOT function, as described further below:

Copy Row X into the Accumulator;
Deactivate EQ;
Open Row X;
Fire Sense Amps (after which Row X data resides in the sense amps);
Activate LOAD (sense amplifier data (Row X) is transferred to nodes S1 and S2 of the Accumulator and resides there dynamically;
Deactivate LOAD;
Activate ANDinv and ORinv (which puts the compliment data value on the data lines);
This results in the data value in the sense amplifier being inverted (e.g., the sense amplifier latch is flipped);
This operation leaves the data in the accumulator unchanged;
Deactivate ANDinv and ORinv;
Close Row X;
Precharge;

The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Accumulator" initial operation phase described above prior to pseudo code for the AND operation and OR operation. However, rather than closing the Row X and Precharging after the Row X data is loaded into the sense amplifier 206 and copied into the dynamic latch, a complement version of the data value in the dynamic latch of the accumulator can be placed on the data line and thus transferred to the sense amplifier 206 by enabling (e.g., causing transistor to conduct) and disabling the invert transistors (e.g., ANDinv and ORinv). This results in the sense amplifier 206 being flipped from the true data value that was previously stored in the sense amplifier to a complement data value (e.g., inverted data value) stored in the sense amp. That is, a true or complement version of the data value in the accumulator can be transferred to the sense amplifier by activating and deactivating ANDinv and ORinv. This operation leaves the data in the accumulator unchanged.

Because the sensing circuitry 250 shown in FIG. 2A initially stores the result of the AND, OR, and NOT logical operations in the sense amplifier 206 (e.g., on the sense amplifier nodes), these logical operation results can be communicated easily and quickly to any enabled row, any row activated after the logical operation is complete, and/or into the secondary latch of the compute component 231. The sense amplifier 206 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 206 fires.

When performing logical operations in this manner, the sense amplifier 206 can be pre-seeded with a data value from the dynamic latch of the accumulator to reduce overall current utilized because the sense amps 206 are not at full rail voltages (e.g., supply voltage or ground/reference voltage) when accumulator function is copied to the sense amplifier 206. An operation sequence with a pre-seeded sense amplifier 206 either forces one of the data lines to the reference voltage (leaving the complementary data line at $V_{DD}/2$, or leaves the complementary data lines unchanged. The sense amplifier 206 pulls the respective data lines to full rails when the sense amplifier 206 fires. Using this sequence of operations will overwrite data in an enabled row.

A SHIFT operation can be accomplished by multiplexing ("muxing") two neighboring data line complementary pairs using a traditional DRAM isolation (ISO) scheme. According to embodiments of the present disclosure, the shift circuitry 223 can be used for shifting data values stored in memory cells coupled to a particular pair of complementary data lines to the sensing circuitry 250 (e.g., sense amplifier 206) corresponding to a different pair of complementary data lines (e.g., such as a sense amplifier 206 corresponding to a left or right adjacent pair of complementary data lines. As used herein, a sense amplifier 206 corresponds to the pair of complementary data lines to which the sense amplifier is coupled when isolation transistors 221-1 and 221-2 are conducting. The SHIFT operations (right or left) do not pre-copy the Row X data value into the accumulator. Operations to shift right Row X can be summarized as follows:

Deactivate Norm and Activate Shift;
Deactivate EQ;
Open Row X;
Fire Sense Amps (after which shifted Row X data resides in the sense amps);
Activate Norm and Deactivate Shift;
Close Row X;
Precharge;

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines). The SHIFT control signal goes high causing isolation transistors 221-3 and 221-4 to conduct, thereby coupling the sense amplifier 206 to the left adjacent pair of complementary data lines (e.g., on the memory array side of non-conducting isolation transistors 221-1 and 221-2 for the left adjacent pair of complementary data lines).

After the shift circuitry 223 is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 206.

In the pseudo code above, "Activate Norm and Deactivate Shift" indicates that a NORM control signal goes high causing isolation transistors 221-1 and 221-2 of the shift circuitry 223 to conduct (e.g., coupling the sense amplifier to the corresponding pair of complementary data lines), and the SHIFT control signal goes low causing isolation transistors 221-3 and 221-4 to not conduct and isolating the sense amplifier 206 from the left adjacent pair of complementary data lines (e.g., on the memory array side of non-conducting isolation transistors 221-1 and 221-2 for the left adjacent pair of complementary data lines). Since Row X is still active, the Row X data value that has been shifted right is transferred to Row X of the corresponding pair of complementary data lines through isolation transistors 221-1 and 221-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above. Operations to shift left Row X can be summarized as follows:

Activate Norm and Deactivate Shift;
Deactivate EQ;
Open Row X;
Fire Sense Amps (after which Row X data resides in the sense amps);
Deactivate Norm and Activate Shift;
Sense amplifier data (shifted left Row X) is transferred to Row X;
Close Row X;
Precharge;

In the pseudo code above, "Activate Norm and Deactivate Shift" indicates that a NORM control signal goes high causing isolation transistors 221-1 and 221-2 of the shift circuitry 223 to conduct, and the SHIFT control signal goes low causing isolation transistors 221-3 and 221-4 to not conduct. This configuration couples the sense amplifier 206 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the pair of complementary data lines corresponding to the sense circuitry 250 is stored in the sense amplifier 206.

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines), and the SHIFT control signal goes high causing isolation transistors 221-3 and 221-4 to conduct coupling the sense amplifier to the left adjacent pair of complementary data lines (e.g., on the memory array side of non-conducting isolation transistors 221-1 and 221-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

According to various embodiments, general computing can be enabled in a memory array core of a processor-in-memory (PIM) device such as a DRAM one transistor per memory cell (e.g., 1T1C) configuration at 6F^2 or 4F^2 memory cell sizes, for example. A potential advantage of the apparatuses and methods described herein may not be realized in terms of single instruction speed, but rather can be realized in the cumulative speed that can be achieved by an entire bank of data being computed in parallel without ever transferring data out of the memory array (e.g., DRAM) or firing a column decode. In other words, data transfer time can be eliminated. For example, apparatus of the present disclosure can perform ANDs or ORs simultaneously using data values in memory cells coupled to a data line (e.g., a column of 16K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving a central processing unit (CPU) discrete from the memory such that data must be transferred therebetween. An apparatus and/or methods according to the present disclosure can also use less energy/area than configurations where the CPU is discrete from the memory. Furthermore, an apparatus and/or methods of the present disclosure can improve upon the smaller energy/area advantages since the in-memory-array logical operations save energy by eliminating certain data value transfers.

Figure 7:
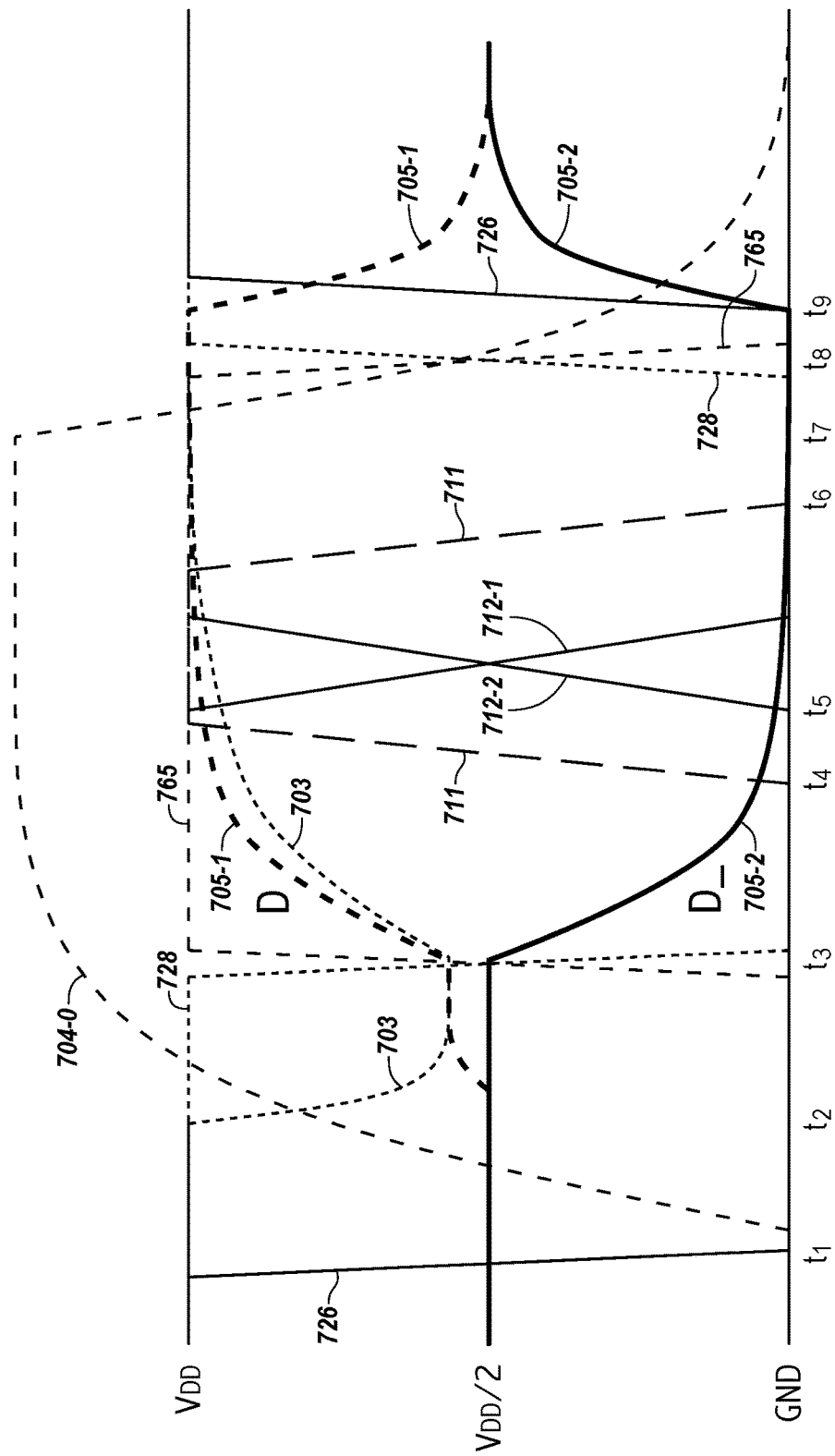
FIG. 7 illustrates a timing diagram associated with performing a number of logical operations using sensing circuitry in accordance with a number of embodiments of the present disclosure.

FIG. 7 illustrates a timing diagram associated with performing a number of logical operations using sensing circuitry in accordance with a number of embodiments of the present disclosure. The functionality of the sensing circuitry 250 of FIG. 2A is described below with respect to performing logical operations and initially storing a result in the compute component 231 (e.g., secondary latch of the accumulator). The timing diagram shown in FIG. 7 illustrates signals (e.g., voltage signals) associated with performing a first operation phase of a logical operation (e.g., an R-input logical operation) using the sensing circuitry illustrated in FIG. 2A. The first operation phase described with respect to FIG. 7 can be a first operation phase of an AND, NAND, OR, or NOR operation, for instance. Performing the operation phase illustrated in FIG. 7 can involve consuming significantly less energy (e.g., about half) than previous processing approaches that may involve providing a full swing between voltage rails (e.g., between a supply and ground).

In the example illustrated in FIG. 7, the voltage rails corresponding to complementary logic values (e.g., "1" and "0") are a supply voltage ($V_{DD}$) and a reference voltage (e.g., ground (Gnd)). Prior to performing a logical operation, an equilibration can occur such that the complementary data lines D and D_ are shorted together at an equilibration voltage ($V_{DD}/2$), as previously described.

The first operation phase of a logical operation described below involves loading a first operand of the logical operation into the accumulator. The time references (e.g., $t_1$, etc.) shown in FIG. 7 do not necessarily represent a same absolute or relative time as similar time references in other timing diagrams.

t time $t_1$, the equilibration signal 726 is deactivated, and then a selected row is enabled (e.g., the row corresponding to a memory cell whose data value is to be sensed and used as a first input). Signal 704-0 represents the voltage signal applied to the selected row (e.g., Row Y 204-Y shown in FIG. 2A). When row signal 704-0 reaches the threshold voltage (Vt) of the access transistor (e.g., 202-1 shown in FIG. 2A) corresponding to the selected cell, the access transistor turns on and couples the data line D to the selected memory cell (e.g., to the capacitor 203-1 shown in FIG. 2A if the cell is a 1T1C DRAM cell), which creates a differential voltage signal between the data lines D and D_ (e.g., as indicated by signals 705-1 and 705-2 on the data lines, respectively) between times $t_2$ and $t_3$. The voltage of the selected cell is represented by signal 703. Due to conservation of energy, creating the differential signal between data lines D and D_ (e.g., by coupling the cell to data line D) does not consume energy, since the energy associated with enabling/disabling the row signal 704-0 can be amortized over the plurality of memory cells coupled to the row.

At time $t_3$, the sense amplifier (e.g., 206 shown in FIG. 2A) is activated (e.g., a positive control signal 765 (e.g., corresponding to ACT 265 shown in FIG. 2B) goes high and the negative control signal 728 (e.g., corresponding to RnIF 228 shown in FIG. 2B) goes low), which amplifies the differential signal between data lines D and D_, resulting in a voltage (e.g., $V_{DD}$) corresponding to a logic "1" or a voltage (e.g., ground) corresponding to a logic "0" being on data line D (and the other voltage being on complementary data line D_), such that the sensed data value is stored in the primary latch of sense amplifier 206. The primary energy consumption occurs in charging the data line D (205-1) from the equilibration voltage $V_{DD}/2$ to the rail voltage $V_{DD}$. FIG. 7 shows, in example, the data line voltages 705-1 and 705-2 that correspond to a logic "1" being on data line D.

According to some embodiments, the primary latch of sense amplifier 206 can be coupled to the complementary data lines D and D_ through respective pass transistors (not shown in FIG. 2B but in a similar configuration as the manner in which latch 264 is coupled to the data lines D and D_ through load/pass transistors 218-1 and 218-2 shown in FIG. 2A). The Passd control signal 711 controls one pass transistor. The Passdb control signal controls the other pass transistor, and here the Passdb control signal can behave here the same as the Passd control signal.

At time $t_4$, the pass transistors (if present) can be enabled (e.g., via respective Passd and Passdb control signals 711 applied to control lines coupled to the respective gates of the pass transistors going high). At time $t_5$, the accumulator positive control signal 712-1 (e.g., Accumb) and the accumulator positive control signal 712-2 (e.g., Accum) are activated via respective control lines 212-1 and 212-2 shown in FIG. 2A. As described below, the accumulator control signals ACCUMB 712-1 and ACCUM 712-2 may remain activated for subsequent operation phases. As such, in this example, activating the control signals ACCUMB 712-1 and ACCUM 712-2 enables the secondary latch (e.g., accumulator) of compute component 231-6 shown in FIG. 2A. The sensed data value stored in sense amplifier 206 is transferred (e.g., copied) to the secondary latch, including the dynamic latch and latch 264.

At time $t_6$, the Passd control signal 711 (and the Passdb control signal) goes low thereby turning off the pass transistors (if present). However, since the accumulator control signals ACCUMB 712-1 and ACCUM 712-2 remain activated, an accumulated result is stored (e.g., latched) in the secondary latches (e.g., accumulator). At time $t_7$, the row signal 704-0 is deactivated, and the array sense amps are disabled at time $t_8$ (e.g., sense amplifier control signals 728 and 765 are deactivated).

At time $t_9$, the data lines D and D_ are equilibrated (e.g., equilibration signal 726 is activated), as illustrated by data line voltage signals 705-1 and 705-2 moving from their respective rail values to the equilibration voltage ($V_{DD}/2$). The equilibration consumes little energy due to the law of conservation of energy. As described below in association with FIG. 2B, equilibration can involve shorting the complementary data lines D and D_ together at an equilibration voltage, which is $V_{DD}/2$, in this example. Equilibration can occur, for instance, prior to a memory cell sensing operation.

Figure 8:
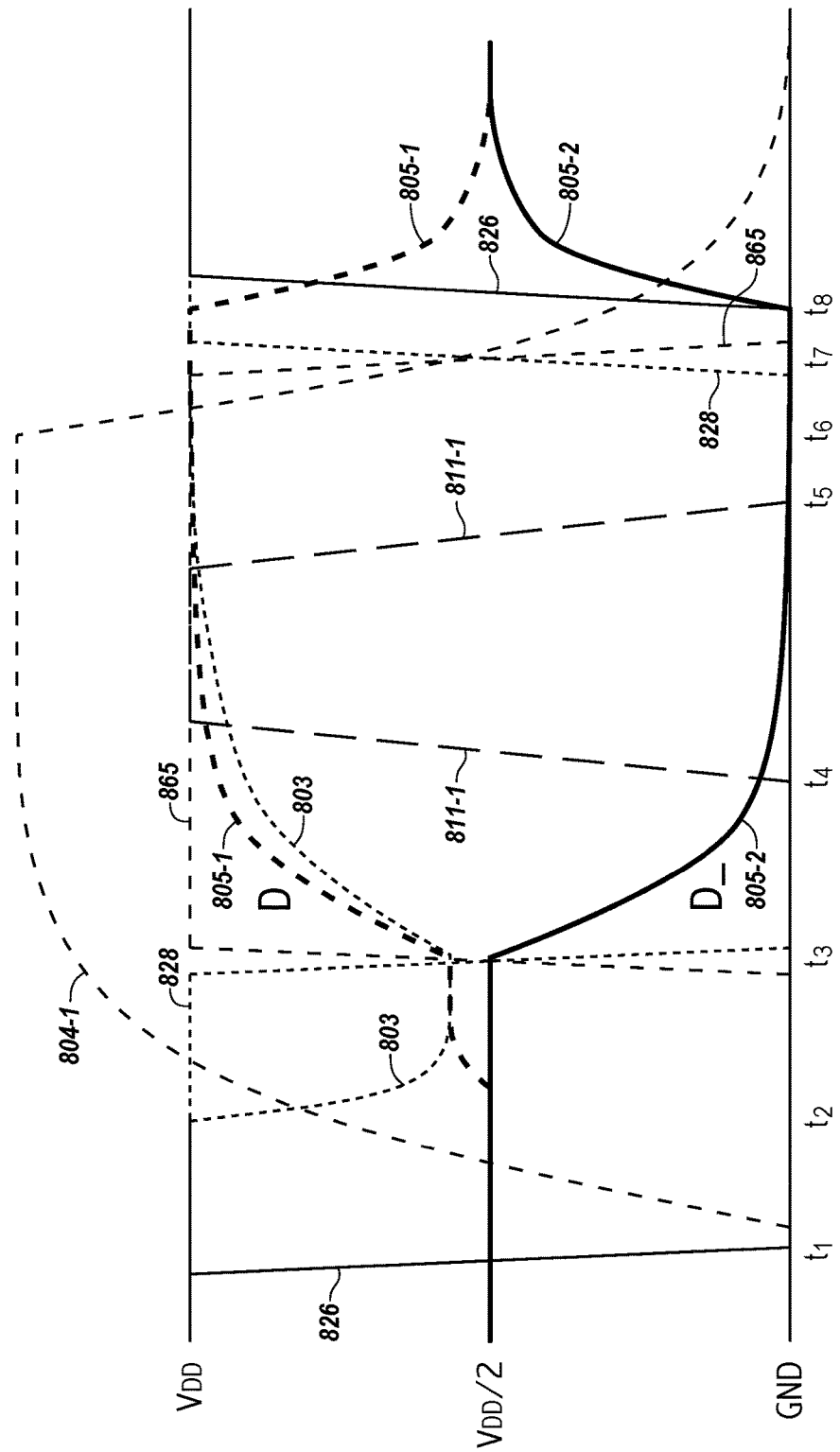
FIG. 8 illustrates a timing diagram associated with performing a number of logical operations using sensing circuitry in accordance with a number of embodiments of the present disclosure.
Figure 9:
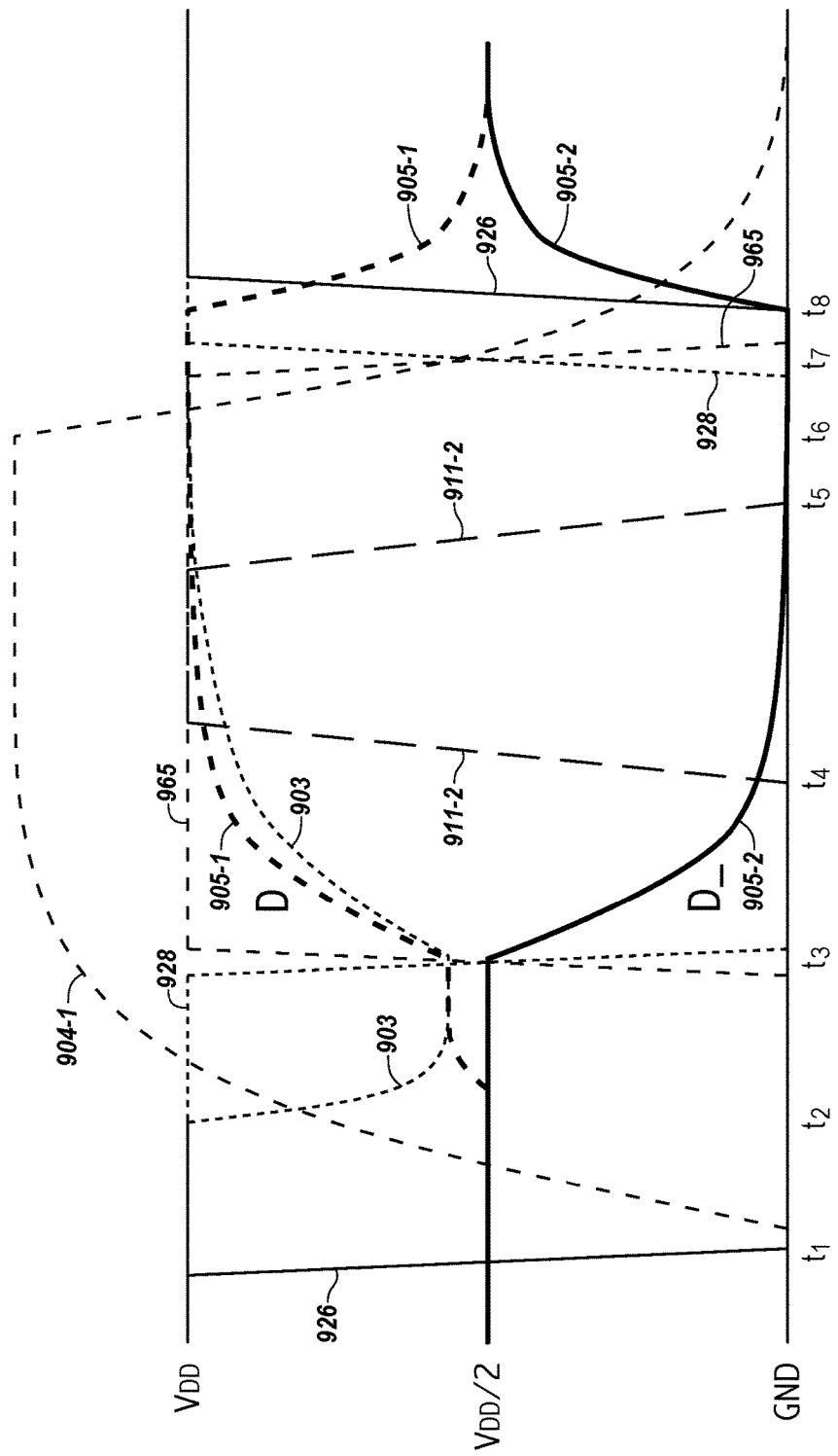
FIG. 9 illustrate a timing diagram associated with performing a number of logical operations using sensing circuitry in accordance with a number of embodiments of the present disclosure.

FIGS. 8 and 9 respectively illustrate timing diagrams associated with performing a number of logical operations using sensing circuitry in accordance with a number of embodiments of the present disclosure. Timing diagrams shown in FIGS. 8 and 9 illustrate signals (e.g., voltage signals) associated with performing a number of intermediate operation phases of a logical operation (e.g., an R-input logical operation). For instance, timing diagram shown in FIG. 8 corresponds to a number of intermediate operation phases of an R-input NAND operation or an R-input AND operation, and timing diagram shown in FIG. 9 corresponds to a number of intermediate operation phases of an R-input NOR operation or an R-input OR operation. For example, performing an AND or NAND operation can include performing the operation phase shown in FIG. 8 one or more times subsequent to an initial operation phase such as that described with respect to FIG. 7. Similarly, performing an OR or NOR operation can include performing the operation phase shown and described with respect to FIG. 9 one or more times subsequent to an initial operation phase such as that described with respect to FIG. 7.

As shown in the timing diagrams illustrated in FIGS. 8 and 9, at time $t_1$, equilibration is disabled (e.g., the equilibration signal 826/926 is deactivated), and then a selected row is enabled (e.g., the row corresponding to a memory cell whose data value is to be sensed and used as an input such as a second input, third input, etc.). Signal 804-1/904-1 represents the voltage signal applied to the selected row (e.g., Row Y 204-Y shown in FIG. 2A). When row signal 804-1 reaches the threshold voltage (Vt) of the access transistor (e.g., 202-1 shown in FIG. 2A) corresponding to the selected cell, the access transistor turns on and couples the data line D to the selected memory cell (e.g., to the capacitor 203-1 if the cell is a 1T1C DRAM cell), which creates a differential voltage signal between the data lines D and D_ (e.g., as indicated by signals 805-1/905-1 and 805-2/905-2, respectively) between times $t_2$ and $t_3$. The voltage of the selected cell is represented by signal 803/903. Due to conservation of energy, creating the differential signal between D and D_ (e.g., by coupling the cell to data line D) does not consume energy, since the energy associated with activating/deactivating the row signal 804-1/904-1 can be amortized over the plurality of memory cells coupled to the row.

At time $t_3$, the sense amplifier (e.g., 206 shown in FIG. 2A) is enabled (e.g., a positive control signal 865/965 (e.g., corresponding to ACT 233 shown in FIG. 2B) goes high, and the negative control signal 828/928 (e.g., RnIF 228 shown in FIG. 2B) goes low), which amplifies the differential signal between D and D_, resulting in a voltage (e.g., $V_{DD}$) corresponding to a logic 1 or a voltage (e.g., ground) corresponding to a logic 0 being on data line D (and the other voltage being on complementary data line D_), such that the sensed data value is stored in the primary latch of sense amplifier 206. The primary energy consumption occurs in charging the data line D (205-1) from the equilibration voltage $V_{DD}/2$ to the rail voltage $V_{DD}$.

As shown in timing diagrams illustrated in FIGS. 8 and 9, at time $t_4$ (e.g., after the selected cell is sensed), only one of control signals 811-1 (Passd) shown in FIGS. 8 and 911-2 (Passdb) shown in FIG. 9 is activated (e.g., only one of pass transistors (if present) is enabled), depending on the particular logic operation. For example, since the timing diagram illustrated in FIG. 8 corresponds to an intermediate phase of a NAND or AND operation, control signal 811-1 (Passd) is activated at time t4 to turn on the pass transistor coupling the primary latch to data line D and the Passdb control signal remains deactivated leaving the pass transistor coupling the primary latch to data line D_ turned off. Conversely, since the timing diagram illustrated in FIG. 9 corresponds to an intermediate phase of a NOR or OR operation, control signal 911-2 (Passdb) is activated at time $t_4$ to turn on the pass transistor coupling the primary latch to data line D_ and control signal Passd remains deactivated leaving the pass transistor coupling the primary latch to data line D turned off. Recall from above that the accumulator control signals 712-1 (Accumb) and 712-2 (Accum) were activated during the initial operation phase described with respect to FIG. 7, and they remain activated during the intermediate operation phase(s).

Since the accumulator was previously enabled, activating only Passd (811-1 as shown in FIG. 8) results in accumulating the data value corresponding to the voltage signal 805-1 shown in FIG. 8 corresponding to data line D. Similarly, activating only Passdb (911-2 as shown in FIG. 9) results in accumulating the data value corresponding to the voltage signal 905-2 corresponding to data line D_. For instance, in an example AND/NAND operation shown in the timing diagram illustrated in FIG. 8 in which only Passd (811-1) is activated, if the data value stored in the second selected memory cell is a logic "0," then the accumulated value associated with the secondary latch is asserted low such that the secondary latch stores logic "0." If the data value stored in the second selected memory cell is not a logic "0," then the secondary latch retains its stored first selected memory cell data value (e.g., a logic "1" or a logic "0"). As such, in this AND/NAND operation example, the secondary latch is serving as a zeroes (0s) accumulator.

Similarly, in an example OR/NOR operation shown in the timing diagram illustrated in FIG. 9 in which only Passdb 911-2 is activated, if the data value stored in the second selected memory cell is a logic "1," then the accumulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (is) accumulator since voltage signal 905-2 on D_ is setting the true data value of the accumulator.

At the conclusion of an intermediate operation phase such as that shown in FIG. 8 or 9, the Passd signal 811-1 (e.g., for AND/NAND) or the Passdb signal 911-2 (e.g., for OR/NOR) is deactivated (e.g., at time t5), the selected row is disabled (e.g., at time t6), the sense amplifier is disabled (e.g., at time t7), and equilibration occurs (e.g., at time t8). An intermediate operation phase such as that illustrated in FIG. 8 or 9 can be repeated in order to accumulate results from a number of additional rows. As an example, the sequence of timing diagram illustrated in FIGS. 8 and/or 9 can be performed a subsequent (e.g., second) time for a third memory cell, a subsequent (e.g., third) time for a fourth memory cell, etc. For instance, for a 10-input NOR operation, the intermediate phase shown in FIG. 9 can occur 9 times to provide 9 inputs of the 10-input logical operation, with the tenth input being determined during the initial operation phase (e.g., as described with respect to FIG. 7).

Figure 10:
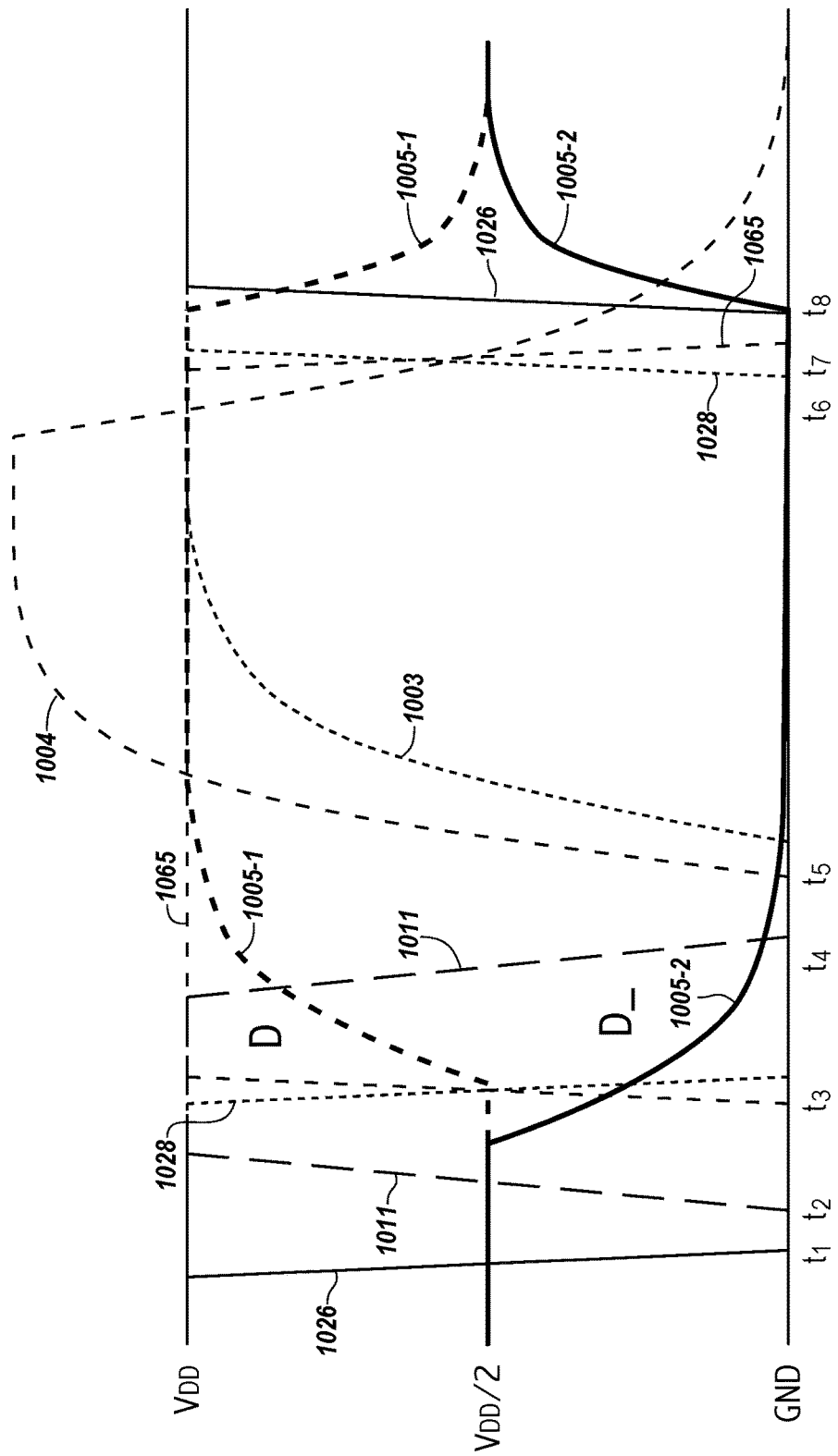
FIG. 10 illustrates a timing diagram associated with performing a number of logical operations using sensing circuitry in accordance with a number of embodiments of the present disclosure.

FIG. 10 illustrates a timing diagram associated with performing a number of logical operations using sensing circuitry in accordance with a number of embodiments of the present disclosure. The timing diagram illustrated in FIG. 10 shows signals (e.g., voltage signals) associated with performing a last operation phase of a logical operation (e.g., an R-input logical operation). For instance, the timing diagram illustrated in FIG. 10 corresponds to a last operation phase of an R-input AND operation or an R-input OR operation.

For example, performing a last operation phase of an R-input can include performing the operation phase shown in FIG. 10 subsequent to a number of iterations of the intermediate operation phase(s) described in association with FIGS. 8 and/or 9. Table 2 shown below indicates the Figures corresponding to the sequence of operation phases associated with performing a number of R-input logical operations in accordance with a number of embodiments described herein.

TABLE 2

| Operation | FIG. 7 | FIG. 8 | FIG. 9 | FIG. 10 |
|---|---|---|---|---|
| AND | First phase | R-1 iterations | | Last phase |
| NAND | First phase | R-1 iterations | | |
| OR | First phase | | R-1 iterations | Last phase |
| NOR | First phase | | R-1 iterations | |

A NAND operation can be implemented, for example, by storing the result of the R-1 iterations for an AND operation in the sense amplifier, then inverting the sense amplifier before conducting the last operation phase to store the result (described below). A NOR operation can be implemented, for example, by storing the result of the R-1 iterations for an OR operation in the sense amplifier, then inverting the sense amplifier before conducting the last operation phase to store the result (described below).

The last operation phase illustrated in the timing diagram of FIG. 10 is described in association with storing a result of an R-input logical operation to a row of the array (e.g., array 230 shown in FIG. 2A). However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 10, at time $t_1$, equilibration is disabled (e.g., the equilibration signal 1026 is deactivated) such that data lines D and D_ are floating. At time t2, the Passd control signal 1011 (and Passdb signal) is activated for an AND or OR operation.

Activating the Passd control signal 1011 (and Passdb signal) (e.g., in association with an AND or OR operation) transfers the accumulated output stored in the secondary latch of compute component 231-6 shown in FIG. 2A to the primary latch of sense amplifier 206. For instance, for an AND operation, if any of the memory cells sensed in the prior operation phases (e.g., the first operation phase illustrated in FIG. 7 and one or more iterations of the intermediate operation phase illustrated in FIG. 8) stored a logic "0" (e.g., if any of the R-inputs of the AND operation were a logic "0"), then the data line D_ will carry a voltage corresponding to logic "1" (e.g., $V_{DD}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1". At time t3, the primary latch of sense amplifier 206 is then enabled (e.g., a positive control signal 1065 (e.g., corresponding to ACT 265 shown in FIG. 2B) goes high and the negative control signal 1028 (e.g., corresponding to RnIF 228 shown in FIG. 2B) goes low), which amplifies the differential signal between data lines D and D_ such that the data line D now carries the ANDed result of the respective input data values as determined from the memory cells sensed during the prior operation phases. As such, data line D will be at ground if any of the input data values are a logic "0" and data line D will be at $V_{DD}$ if all of the input data values are a logic "1."

For an OR operation, if any of the memory cells sensed in the prior operation phases (e.g., the first operation phase of FIG. 7 and one or more iterations of the intermediate operation phase shown in FIG. 9) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., $V_{DD}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time t3, the primary latch of sense amplifier 206 is then enabled and the data line D now carries the ORed result of the respective input data values as determined from the memory cells sensed during the prior operation phases. As such, data line D will be at $V_{DD}$ if any of the input data values are a logic "1" and data line D will be at ground if all of the input data values are a logic "0."

The result of the R-input AND or OR logical operations can then be stored back to a memory cell of array 230 shown in FIG. 2A. In the examples shown in FIG. 10, the result of the R-input logical operation is stored to a memory cell coupled to the last row enabled (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 10 shows, at time t7, the positive control signal 1065 and the negative control signal 1028 being deactivated (e.g., signal 1065 goes low and signal 1028 goes high) to disable the sense amplifier 206 shown in FIG. 2A. At time t4 the Passd control signal 1011 (and Passdb signal) that was activated at time t2 is deactivated. Embodiments are not limited to this example. For instance, in a number of embodiments, the sense amplifier 206 shown in FIG. 2A may be enabled subsequent to time t4 (e.g., after the Passd control signal 1011 (and Passdb signal) are deactivated).

As shown in FIG. 10, at time t5, a selected row is enabled (e.g., by row activation signal 1004 going high, which drives the capacitor of the selected cell to the voltage corresponding to the logic value stored in the accumulator. At time t6 the selected row is disabled. At time t7 the sense amplifier 206 shown in FIG. 2A is disabled (e.g., positive control signal 1028 and negative control signal 1065 are deactivated), and at time t8 equilibration occurs (e.g., signal 1026 is activated and the voltages on the complementary data lines 1005-1 (D) and 1005-2 (D_) are brought to the equilibration voltage).

Although the example of performing a last operation phase of an R-input was discussed above with respect to FIG. 10 for performing AND and OR logical operations, embodiments are not limited to these logical operations. For example, the NAND and NOR operations can also involve a last operation phase of an R-input that is stored back to a memory cell of array 230 using control signals to operate the sensing circuitry illustrated in FIG. 2A.

Figure 11:
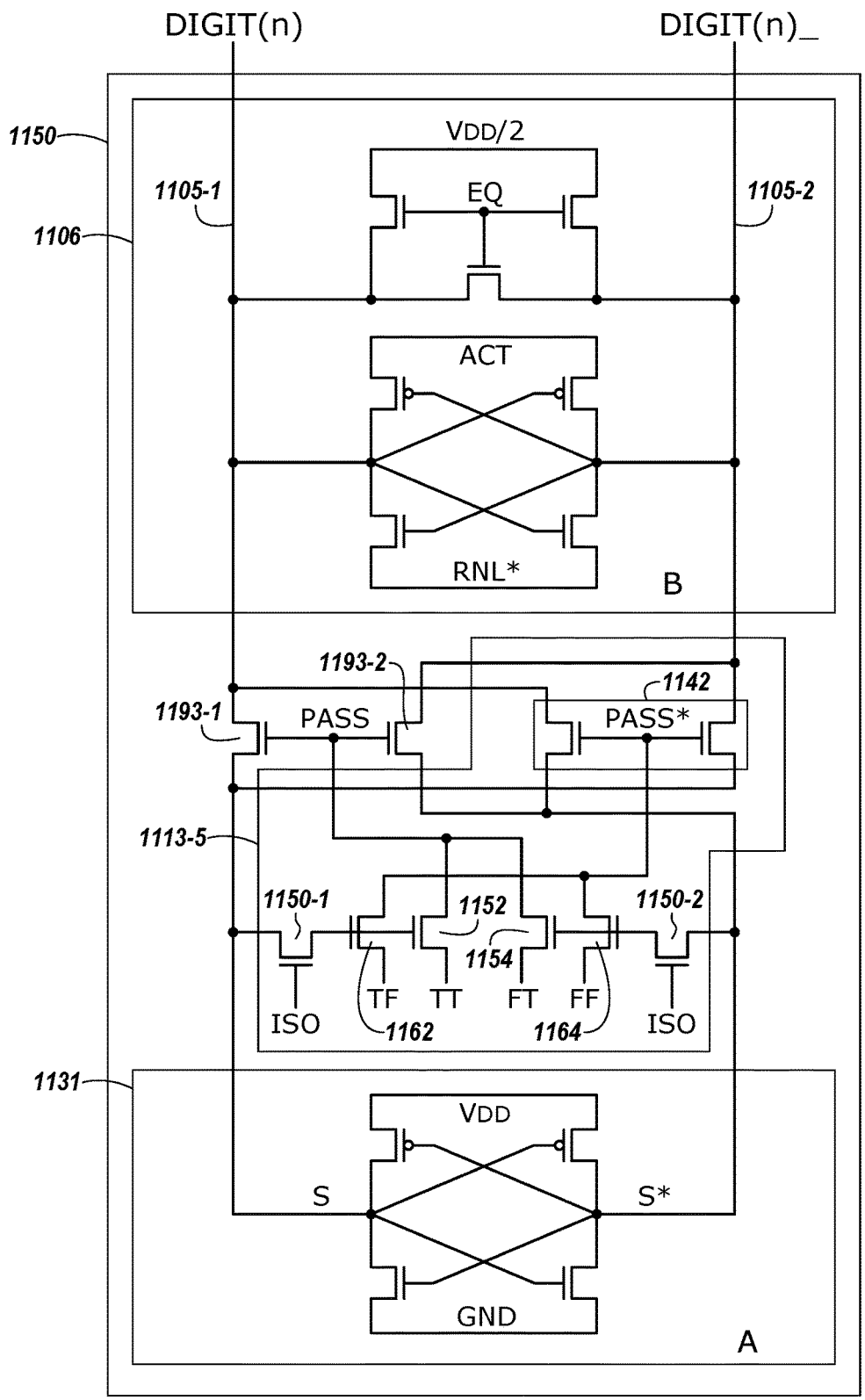
FIG. 11 is a schematic diagram illustrating sensing circuitry having selectable logical operation selection logic in accordance with a number of embodiments of the present disclosure.

FIG. 11 is a schematic diagram illustrating sensing circuitry having selectable logical operation selection logic in accordance with a number of embodiments of the present disclosure. FIG. 11 shows a sense amplifier 1106 coupled to a pair of complementary sense lines 1105-1 and 1105-2, and a compute component 1131 coupled to the sense amplifier 1106 via pass gates 1193-1 and 1193-2. The gates of the pass gates 1193-1 and 1193-2 can be controlled by a logical operation selection logic signal, PASS, which can be output from logical operation selection logic 1113-5. FIG. 11 shows the compute component 1131 labeled "A" and the sense amplifier 1106 labeled "B" to indicate that the data value stored in the compute component 1131 is the "A" data value and the data value stored in the sense amplifier 1106 is the "B" data value shown in the logic tables illustrated with respect to FIG. 12.

The sensing circuitry 1150 illustrated in FIG. 11 includes logical operation selection logic 1113-5. In this example, the logic 1113-5 comprises swap gates 1142 controlled by a logical operation selection logic signal PASS*. The logical operation selection logic 1113-5 also comprises four logic selection transistors: logic selection transistor 1162 coupled between the gates of the swap transistors 1142 and a TF signal control line, logic selection transistor 1152 coupled between the gates of the pass gates 1193-1 and 1193-2 and a TT signal control line, logic selection transistor 1154 coupled between the gates of the pass gates 1193-1 and 1193-2 and a FT signal control line, and logic selection transistor 1164 coupled between the gates of the swap transistors 1142 and a FF signal control line. Gates of logic selection transistors 1162 and 1152 are coupled to the true sense line (e.g., 1105-1) through isolation transistor 1150-1 (having a gate coupled to an ISO signal control line), and gates of logic selection transistors 1164 and 1154 are coupled to the complementary sense line (e.g., 1105-2) through isolation transistor 1150-2 (also having a gate coupled to an ISO signal control line).

Logic selection transistors 1152 and 1154 are arranged similarly to transistor 507-1 (coupled to an AND signal control line) and transistor 507-2 (coupled to an OR signal control line) respectively, as shown in FIG. 5. Operation of logic selection transistors 1152 and 1154 are similar based on the state of the TT and FT selection signals and the data values on the respective complementary sense lines at the time the ISO signal is asserted. Logic selection transistors 1162 and 1164 also operate in a similar manner to control (e.g., enable by turning on or disable by turning off) the swap transistors 1142. That is, to enable (e.g., turn on) the swap transistors 1142, either the TF control signal is activated (e.g., high) with data value on the true sense line being "1," or the FF control signal is activated (e.g., high) with the data value on the complement sense line being "1." If either the respective control signal or the data value on the corresponding sense line (e.g., sense line to which the gate of the particular logic selection transistor is coupled) is not high, then the swap transistors 1142 will not be enabled by a particular logic selection transistor.

The PASS* control signal is not necessarily complementary to the PASS control signal. For instance, it is possible for the PASS and PASS* control signals to both be activated or both be deactivated at the same time. However, activation of both the PASS and PASS* control signals at the same time shorts the pair of complementary sense lines DIGIT(n)/ DIGIT(n)_together, which may be a disruptive configuration to be avoided. Logical operations results for the sensing circuitry illustrated in FIG. 11 are summarized in the logic table illustrated in FIG. 12.

FIG. 12 is a logic table illustrating selectable logic operation results implementable by the sensing circuitry shown in FIG. 11 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 1106 and compute component 1131. The four control signals (e.g., TF, TT, FT, and FF), in conjunction with a particular data value present on the complementary sense lines, controls the pass gates 1193-1 and 1193-2 and swap transistors 1142, which in turn affects the data value in the compute component 1131 and/or sense amplifier 1106 before/after firing. The capability to selectably control the swap transistors 1142 facilitates implementing logical operations involving inverse data values (e.g., inverse operands and/or inverse result), among others.

The logic table illustrated in FIG. 12 shows the starting data value stored in the compute component 1131 shown in column A at 1244, and the starting data value stored in the sense amplifier 1106 shown in column B at 1245. The other 3 top column headings (NOT OPEN 1256, OPEN TRUE 1270, and OPEN INVERT 1271) in the logic table of FIG. 12 refer to the state of the pass gates 1193-1 and 1193-2, and the swap transistors 1142, which can respectively be controlled to be OPEN or CLOSED depending on the state of the four logic selection control signals (e.g., TF, TT, FT, and FF), in conjunction with a particular data value present on the pair of complementary sense lines 1105-1 and 1105-2 when the ISO control signal is asserted. The "Not Open" column corresponds to the pass gates 1193-1 and 1193-2 and the swap transistors 1142 both being in a non-conducting (e.g., off) condition, the "Open True" corresponds to the pass gates 1193-1 and 1193-2 being in a conducting (e.g., on) condition, and the "Open Invert" corresponds to the swap transistors 1142 being in a conducting condition. The configuration corresponding to the pass gates 1193-1 and 1193-2 and the swap transistors 1142 both being in a conducting condition is not reflected in the logic table of FIG. 12 since this results in the sense lines being shorted together.

Via selective control of the pass gates 1193-1 and 1193-2 and the swap transistors 1142, each of the three columns of the first set of two rows of the upper portion of the logic table of FIG. 12 can be combined with each of the three columns of the second set of two rows below the first set to provide 3×3=9 different result combinations, corresponding to nine different logical operations, as indicated by the various connecting paths shown at 1275. The nine different selectable logical operations that can be implemented by the sensing circuitry 1150 are summarized in the logic table illustrated in FIG. 12.

The columns of the lower portion of the logic table illustrated in FIG. 12 show a heading 1280 that includes the state of logic selection control signals. For example, the state of a first logic selection control signal (e.g., FF) is provided in row 1276, the state of a second logic selection control signal (e.g., FT) is provided in row 1277, the state of a third logic selection control signal (e.g., TF) is provided in row 1278, and the state of a fourth logic selection control signal (e.g., TT) is provided in row 1279. The particular logical operation corresponding to the results is summarized in row 1247.

As such, the sensing circuitry shown in FIG. 11 can be used to perform various logical operations as shown in FIG. 12. For example, the sensing circuitry 1150 can be operated to perform various logical operations (e.g., AND and OR logical operations) in association with determining population count in accordance with a number of embodiments of the present disclosure.

The present disclosure includes apparatuses and methods related to performing division operations in memory. An example apparatus might include a first group of memory cells coupled to a first access line and configured to store a dividend element. An example apparatus might include a second group of memory cells coupled to a second access line and configured to store a divisor element. An example apparatus might also include sensing circuitry configured to divide the dividend element by the divisor element by performing a number of AND operations, OR operations, SHIFT operations, and INVERT operations without transferring data via an input/output (I/O) line.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system comprising:
    a first group of memory cells coupled to a first access line and configured to store a dividend element;
    a second group of memory cells coupled to a second access line and configured to store a divisor element; and
    a controller configured to cause the dividend element to be divided by the divisor element by controlling sensing circuitry to perform a number of operations;
    wherein performing the number of operations comprises:
        storing, as a first mask bit-vector, a bit pattern indicating at least one of a most significant bit (MSB) and a least significant bit (LSB) of at least one of a dividend bit-vector comprising the dividend element and a divisor bit-vector comprising the divisor element;
        storing, as a second mask bit-vector, a bit pattern indicating at least one of the most significant bit (MSB) and the least significant bit (LSB) of multiple elements of at least one of the dividend bit-vector and the divisor bit-vector; and
        performing a logical operation on the first mask bit-vector and a bit-vector stored in the sensing circuitry.

2. The system of claim 1, further comprising a memory device, including the first group of memory cells, the second group of memory cells, and the controller, coupled to a host.

3. The system of claim 2, wherein the host comprises a number of processors.

4. The system of claim 2, wherein the host provides an element width of the dividend bit-vector and the divisor bit-vector to the memory device and wherein the number of operations are performed in view of the element width.

5. The system of claim 1, wherein the number of operations comprises a number of AND operations, OR operations, and SHIFT operations.

6. The system of claim 5, wherein the sensing circuitry comprises a number of transistors formed on pitch with the memory cells and a sense amplifier and a compute component.

7. The system of claim 6, wherein the sense amplifier comprises a primary latch and the compute component comprises a secondary latch.

8. A system comprising:
a memory array comprising:
  a first group of memory cells coupled to a first access line and configured to store a plurality of dividend elements as a dividend bit-vector; and
  a second group of memory cells coupled to a second access line and configured to store a plurality of divisor elements as a divisor bit-vector; and
a controller configured to control sensing circuitry to:
  perform a plurality of division operations by dividing, in parallel, each one of the plurality of dividend elements by a respective one of the plurality of divisor elements;
  store a plurality of results of the plurality of division operations in a third group of memory cells; and
  wherein performing the plurality of division operations comprises:
    storing, as a first mask bit-vector, a bit pattern indicating at least one of a most significant bit (MSB) and a least significant bit (LSB) of at least one of the dividend bit-vector and the divisor bit-vector;
    storing, as a second mask bit-vector, a bit pattern indicating at least one of the most significant bit (MSB) and the least significant bit (LSB) of respective elements of at least one of the dividend bit-vector and the divisor bit-vector; and
    performing a logical operation on the first mask bit-vector and a bit-vector stored in sensing circuitry coupled to the memory array.

9. The system of claim 8, wherein the memory array is located on a memory device coupled to a host.

10. The system of claim 8, wherein the plurality of results comprise a plurality of bit-vectors that represent at least one of a plurality of quotient elements and a plurality of remainder elements.

11. The system of claim 8, wherein the third group of memory cells is a same group of memory cells as at least one of:
  the first group of memory cells coupled to the first access line; and
  the second group of memory cells coupled to the second access line.

12. The system of claims 8, wherein each of the plurality of division operations is performed on a different element pair including corresponding elements from the plurality of dividend elements and the plurality of divisor elements.

13. A method of a system for performing division operations, comprising:
performing, in parallel, a plurality of division operations on:
  a plurality(M) of dividend elements stored in a first group of memory cells coupled to a first access line and to a number (X) of sense lines of a memory array; and
  a plurality(M) of divisor elements stored in a second group of memory cells coupled to a second access line and to the X of sense lines of the memory array; and
providing a plurality of quotient elements and a plurality of remainder elements;
wherein performing the plurality of division operations comprises:
  storing, as a mask bit-vector, a bit pattern indicating at least one of a most significant bit (MSB) and a least significant bit (LSB) of at least one of a dividend bit-vector comprising the plurality of dividend elements and a divisor bit-vector comprising the plurality of divisor elements; and
  performing a logical operation on the mask bit-vector and a bit-vector stored in sensing circuitry coupled to the memory array.

14. The method of claim 13, wherein the plurality of dividend elements are a plurality of first values and the plurality of divisor elements are a plurality of second values.

15. The method of claim 14, wherein the plurality of first values are stored in the first group of memory cells as the dividend bit-vector and the plurality of second values are stored in the second group of memory cells as the divisor bit-vector.

16. The method of claim 13, wherein a number of operations used to perform the plurality of division operations in parallel is the same as a number of operations used to perform any one of the plurality of division operations.

17. The method of claim 13, wherein the mask bit-vector comprises at least one of a dynamic mask bit-vector and a static mask bit-vector and wherein performing the plurality of division operations includes performing a number (E) of iterations of operations.

18. The method of claim 17, wherein performing each of the E iterations of operations comprises:
  storing the dynamic mask bit-vector, that identifies a MSB for each of the M dividend elements and the M divisor elements, in the sensing circuitry and in a group of memory cells that store a current dividend bit-vector; and
  performing a number (P) of iterations of operations, comprising:
    shifting the current dividend bit-vector stored in the sensing circuitry;
    inverting the shifted bit-vector in the sensing circuitry;
    performing a first logical operation on the inverted bit-vector in the sensing circuitry and the static mask bit-vector that identify the MSB for each of the M dividend elements and the M divisor elements;
    storing the result of the first logical operation in the sensing circuitry;
  inverting the result of the first logical operation in the sensing circuitry; and
    performing a second logical operation on the inverted result in the sensing circuitry and the current dividend bit-vector; and
    storing the result of the second logical operation performed on the inverted result and the current dividend bit-vector in the group of memory cells that store the current dividend bit-vector.

19. The method of claim 13, wherein each of the M dividend elements and the M divisor elements are comprised of N bits.

20. The method of claim 19, wherein each of the N bits in each of the M dividend elements and the M divisor elements are associated with an index and wherein bits from corresponding elements that are associated with a same index are stored in memory cells that are coupled to a same sense line from the X sense lines.

* * * * *